United States Patent
Saito et al.

(10) Patent No.: US 9,368,731 B2
(45) Date of Patent: Jun. 14, 2016

(54) ORGANIC ELECTROLUMINESCENCE DEVICE

(75) Inventors: Hiroyuki Saito, Sodeguara (JP); Ryo Naraoka, Sodegaura (JP); Tomoki Kato, Sodegaura (JP); Masaki Numata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 433 days.

(21) Appl. No.: 14/111,488

(22) PCT Filed: Apr. 9, 2012

(86) PCT No.: PCT/JP2012/002454
§ 371 (c)(1),
(2), (4) Date: Oct. 11, 2013

(87) PCT Pub. No.: WO2012/140863
PCT Pub. Date: Oct. 18, 2012

(65) Prior Publication Data
US 2014/0034942 A1 Feb. 6, 2014

(30) Foreign Application Priority Data

Apr. 13, 2011 (JP) ................. 2011-089339

(51) Int. Cl.
*H01L 51/50* (2006.01)
*H01L 51/00* (2006.01)
*H01L 51/52* (2006.01)

(52) U.S. Cl.
CPC ........ *H01L 51/0071* (2013.01); *H01L 51/0072* (2013.01); *H01L 51/0073* (2013.01); *H01L 51/0074* (2013.01); *H01L 51/5253* (2013.01)

(58) Field of Classification Search
None
See application file for complete search history.

(56) References Cited

U.S. PATENT DOCUMENTS

| 7,102,282 B1 | 9/2006 | Yamada et al. |
| 2005/0110400 A1 | 5/2005 | Nakamura |

(Continued)

FOREIGN PATENT DOCUMENTS

| JP | 2002-252081 | 9/2002 |
| JP | 2005-122980 | 5/2005 |

(Continued)

OTHER PUBLICATIONS

Leo et al., Performance improvement of top-emitting organic light-emitting diodes by an organic capping layer: An experimental syudy, 2006, Journal of Applived Physics, 100, pp. 064507-1 to 064507-5.*

(Continued)

*Primary Examiner* — Gregory Clark
(74) *Attorney, Agent, or Firm* — Foley & Lardner LLP

(57) ABSTRACT

A top-emitting organic electroluminescence device including sequentially a first electrode, one or more organic layers comprising an emitting layer, a second electrode and a capping layer, wherein the capping layer comprises a compound represented by the following formula (1):

$$\begin{array}{c} Ar_{21} \\ \diagdown \\ Y_1-L_1-Ar_3-X_1 \\ \diagup \\ (Ar_{22})_n \quad Ar_1 \end{array} \quad (1)$$

10 Claims, 1 Drawing Sheet

(56) References Cited

U.S. PATENT DOCUMENTS

| | | |
|---|---|---|
| 2006/0113907 A1 | 6/2006 | Im et al. |
| 2008/0023724 A1* | 1/2008 | Takeda ............... H01L 51/5262 257/103 |
| 2011/0127498 A1 | 6/2011 | Jung et al. |
| 2011/0309739 A1 | 12/2011 | Song et al. |
| 2012/0138918 A1 | 6/2012 | Naraoka et al. |

FOREIGN PATENT DOCUMENTS

| | | |
|---|---|---|
| JP | 2006-156390 | 6/2006 |
| JP | 2007-103303 | 4/2007 |
| JP | 2011-119223 | 6/2011 |
| JP | 2012-4116 | 1/2012 |
| WO | WO 01/39554 A1 | 5/2001 |
| WO | WO 2006/109493 A1 | 10/2006 |
| WO | WO 2011/043083 A1 | 4/2011 |

OTHER PUBLICATIONS

Translation of Written Opinion of the International Searching Authority for International Application No. PCT/JP2012/002454 dated Jun. 19, 2012.

International Search Report issued in related International Patent Application No. PCT/JP2012/002454, completed Jun. 7, 2012.

* cited by examiner

ORGANIC ELECTROLUMINESCENCE DEVICE

TECHNICAL FIELD

The invention relates to an organic electroluminescence (EL) device. In particular, the invention relates to an organic EL device which can be used in a display panel or an illumination panel for a large-sized TV, for which low consumption power is desired.

BACKGROUND ART

In order to improve luminous efficiency of an organic EL device, a technology of adjusting the optical interference distance is widely used. Further, in a top-emitting organic EL device, as means to improve the luminous efficiency, to allow the emission spectrum to be narrow and sharp and to adjust the peak wavelength, a technology of adjusting emission spectrum by disposing an organic layer including an emitting layer between a metal electrode and a semi-transparent metal electrode to configure an optical resonator has been widely used. By this technology, the length of a resonator is adjusted by changing the distance between the metal electrode and the semi-transparent electrode. A method in which the film thickness of the organic layer is changed to adjust the optical interference has a defect that luminous efficiency is varied due to a change in carrier balance. Therefore, the thickness of an organic layer is restricted to one at which the carrier balance is maintained, and hence, the adjustment of the length of a resonator has its limit.

In a top-emitting organic EL device, as a technology of adjusting the optical interference distance without changing the carrier balance, a technology has been proposed in which a thin film structure of which the optical interference distance can be adjusted is provided on the upper semi-transparent metal electrode. In Patent Document 1, a resonator is provided on the upper electrode, and the length of the resonator is adjusted such that the optical path length of the device becomes integral multiple of the half-wave length, as in the case of a Fabry-Perot resonator, thereby to adjust the peak wavelength. Patent Document 2 discloses a technology in which an optical adjustment layer is formed on an upper electrode in a thickness of several nm to several hundreds nm, whereby the optical interference distance is adjusted.

As is apparent from the above-mentioned conventional technologies, a technology of providing on an upper electrode of a top-emitting organic EL device a thin film structure of several nm to several hundreds nm such that the optical path length becomes integral multiple of the half-wave length as in the case of a Fabry-Perot resonator is known in this technical field.

In a top-emitting organic EL device, a technology has been proposed in which a thin-film structure called a resonator, a protective film, a capping layer or an optical adjustment layer is added on an upper semitransparent electrode in order to improve luminous efficiency. In a blue emission range of wavelengths of from 400 nm to 500 nm, a technology of allowing the emission spectrum to be narrow and sharp and allowing the peak wavelength to be short while attaining highly efficient emission has not been proposed. In particular, the wavelength of light giving blue emission is short as compared with the wavelength of light of green or red, and the blue light has high energy. It is hence difficult to optimize the optical interference distance while keeping the carrier balance.

As the prior art invention in which emission properties have been improved by providing on the upper semi-transparent electrode a thin-film structure, the following can be given. In Patent Document 2, on the upper electrode of a top-emitting organic EL device, an organic capping layer having a reflective index of 1.7 or more and a film thickness of 600 Å is provided, whereby emission is strengthened by about 1.5 times in a red-emitting device and a green-emitting device.

Patent Document 3 discloses an invention in which suppression of natural light reflection and improvement in contrast by emission with high luminous efficiency due to the presence of an organic capping layer doped with a Nile Red dye on an upper electrode of a top-emitting organic EL electrode.

RELATED ART DOCUMENTS

Patent Document 1: WO2001/039554
Patent Document 2: JP-A-2006-156390
Patent Document 3: JP-A-2007-103303

SUMMARY OF THE INVENTION

The technology disclosed in Patent Document 2 has a problem that the ClEy value could not be decreased in order to obtain good blue emission, and as a result, color reproducibility as an RGB image display apparatus cannot be obtained.

In Patent Document 3, a change in chromaticity by the capping layer only in the red emission region is disclosed. However, in the technology of this document, it is impossible to lower the ClEy value in the blue emission region where chromaticity is hard to be adjusted. As a result, color reproducibility as an RGB image display apparatus cannot be obtained.

It is apparent from the above-mentioned prior art inventions, a technology in which emission is enhanced by about 1.5 times by introducing an organic layer having a thickness of several nm to 200 nm on an electrode, and at the same time, good chromaticity is exhibited, has not yet been disclosed.

In the field of a display panel or an illumination panel for a large-sized TV or the like for which low power consumption is desired, further improvement in luminous efficiency has been required.

The inventors made intensive studies in order to solve the above-mentioned subject, and have found that, by using an organic compound with a specific structure in a capping layer, emission with good chromaticity can be obtained in the blue emission region and luminous efficiency can be improved in any of the regions of blue, green and red. The invention has been made based on this finding.

According to the invention, the following organic EL device is provided.

1. A top-emitting organic electroluminescence device comprising sequentially a first electrode, one or more organic layers comprising an emitting layer, a second electrode and a capping layer, wherein the capping layer comprises a compound represented by the following formula (1):

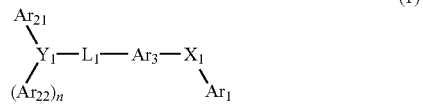

wherein $X_1$ is an S atom or an O atom and $Y_1$ is an atom selected from S, N and O;

when $Y_1$ is S or O, n is 0, and when $Y_1$ is N, n is 1;

$Ar_1$, $Ar_3$, $Ar_{21}$ and $Ar_{22}$ are independently a substituted or unsubstituted aromatic ring group having 6 to 30 carbon atoms that form a ring (hereinafter referred to as "ring carbon atoms") or a substituted or unsubstituted aromatic heterocyclic group having 5 to 20 atoms that form a ring (hereinafter referred to as "ring atoms");

$L_1$ is a single bond or a substituted or unsubstituted aromatic ring group having 6 to 30 ring carbon atoms;

$Ar_3$ and $Ar_1$ may be bonded with each other by a single bond or a double bond to form a substituted or unsubstituted ring;

when n is 0 and $L_1$ is a substituted or unsubstituted aromatic ring group having 6 to 30 ring carbon atoms, $L_1$ and $Ar_{21}$ may be bonded with each other by a single bond or a double bond to form a substituted or unsubstituted ring; and when n is 1 and $L_1$ is a substituted or unsubstituted aromatic ring group having 6 to 30 ring carbon atoms, $L_1$ and $Ar_{21}$, $Ar_{21}$ and $Ar_{22}$ and $L_1$ and $Ar_{22}$ may be bonded with each other by a single bond or a double bond to form a substituted or unsubstituted ring.

2. The organic electroluminescence device according to 1, wherein $Ar_1$ and $Ar_3$ are bonded by a single bond or a double bond.

3. The organic electroluminescence device according to 1, wherein the compound represented by the above formula (1) is a compound represented by the following formula (2):

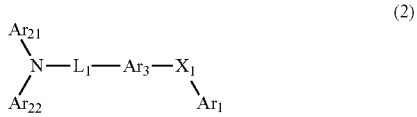

(2)

wherein $L_1$, $Ar_3$, $X_1$ and $Ar_1$ are as defined in 1;

$Ar_{21}$ and $Ar_{22}$ are independently a substituted or unsubstituted aromatic ring group having 6 to 30 ring carbon atoms or a substituted or unsubstituted aromatic heterocyclic group having 5 to 20 ring atoms; and at least one pair of $Ar_{21}$ and $Ar_{22}$ and $Ar_1$ and $Ar_3$ is bonded with each other by a single bond.

4. The organic electroluminescence device according to 1, wherein the compound represented by the formula (1) is a compound represented by the following formula (3A):

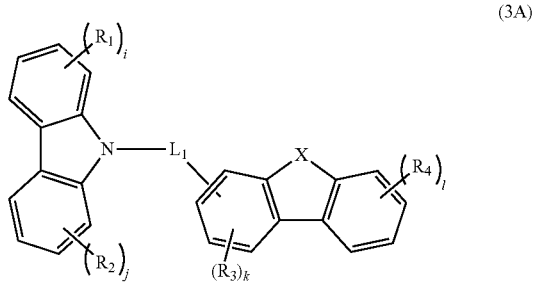

(3A)

wherein X is an S atom or an O atom;

$R_1$ to $R_4$ are independently a substituted or unsubstituted aromatic ring group having 6 to 30 ring carbon atoms or a substituted or unsubstituted aromatic heterocyclic group having 5 to 20 ring atoms;

i, j and l are independently an integer of 0 to 4 and k is an integer of 0 to 3, and when i, j, k or l are independently 2 or more, each group may be the same or different; and $L_1$ is a single bond or a substituted or unsubstituted aromatic ring group having 6 to 30 ring carbon atoms.

5. The organic electroluminescence device according to 4, wherein at least one of $R_1$ and/or at least one of $R_2$ is a substituted or unsubstituted carbazole group or a ring comprising a carbazole ring as a partial structure.

6. The organic electroluminescence device according to 1, wherein the compound represented by the above formula (1) is a compound represented by the following compound (4):

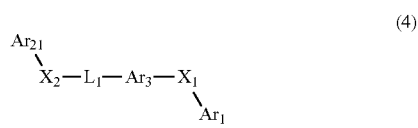

(4)

wherein $L_1$, $Ar_3$, $X_1$ and $Ar_1$ are as defined in 1;

$X_2$ is an S atom or an O atom;

$Ar_{21}$ is a substituted or unsubstituted aromatic ring group having 6 to 30 ring carbon atoms or a substituted or unsubstituted aromatic heterocyclic group having 5 to 20 ring atoms; and at least one pair of $Ar_{21}$ and $L_1$ and $Ar_1$ and $Ar_3$ are bonded with each other by a single bond.

7. A top-emitting organic electroluminescence device comprising sequentially a first electrode, one or more organic layers comprising an emitting layer, a second electrode and a capping layer;

the capping layer comprising a compound represented by the following formula (11).

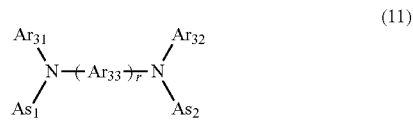

(11)

wherein $Ar_{31}$ and $Ar_{32}$ are independently a substituted or unsubstituted aromatic ring group having 6 to 30 carbon atoms or a substituted or unsubstituted aromatic heterocyclic group having 5 to 20 ring atoms; $Ar_{33}$ is a bonding group; $As_1$ is a group represented by the following formula (11a); and $As_2$ is a group represented by the following formula (11b);

r is an integer of 1 to 3; and when r is 2 or more, $Ar_{33}$ may be the same or different;

at least one combination of $Ar_{31}$ and $Ar_{33}$, $Ar_{32}$ and $Ar_{33}$, $As_1$ and $Ar_{33}$, and $As_2$ and $Ar_{33}$ is bonded with each other by a single bond or a double bond to form a substituted or unsubstituted ring;

(11a)

(11b)

wherein $Ar_{34}$ and $Ar_{35}$ are independently a substituted or unsubstituted aromatic ring group having 6 to 30 carbon atoms; $HAr_1$ and $HAr_2$ are independently a substituted or unsubstituted aromatic ring group having 6 to 30 carbon atoms or a substituted or unsubstituted aromatic heterocyclic ring group having 5 to 20 ring atoms; p and q are independently an integer of 0 to 3, and when p is 2 or more, $Ar_{34}$ may be the same or different, and when q is 2 or more, $Ar_{35}$ may be the same or different;

provided that when $Ar_{31}$ and $Ar_{33}$ are bonded and r is 2 or more, $Ar_{31}$ is bonded to the nearest $Ar_{33}$ of plural $Ar_{33}$;

when $Ar_{32}$ and $Ar_{33}$ are bonded and r is 2 or more, $Ar_{32}$ is bonded to the nearest $Ar_{33}$ of plural $Ar_{33}$;

when $As_1$ and $Ar_{33}$ are bonded, p is 0 and r is 2 or more, $HAr_1$ is bonded to $Ar_{33}$ of plural $Ar_{33}$ which is the nearest to $HAr_1$, and when $As_1$ and $Ar_{33}$ are bonded, p is not 0 and r is 2 or more, $Ar_{33}$ and $Ar_{34}$ which are the nearest with each other are bonded; and when $As_2$ and $Ar_{33}$ are bonded, q is 0 and r is 2 or more, $HAr_2$ is bonded to $Ar_{33}$ of plural $Ar_{33}$ which is the nearest to $HAr_2$ and when $As_2$ and $Ar_{33}$ are bonded, q is not 0 and r is 2 or more, $Ar_{33}$ and $Ar_{35}$ which are the nearest with each other are bonded.

8. The organic electroluminescence device according to 7, wherein at least one of $Ar_{31}$ and $Ar_{32}$ in the formula (11) is a group represented by the following formula (12):

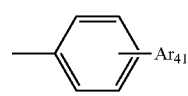
(12)

wherein $Ar_{41}$ is a substituted or unsubstituted aromatic ring group having 6 to 30 ring carbon atoms.

9. The organic electroluminescence device according to 7 or 8, wherein at least one of $As_1$ and $As_2$ in the formula (11) is a group represented by the following formula (13):

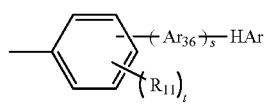
(13)

wherein $Ar_{36}$ is an aromatic ring group having 6 to 30 carbon atoms, HAr is a substituted or unsubstituted aromatic heterocyclic group having 5 to 20 ring atoms; $R_{11}$ is a substituent; t is an integer of 0 to 4, and when t is 2 or more, $R_{11}$ may be the same or different; s is an integer of 0 to 2, and when s is 2, $Ar_{36}$ may be the same or different.

10. The organic electroluminescence device according to any of 7 to 9, wherein at least one of $As_1$ and $As_2$ in the formula (11) is a group represented by the following formula (14):

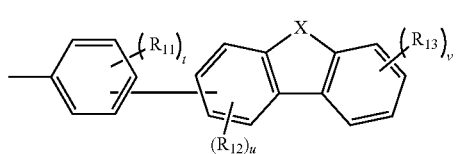
(14)

wherein X is an S atom or an O atom; $R_{11}$ to $R_{13}$ are independently a substituent; t and v are independently an integer of 0 to 4; u is an integer of 0 to 3, and when t, u or v is an integer of 2 or more, each group may be the same or different.

In the invention, by adding a layer of an organic compound with a specific structure on the electrode from which light is outcoupled, not only good emission can be obtained in the blue emission region but also luminous efficiency can be improved in any of the blue, green and red regions.

MODE FOR CARRYING OUT THE INVENTION

Figure 1:
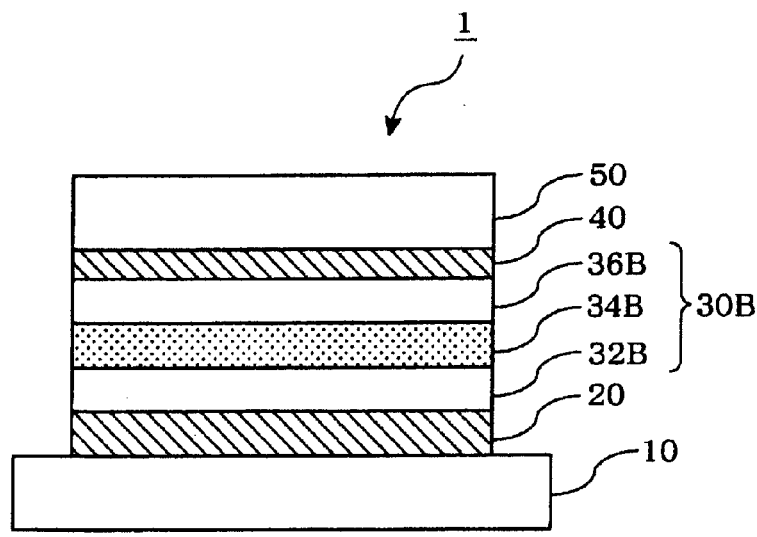
FIG. 1 is a view showing one embodiment of the organic EL device of the invention.

A schematic view of one embodiment of the organic EL device of the invention is shown in FIG. 1. A top-emitting organic EL device 1 shown in FIG. 1 comprises, in this sequence, a first electrode 20, an organic layer 30B, a second electrode 40 and a capping layer 50 on a substrate 10. Light is taken out from the capping layer 50. In this embodiment, the organic layer 30B is a three-layered organic layer composed of a first organic layer 32B, a blue-emitting layer 34B and a second organic layer 36B. The configuration of the organic layers is not limited thereto and can be varied appropriately. The film thickness of the capping layer is preferably 200 nm or less. The peak wavelength of light emitted from the blue-emitting layer is normally 430 nm or more and 500 nm or less.

In the invention, the peak wavelength means a wavelength at which the emission intensity in the emission spectrum is the largest.

Each layer constituting the organic EL device will be explained below.

(1) Capping Layer

In the invention, in the capping layer, a compound represented by the following formula (1) or a compound represented by the following formula (11) is used. These compounds each have an aromatic ring containing an atom having an unpaired electron and an aromatic ring having a π electron in the same molecule. As a result, the electron density in the molecule is increased, whereby the layer containing such compounds becomes a preferable capping layer.

Hereinbelow, each compound will be explained.

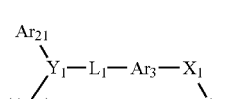
(1)

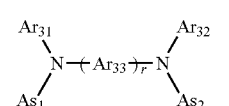
(11)

(A) Compound Represented by the Formula (1)

In the formula (1), $X_i$ is an S atom or an O atom, and $Y_1$ is an atom selected from S, N and O. $X_1$ and $Y_1$ are atoms each having an unpaired electron.

When $Y_1$ is S or O, n is 0, and when $Y_1$ is N, n is 1.

$Ar_1$, $Ar_3$, $Ar_{21}$ and $Ar_{22}$ are independently a substituted or unsubstituted aromatic ring group having 6 to 30 ring carbon atoms or a substituted or unsubstituted aromatic heterocyclic group having 5 to 20 ring atoms.

$L_1$ is a single bond or a substituted or unsubstituted aromatic heterocyclic ring group having 6 to 30 ring carbon atoms.

As the substituted or unsubstituted aromatic ring group having 6 to 30 ring carbon atoms represented by $Ar_1$, $Ar_3$, $Ar_{21}$, $Ar_{22}$ and $L_1$, a monovalent residue or a polyvalent (divalent or higher) residue of an aromatic ring (benzene, naphthalene, anthracene, pyrene, 9,9-dialkylfluorene such as 9,9-dimethylfluorene, phenanthrene, chrysene, benzo[a]anthracene, fluoranthene, triphenylene, acenaphthylene, picene or perylene) or monovalent residue or a polyvalent (divalent or higher) residue of a derivative of the above-mentioned aromatic ring can be given.

As the substituted or unsubstituted aromatic heterocyclic group having 5 to 20 ring atoms represented by $Ar_1$, $Ar_3$, $Ar_{21}$ and $Ar_{22}$, a monovalent residue or a polyvalent (divalent or higher) residue of an aromatic heterocyclic ring (furan, benzofuran, dibenzofuran, thiophene, benzothiophene, dibenzothiophene, quinoline, isoquinoline, quinazoline, cinnoline, quinoxaline, phthalazine, acridine, phenantriazine, xanthene, phenazine, phenothiazine, phenoxathiin, phenoxazine, thianthrene, chromane, isochromane, carbazole, benzcarbazole, and benzimidazole) or a monovalent residue or a polyvalent (divalent or higher) residue of a derivative of the above-mentioned aromatic heterocyclic group can be given.

In the invention, as the substituent in the "substituted or unsubstituted", an alkyl group having 1 to 30 carbon atoms (a methyl group, an ethyl group, an n-propyl group, an iso-propyl group, an n-butyl group, a sec-butyl group, a tert-butyl group or the like, a trialkylsilyl group, a dialkylarylsilyl group, an alkyldiarylsilyl group, a triarylsilyl group, a halogenated alkyl group, an aryl group having 5 to 30 carbon atoms (a phenyl group, a naphthyl group, a biphenyl group, a terphenyl group, a naphthylphenyl group, a phenylnaphthyl group, a 9,9-dimethylfluorenyl group, a monovalent residue of phenanthrenene, or the like), a cycloalkyl group, an alkoxy group, a heterocyclic group (a monovalent residue of the aromatic heterocyclic ring or its derivative), an aralkyl group, an aryloxy group, an arylthio group, an alkoxycarbonyl group, a halogen atom, a hydroxyl group, a nitro group, a cyano group, a carboxyl group, a dibenzofuranyl group, a fluorenyl group or the like can be given.

In the formula (1), $Ar_3$ and $Ar_1$ may be bonded with each other by a single bond or a double bond to form a substituted or unsubstituted ring.

When n is 0 and $L_1$ is a substituted or unsubstituted aromatic ring group, $L_1$ and $Ar_{21}$ may be bonded with each other by a single bond or a double bond to from a substituted or unsubstituted ring.

When n is 1 and $L_1$ is a substituted or unsubstituted aromatic ring group, $L_1$ and $Ar_{21}$, $L_1$ and $Ar_{21}$, $Ar_{21}$ and $Ar_{22}$ or $L_1$ and $Ar_{22}$ may be bonded with each other by a single bond or a double bond to form a substituted or unsubstituted ring.

Here, examples of a ring formed by bonding of two or more groups by a single bond or a double bond, the above-mentioned aromatic heterocyclic group can be given.

For example, as shown in the following formula (1a), $Ar_1$ and $Ar_3$ may be bonded with each other by a single bond to form a fused ring having three rings including $X_1$. If $L_1$ is a substituted or unsubstituted aromatic ring group, $L_1$ and $Ar_{21}$ may be bonded with each other by a single bond to form a fused ring having three rings including $Y_1$.

Similarly, as shown in the following formula (1b), $Ar_{21}$ and $Ar_{22}$ may be bonded with each other by a single bond to form a fused ring having three rings including $Y_1$.

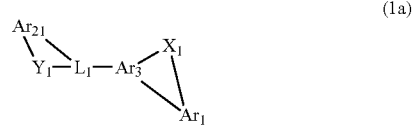
(1a)

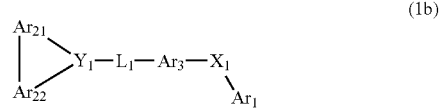
(1b)

wherein $X_1$, $Y_1$, $Ar_1$, $Ar_3$, $Ar_{21}$ and $Ar_{22}$ and $L_1$ are as defined in the formula (1).

As specific examples of a ring formed by bonding of $L_1$ and $Ar_{21}$ by a single bond when n is 0, the following can be given.

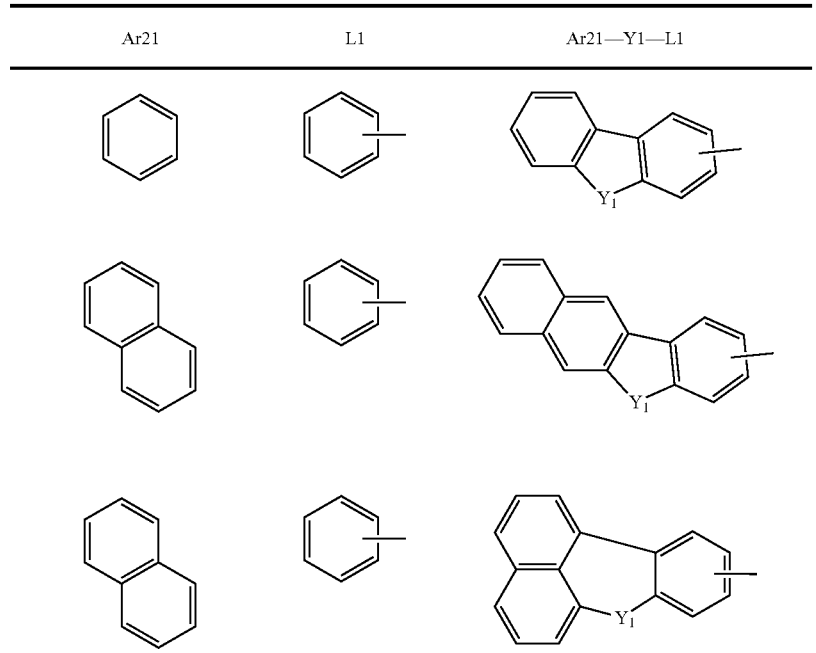

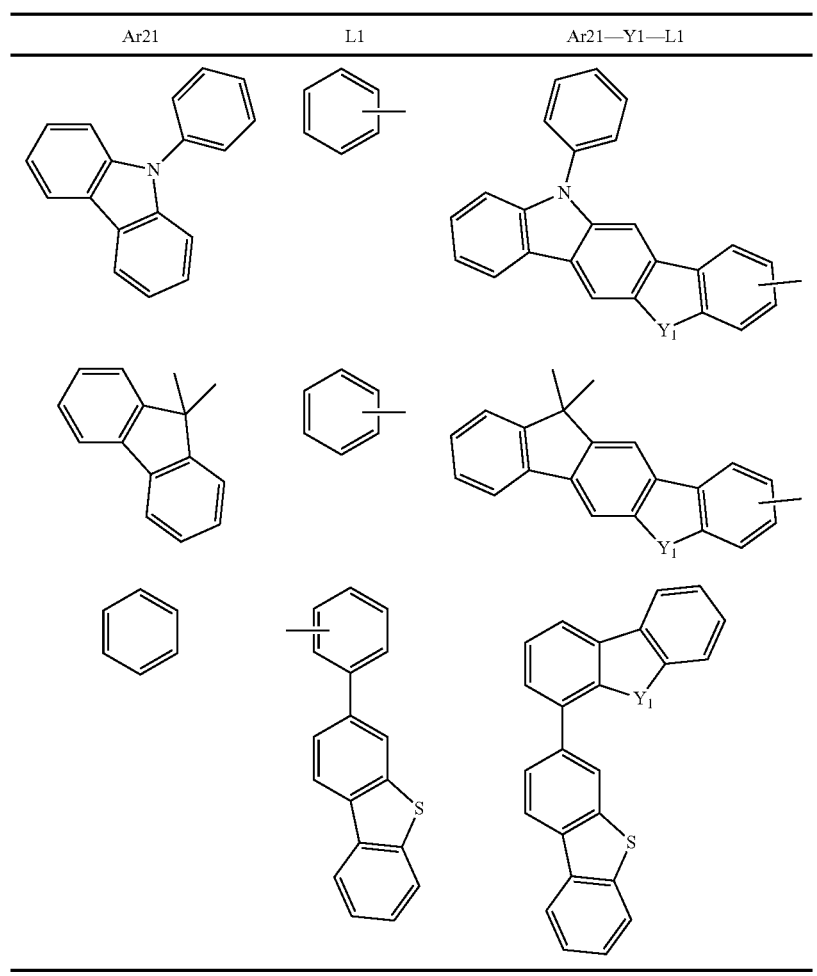
Examples of a ring formed by bonding of Ar₁ and Ar₃ by a single bond include the following.
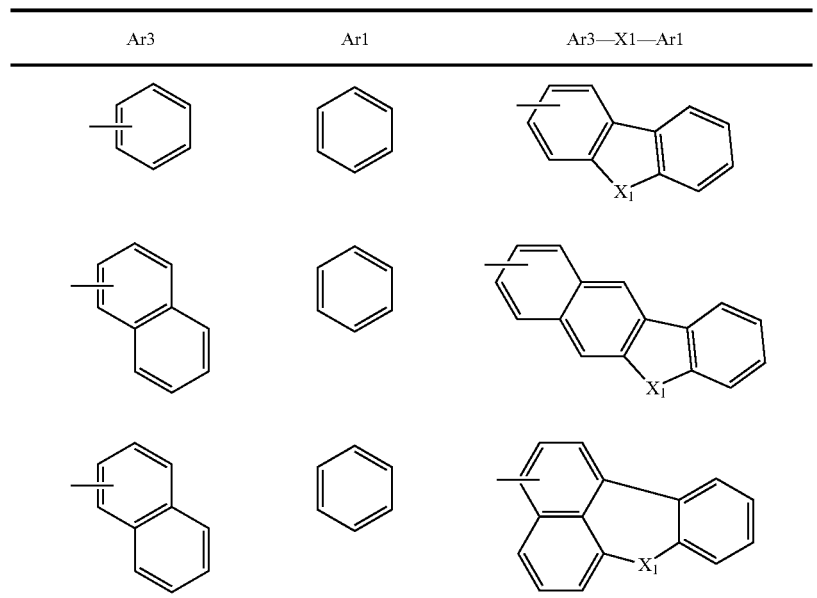

-continued
| Ar3 | Ar1 | Ar3—X1—Ar1 |
|---|---|---|
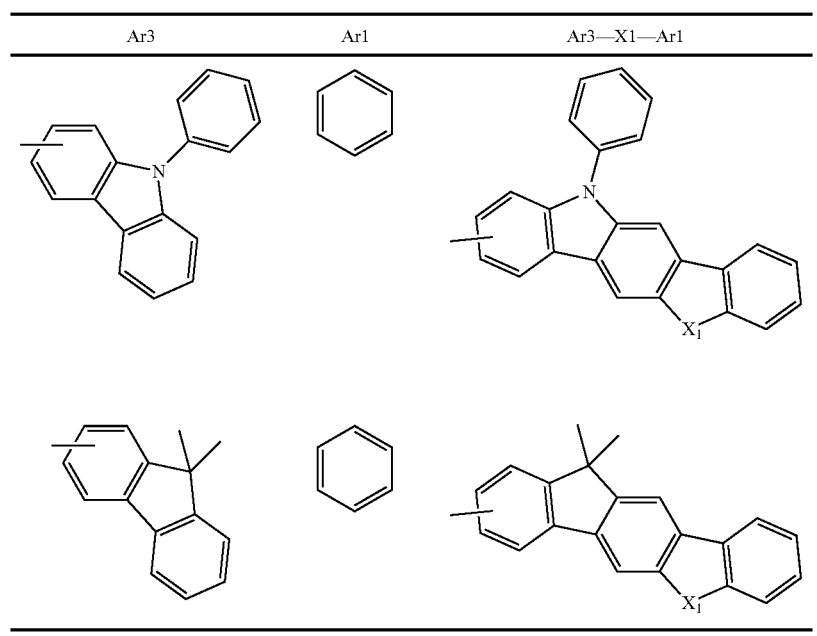
As examples of a ring formed by bonding of $L_1$ and $Ar_{21}$ by a single bond when n is 1, the following can be given.
| Ar21 | Ar22 | L1 | $\begin{array}{c}Ar_{21}\\\searrow\\N-L_1-\\\nearrow\\Ar_{22}\end{array}$ |
|---|---|---|---|
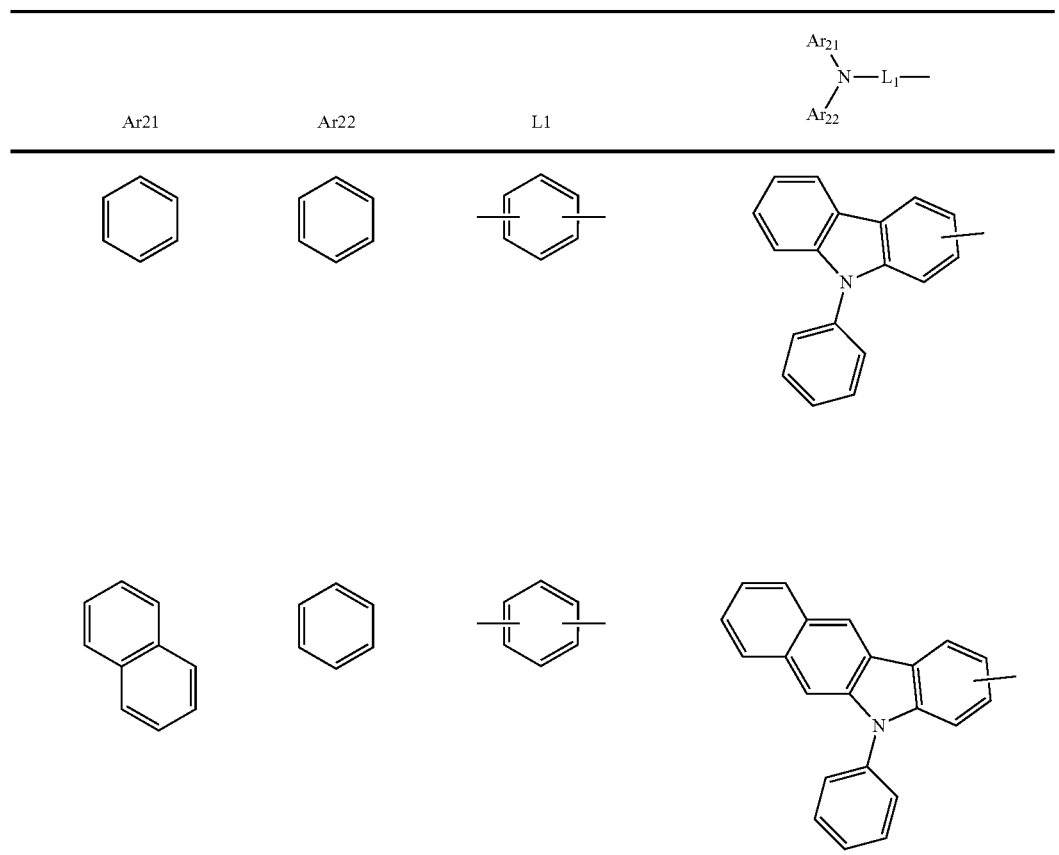

-continued

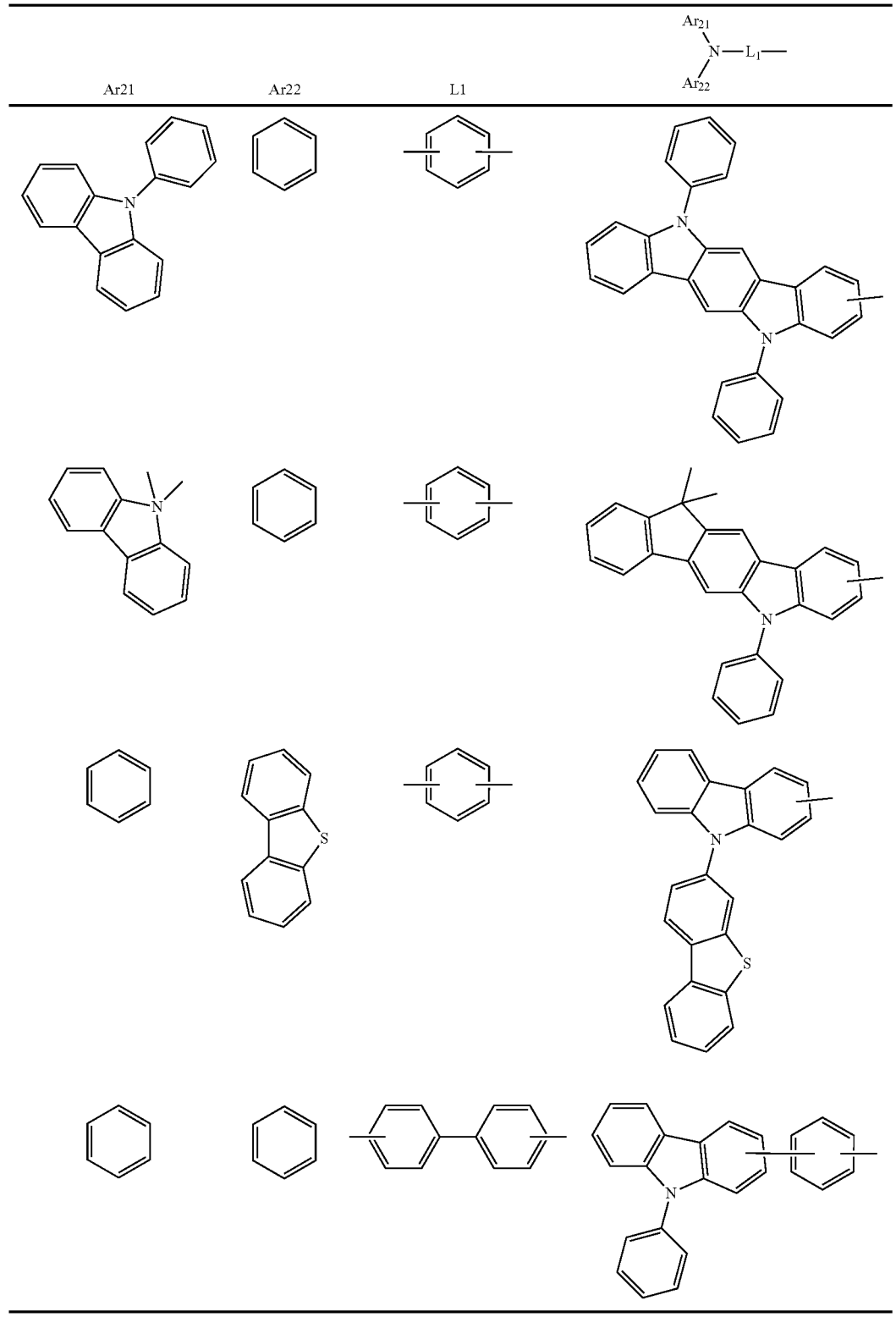

In the invention, it is preferred that $Ar_1$ and $Ar_3$ be bonded by a single bond or a double bond. By such bonding, a fused ring having three rings including $Ar_1$, $Ar_3$ and $X_1$ is formed, whereby flatness of molecules is improved, leading to a further increase in electron density.

It is preferred that the compound represented by the formula (1) be a compound represented by the formula (2). This compound is a compound in which $Y_1$ is a nitrogen atom, and at least one pair of $Ar_{21}$ and $Ar_{22}$ and $Ar_1$ and $Ar_3$ is bonded with each other by a single bond.

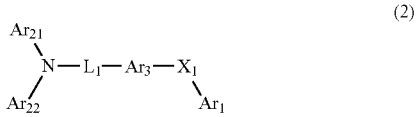

(2)

wherein $L_1$, $Ar_3$, $X_1$ and $Ar_1$ are as defined in the formula (1), and $Ar_{21}$ and $Ar_{22}$ are independently a substituted or unsubstituted aromatic ring group having 6 to 30 ring carbon atoms or a substituted or unsubstituted aromatic heterocyclic group having 5 to 20 ring atoms, and at least one pair of $Ar_{21}$ and $Ar_{22}$ and $Ar_1$ and $Ar_3$ is bonded with each other by a single bond.

Of these, a structure shown in the following formula (2a) where both pairs of $Ar_{21}$ and $Ar_{22}$ and $Ar_1$ and $Ar_3$ are bonded with each other by a single bond is preferable. In this case, $L_1$ is preferably a single bond.

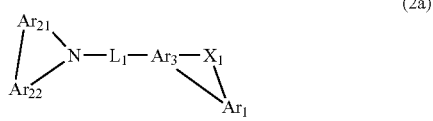

(2a)

wherein $L_1$, $Ar_3$, $X_1$, $Ar_{21}$ and $Ar_{22}$ are as defined in the formula (1).

In the invention, a compound represented by the following formula (3A) or (3B) is particularly preferable.

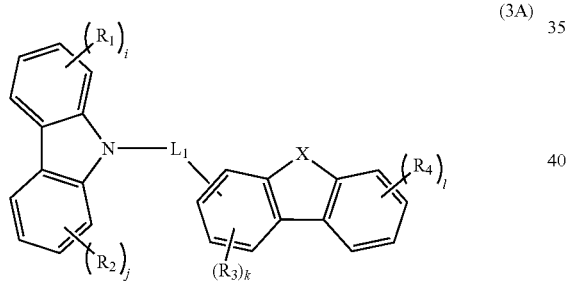

(3A)

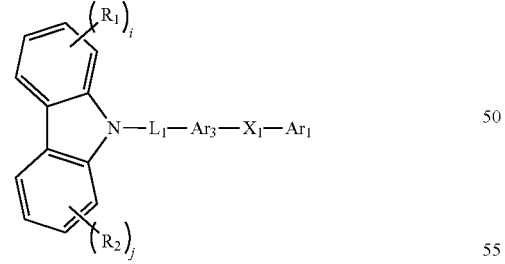

(3B)

wherein X is an S atom or an O atom, $R_1$ to $R_4$ are independently a substituted or unsubstituted aromatic ring group having 6 to 30 ring carbon atoms or a substituted or unsubstituted aromatic heterocyclic group having 5 to 20 ring atoms, i, j and l are independently an integer of 0 to 4, k is an integer of 0 to 3, when I, j, k or l are independently 2 or more, each group may be the same or different. $L_1$ is a single bond or a substituted or unsubstituted aromatic ring group having 6 to 30 ring carbon atoms.

$L_1$, $Ar_3$, $X_1$ and $Ar_1$ are as defined in the formula (1).

Examples of the aromatic ring group and the aromatic heterocyclic group of $R_1$ to $R_4$ are the same as those for $Ar_1$ or the like.

In the formula (3), it is preferred that at least one of $R_1$ and/or at least one of $R_2$ be a substituted or unsubstituted carbazole group or a ring comprising a carbazole ring as a partial structure.

Of these, a compound represented by the following formula (3a) or (3b) is preferable.

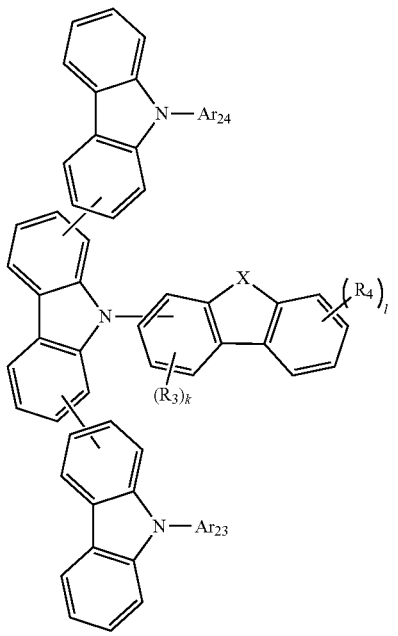

(3a)

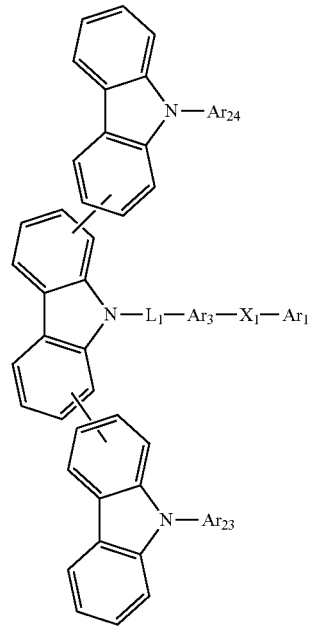

(3b)

wherein X, $R_3$, $R_4$, l and k are as defined in the above formula (3); $Ar_{23}$ and $Ar_{24}$ are independently a hydrogen atom, a substituted or unsubstituted aromatic ring group having 6 to 30 ring carbon atoms or a substituted or unsubstituted aromatic heterocyclic group having 5 to 20 ring atoms; and $L_1$, $Ar_3$, $X_1$ and $Ar_1$ are as defined in the formula (1).

It is preferred that $Ar_{23}$ and $Ar_{24}$ be a phenyl group, a naphthyl group, a monovalent residue of dibenzothiophene, a monovalent residue of benzothiophene, a monovalent residue of dibenzofurane and a monovalent residue of benzofuran, for example.

A compound represented by the following formula (4) is also preferable.

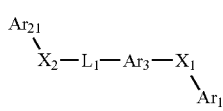
(4)

wherein $L_1$, $Ar_3$, $X_1$ and $Ar_1$ are the same as $L_1$, $Ar_3$, $X_1$ and $Ar_1$ in the formula (1); $X_2$ is an S atom or an O atom; $Ar_{21}$ is a substituted or unsubstituted aromatic ring group having 6 to 30 ring carbon atoms or a substituted or unsubstituted aromatic heterocyclic group having 5 to 20 ring atoms; and at least one pair of $Ar_{21}$ and $L_1$ and $Ar_1$ and $Ar_3$ are bonded with each other by a single bond.

(B) Compound Represented by the Formula (11)

In the formula (11), $Ar_{31}$ and $Ar_{32}$ are independently a substituted or unsubstituted aromatic ring group having 6 to 30 carbon atoms or a substituted or unsubstituted aromatic heterocyclic group having 5 to 20 ring atoms.

$Ar_{33}$ is a bonding group. For example, $Ar_{33}$ is a substituted or unsubstituted aromatic ring group having 6 to 30 carbon atoms, a substituted or unsubstituted aromatic heterocyclic group having 5 to 20 ring atoms, a divalent bonding group including N, a divalent bonding group including O, a divalent bonding group including Si, a divalent bonding group including P, a divalent bonding group including S, an alkylene group having 1 to 20 carbon atoms, a cycloalkylene group having 3 to 20 ring carbon atoms, a divalent amino group or a divalent silyl group. When r is 2 or more, it means a group obtained by bonding two or more of these groups. At least one of $Ar_{33}$ is a substituted or unsubstituted aromatic ring group having 6 to 30 carbon atoms or a substituted or unsubstituted aromatic heterocyclic group having 5 to 20 ring atoms.

It is preferred that $Ar_{33}$ be a substituted or unsubstituted aromatic ring group having 6 to 30 carbon atoms or a substituted or unsubstituted aromatic heterocyclic group having 5 to 20 ring atoms.

$As_1$ is a group represented by the following formula (11a), and $As_2$ is a group represented by the following formula (11b).

(11a)

(11b)

wherein $Ar_{34}$ and $Ar_{35}$ are independently an aromatic ring group having 6 to 30 carbon atoms or a substituted or unsubstituted aromatic heterocyclic group having 5 to 20 ring atoms. $HAr_1$ and $HAr_2$ are independently a substituted or unsubstituted aromatic ring group having 6 to 30 carbon atoms or a substituted or unsubstituted aromatic heterocyclic group having 5 to 20 ring atoms; p and q are independently an integer of 0 to 3, when p is 2 or more, $Ar_{34}$ may be the same or different, and when q is 2 or more, $Ar_{35}$ may be the same or different.

r is an integer of 1 to 3, and when r is 2 or more, $Ar_{33}$ may be the same or different.

As the aromatic ring group having 6 to 30 carbon atoms represented by $Ar_{31}$ to $Ar_{35}$, $HAr_1$ and $HAr_2$, a monovalent residue or a polyvalent (divalent or larger) residue of an aromatic ring (benzene, naphthalene, anthracene, pyrene, 9,9-dimethylfluorene, phenanthrene, chrysene, benzo[a]anthracene, fluoranthene, triphenylene, acenaphthylene, picene or perylene) or a monovalent residue or a polyvalent (divalent or larger) residue of a derivative of the above-mentioned aromatic ring can be given.

As the aromatic heterocyclic group having 5 to 20 ring atoms represented by $Ar_{31}$ to $Ar_{35}$, $HAr_1$ and $HAr_2$, a monovalent residue of an aromatic heterocyclic ring (furan, benzofuran, dibenzofuran, thiophene, benzothiophene, dibenzothiophene, quinoline, isoquinoline, quinazoline, cinnoline, quinoxaline, phthalazine, acridine, phenantriazine, xanthene, phenazine, phenothiazine, phenoxathiin, phenoxazine, thianthrene, chromane, isochromane, carbazole, benzcarbazole, and benzimidazole) or a monovalent residue of a derivative of the above-mentioned aromatic heterocyclic ring can be given.

In the compound represented by the formula (11), at least one combination of $Ar_{31}$ and $Ar_{33}$, $Ar_{32}$ and $Ar_{33}$, $As_1$ and $Ar_{33}$ and $As_2$ and $Ar_{33}$ is bonded with each other by a single bond or a double bond to form a substituted or unsubstituted ring.

As examples of a ring formed by bonding with each other of the groups of each combination by a single bond or a double bond, the aromatic heterocyclic groups mentioned above can be given.

Here, when $Ar_{31}$ and $Ar_{33}$ are bonded and r is 2 or more, $Ar_{31}$ is bonded to the nearest $Ar_{33}$ of plural $Ar_{33}$;

when $Ar_{32}$ and $Ar_{33}$ are bonded and r is 2 or more, $Ar_{32}$ is bonded to the nearest $Ar_{33}$ of plural $Ar_{33}$;

when $As_1$ and $Ar_{33}$ are bonded, p is 0 and r is 2 or more, $HAr_1$ is bonded to $Ar_{33}$ of plural $Ar_{33}$ which is the nearest to $HAr_1$ and when $As_2$ and $Ar_{33}$ are bonded, p is not 0 and r is 2 or more, $Ar_{33}$ and $Ar_{34}$ which are the nearest with each other are bonded; and when $As_2$ and $Ar_{33}$ are bonded, q is 0 and r is 2 or more, $HAr_2$ is bonded to $Ar_{33}$ of plural $Ar_{33}$ which is the nearest to $HAr_2$ and when $As_2$ and $Ar_{33}$ are bonded, q is not 0 and r is 2 or more, $Ar_{33}$ and $Ar_{35}$ which are the nearest with each other are bonded.

It is preferred that at least one of $Ar_{31}$ and $Ar_{32}$ in the formula (11) be a group represented by the following formula (12):

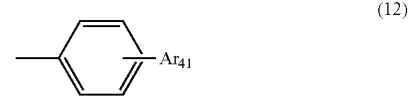
(12)

$Ar_{41}$ in the formula (12) is a substituted or unsubstituted aromatic ring group having 6 to 30 ring carbon atoms. Specific examples thereof are the same as those for $Ar_{31}$ or the like. When both $Ar_{31}$ and $Ar_{32}$ are groups represented by the formula (12), the two $Ar_{41}$ may be the same or different.

It is preferred that at least one of $As_1$ and $As_2$ in the formula (11) be a group represented by the following formula (13):

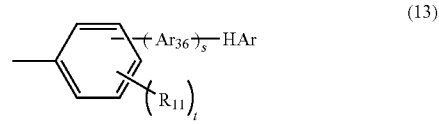
(13)

wherein $Ar_{36}$ is an aromatic ring group having 6 to 30 carbon atoms, HAr is a substituted or unsubstituted aromatic heterocyclic group having 5 to 20 ring atoms, $R_{11}$ is a substituent, t is an integer of 0 to 4, and when t is 2 or more, $R_{11}$ may be the same or different, s is an integer of 0 to 2, and when s is 2, $Ar_{36}$ may be the same or different.

Specific examples of the aromatic ring group represented by $Ar_{36}$ in the formula (13) are the same as those for $Ar_{31}$ or the like. Examples of the aromatic heterocyclic group represented by HAr are the same as those for $HAr_1$ or the like.

As for the substituent represented by $R_{11}$, an aromatic ring group having 6 to 60 carbon atoms (a phenyl group, a naphthyl group, a biphenyl group, a terphenyl group, a naphthylphenyl group, a phenylnaphthyl group, a 9,9-dimethylfluorenyl group, a monovalent residue of phenanthrene or the like), an aromatic heterocyclic group having 5 to 50 atoms, an alkyl group having 1 to 50 carbon atoms (for example, a methyl group, an ethyl group, an n-propyl group, an iso-propyl group, an n-butyl group, a sec-butyl group, a tert-butyl group or the like) can be given.

When $As_1$ and $As_2$ are both groups represented by the formula (13), $As_1$ and $As_2$ may be the same or different.

Of the groups represented by the formula (13), a group represented by the following formula (14) is particularly preferable.

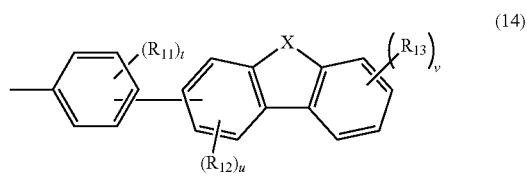

(14)

wherein X is an S atom or an O atom; $R_{11}$ to $R_{13}$ are independently a substituent, t and v are an integer of 0 to 4; u is an integer of 0 to 3, and when t, u or v is 2 or more, the substituents may be the same or different.

Specific examples of the substituent represented by $R_{11}$ to $R_{13}$ are the same as those for $R_{11}$ or the like.

Specifically, compounds represented by the following formula (15) are preferable.

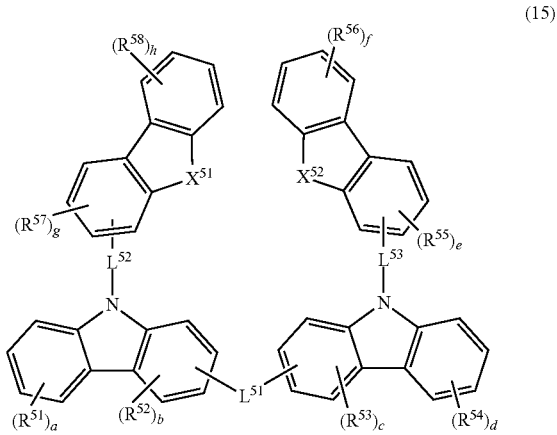

(15)

In the formula (15), $X^{51}$ and $X^{52}$ are independently an oxygen atom or a sulfur atom.

$R^{51}$ to $R^{58}$ are independently a substituent. Examples of the substituent are the same as those for $R_{11}$ or the like.

a, d, f and h are independently an integer of 0 to 4, and b, c, e and g are independently an integer of 0 to 3. The total of a to h is 6 or less.

$L^{51}$ is a single bond, a divalent bonding group containing N, a divalent bonding group containing O, a divalent bonding group containing Si, a divalent bonding group containing P, a divalent bonding group containing S, an alkylene group having 1 to 20 carbon atoms, a cycloalkylene group having 3 to 20 ring carbon atoms, an arylene group having 6 to 18 ring carbon atoms, a heteroarylene group having 5 to 18 ring atoms, a divalent amino group or a divalent silyl group.

$L^{52}$ and $L^{53}$ are independently a single bond, an alkylene group having 1 to 20 carbon atoms, a cycloalkylene group having 3 to 20 ring carbon atoms, an arylene group having 6 to 18 ring carbon atoms or a heteroarylene group having 5 to 18 ring atoms.

$L^{51}$ and $L^{53}$ may be further substituted by any of the substituents R. When $L^{51}$ is an arylene group having 6 to 18 ring carbon atoms or a heteroarylene group having 5 to 18 ring atoms, a and d are independently an integer of 1 to 4.

As the divalent bonding group containing N, the divalent bonding group containing O, the divalent bonding group containing Si, the divalent bonding group containing P and the divalent group containing S represented by $L^{51}$, the following groups can be given.

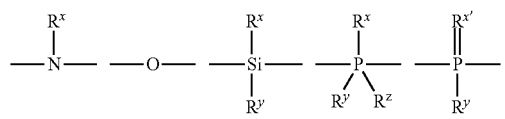

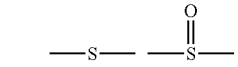

In each of above formulas, $R^x$, $R^y$ and $R^z$ are independently a hydrogen atom or a group selected from the above-mentioned substituents R. $R^{x'}$ is oxygen.

Of the above-mentioned formulas, "—S—", a phosphoxide group and an ether group are preferable.

As the alkylene group, the cycloalkylene group having 3 to 20 ring carbon atoms, the arylene group having 6 to 18 ring carbon atoms, the heteroarylene group having 5 to 18 ring carbon atoms, the divalent amino group or the divalent silyl group represented by $L^{51}$ to $L^{53}$, one obtained by replacing a hydrogen atom (one of the substituents $R^{51}$ to $R^{58}$) by an atomic bonding can be given. In the invention, the arylene group includes a 9,9-fluorenylidene group.

As the arylene group, in addition to the arylene groups mentioned later, a p-phenylene group, an m-phenylene group and a biphenylene group are preferable. As the amino group, in addition to the amino groups mentioned later, a biphenylamino group is preferable.

The bonding group of $L^{51}$ to $L^{53}$ may further comprise a substituent. Here, the substituent is as defined in the substituent explained in $R^{51}$ to $R^{58}$.

Specific examples of the compounds used in the invention will be given below.

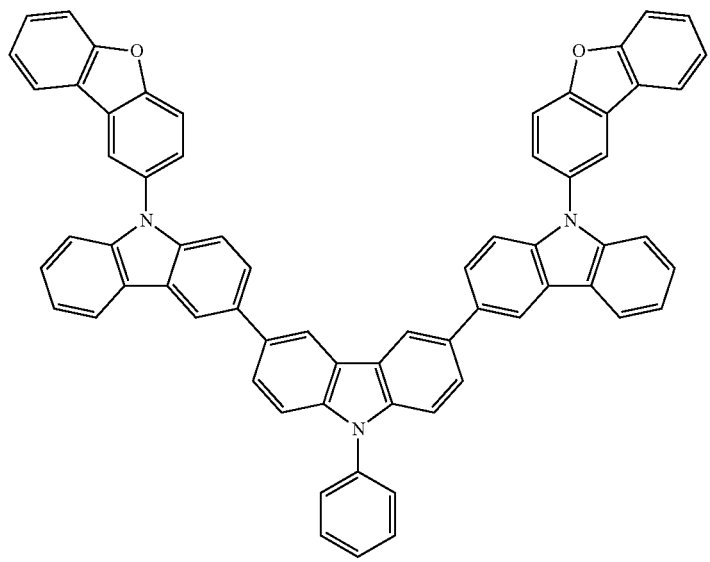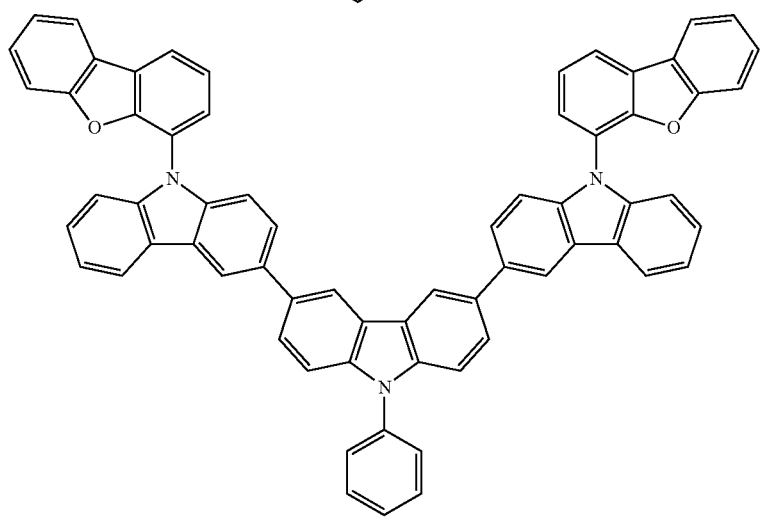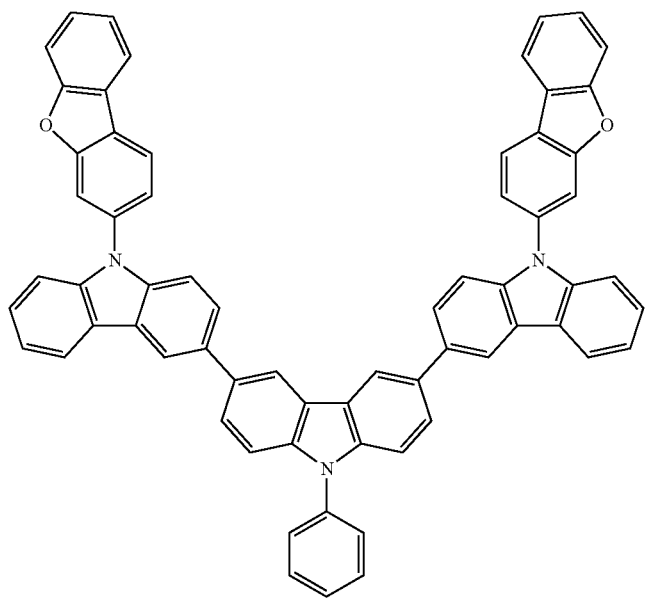

-continued
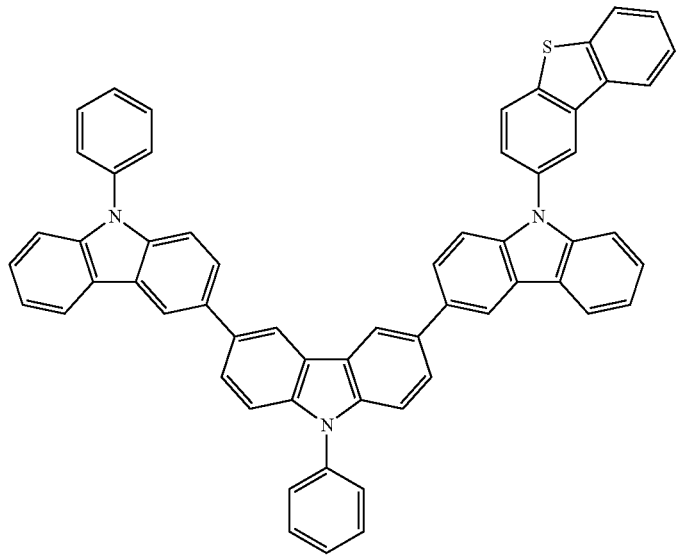
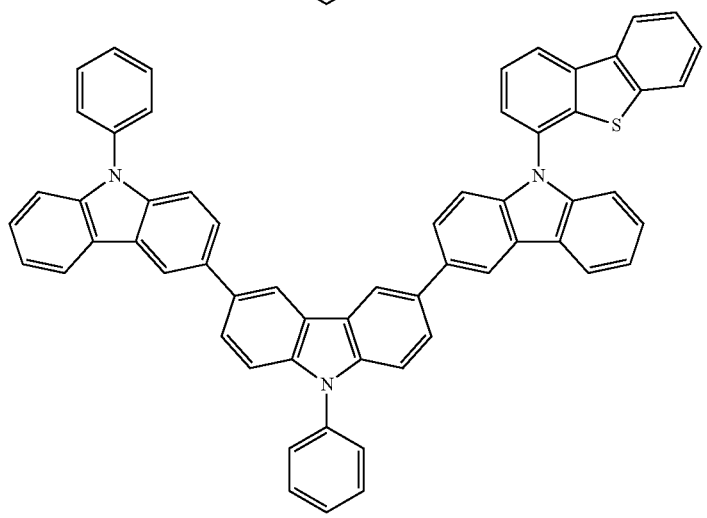
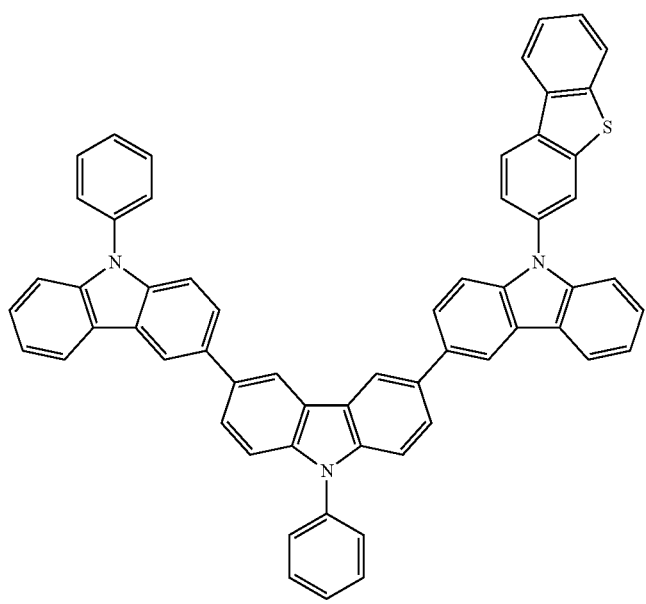

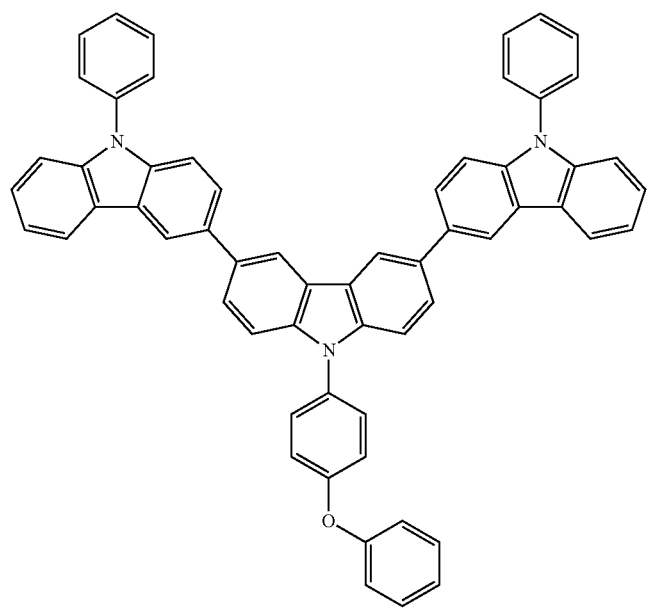
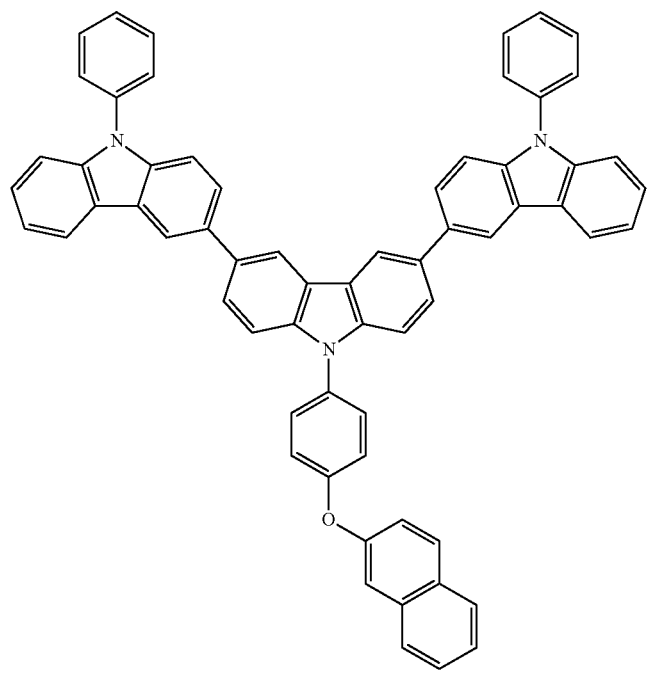

-continued
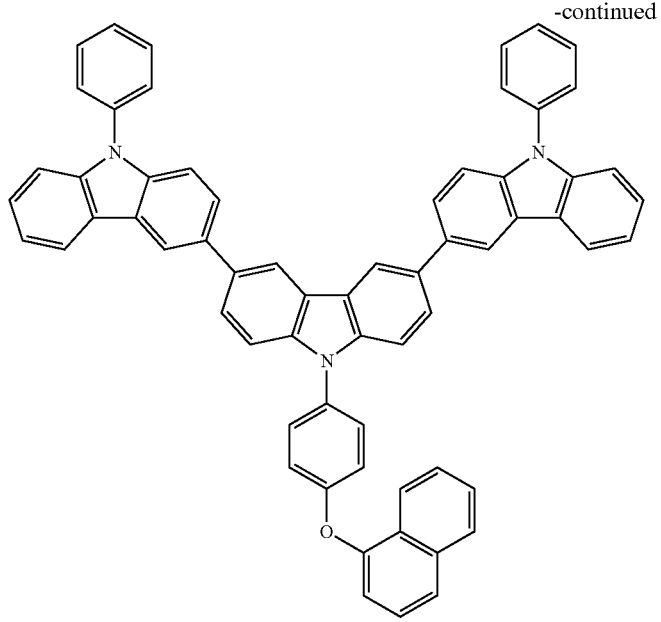
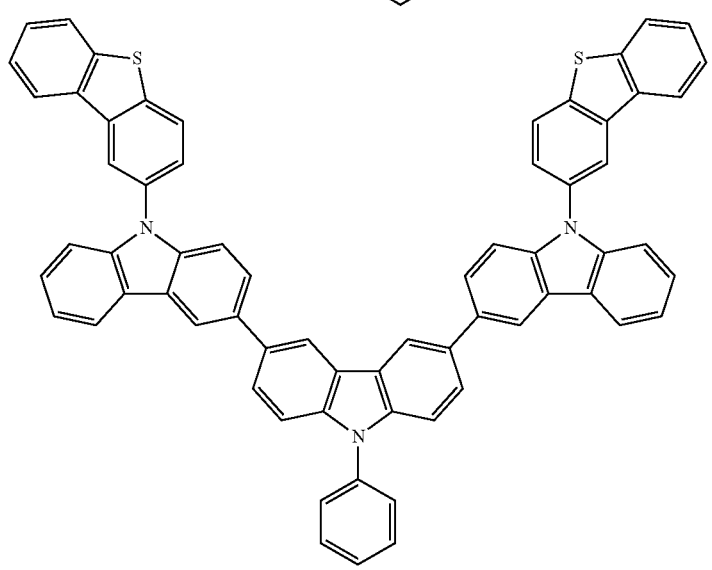
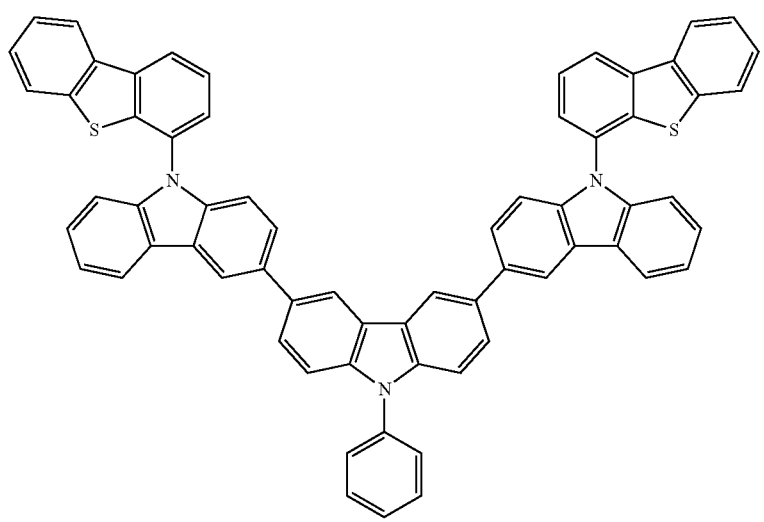

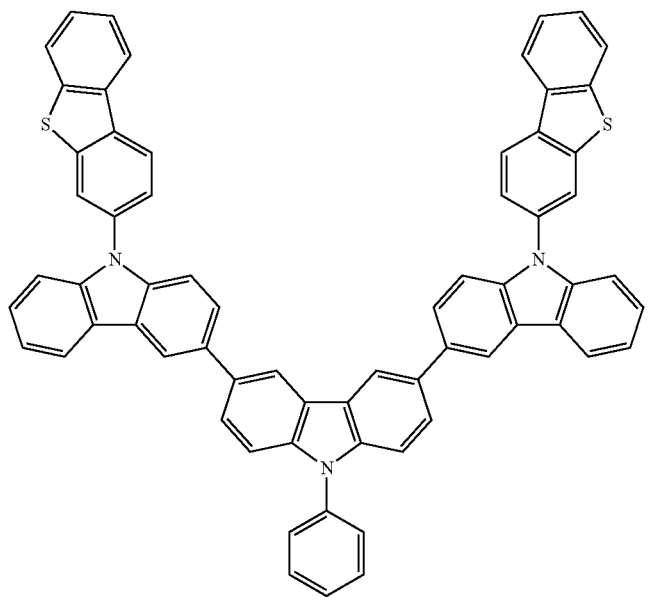
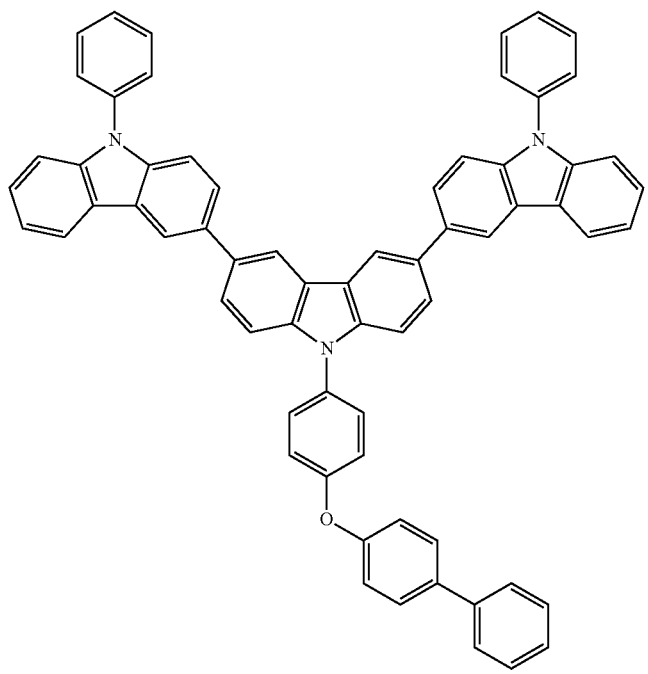

-continued
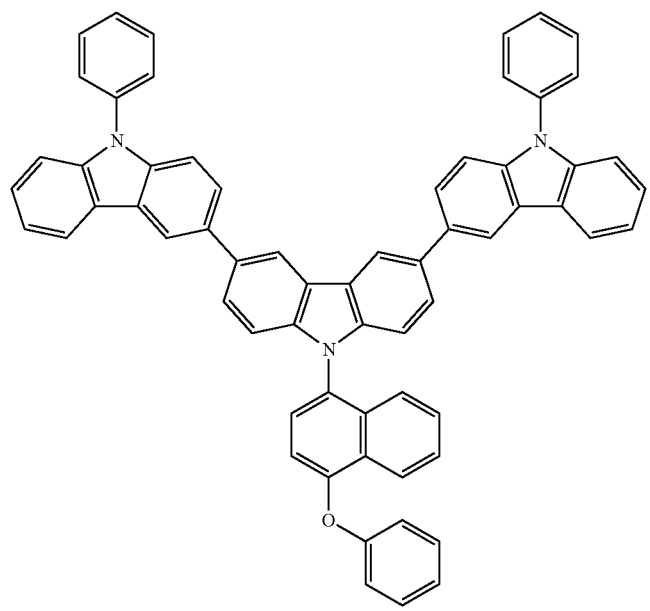
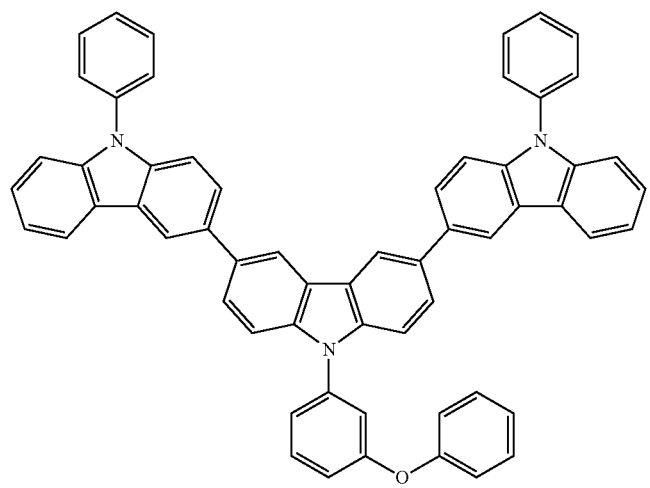
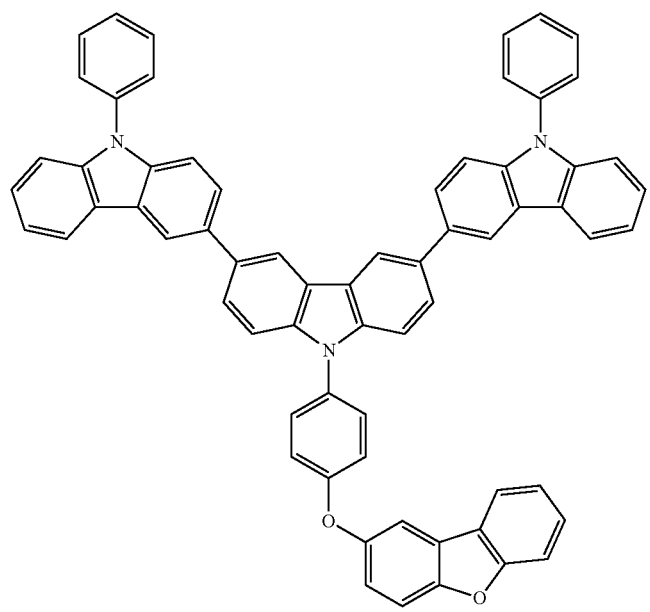

-continued
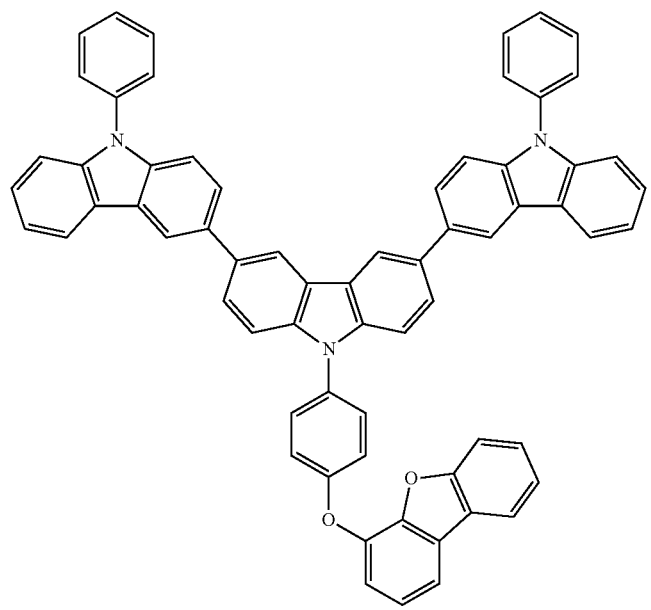
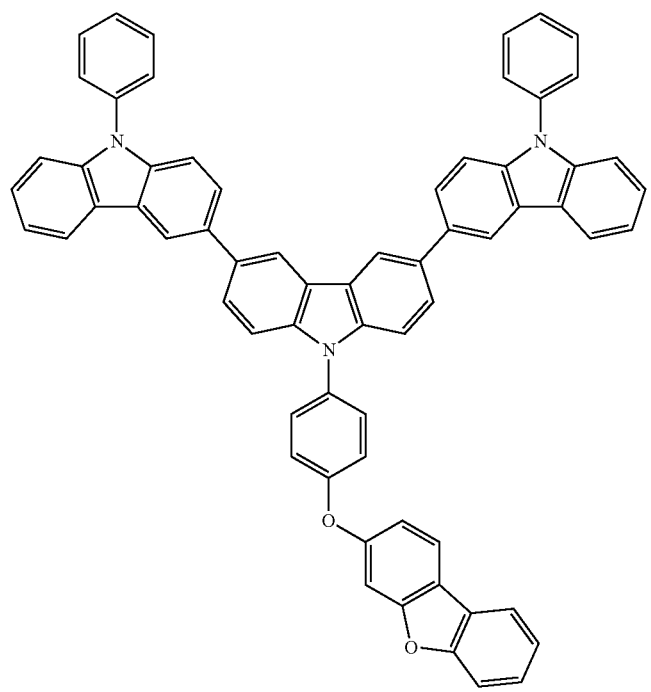

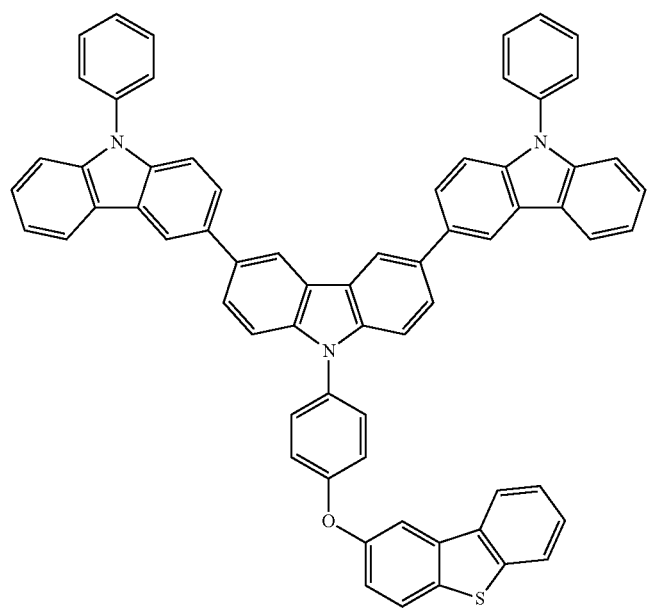
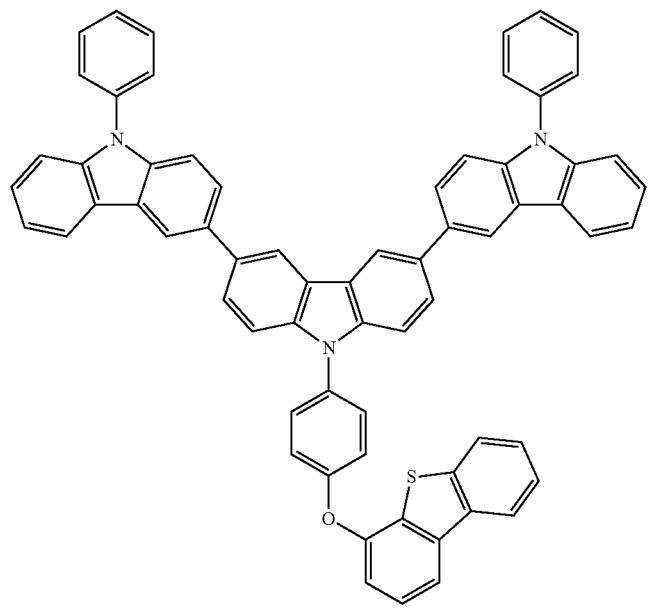

-continued
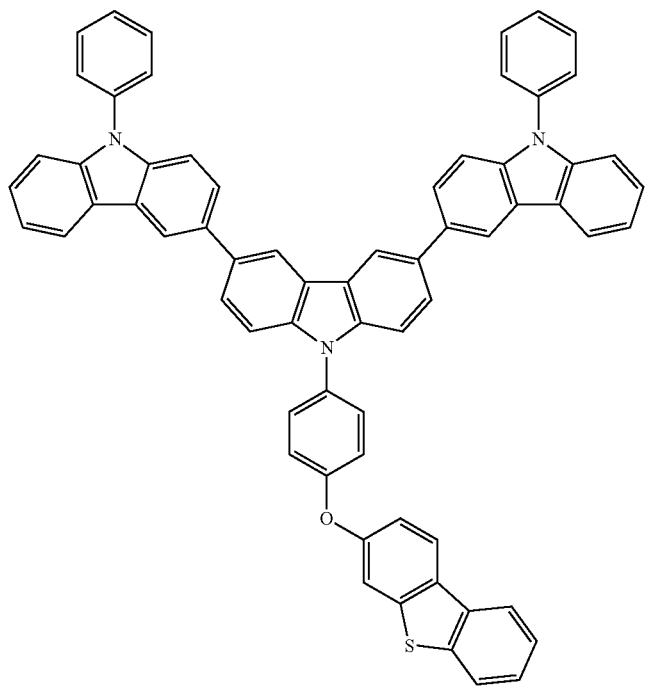
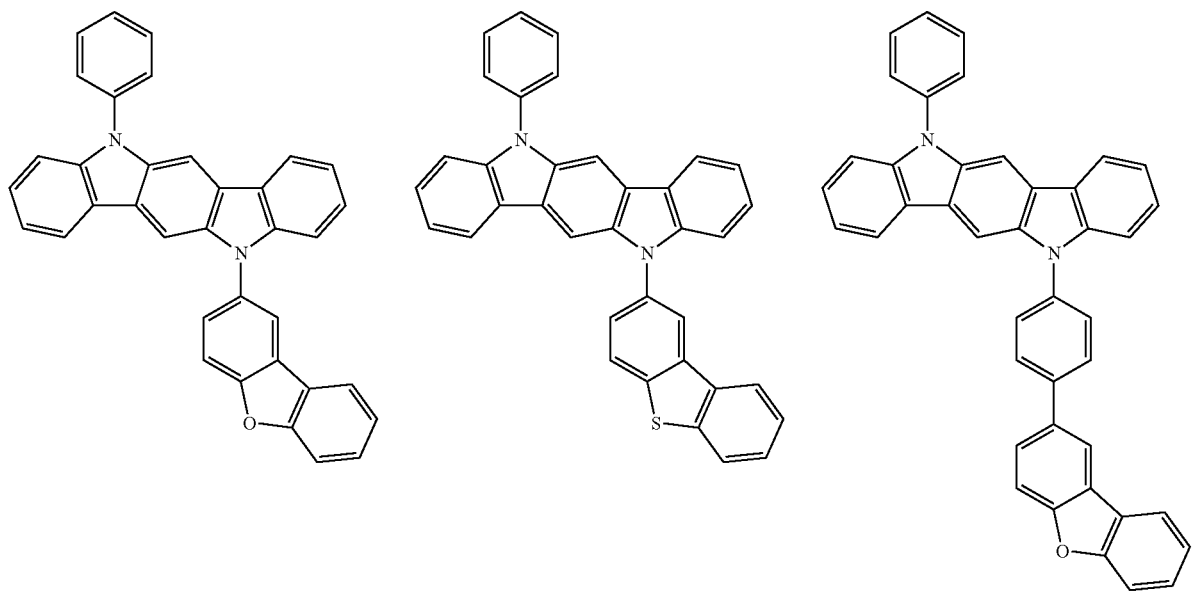

-continued
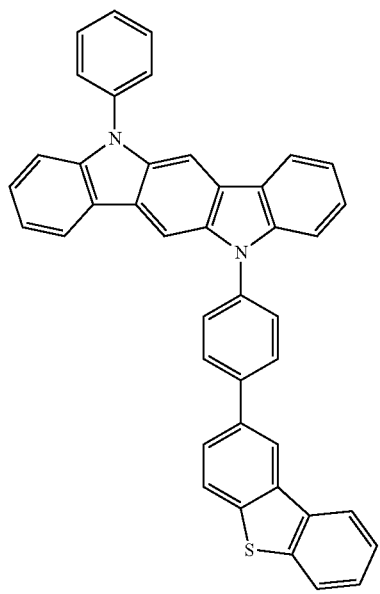
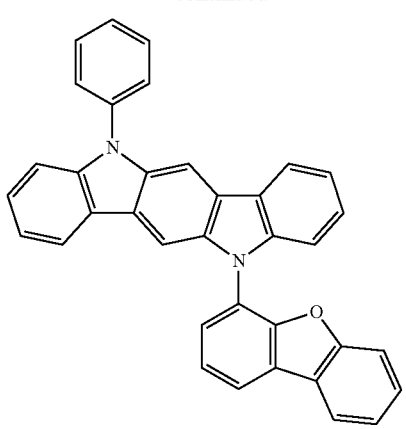
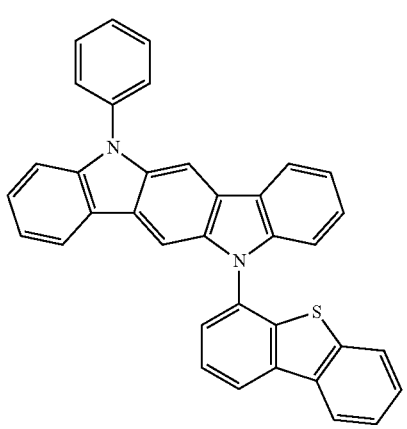
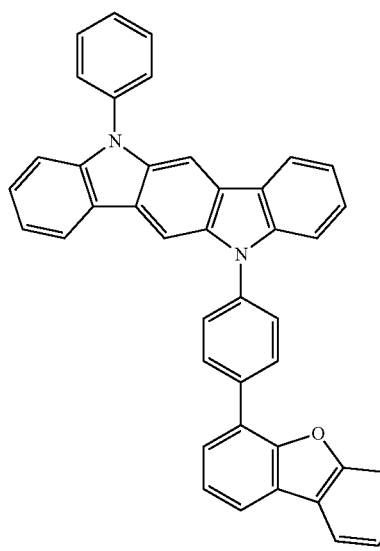
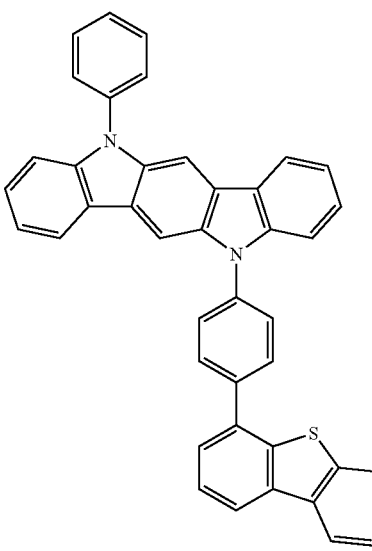
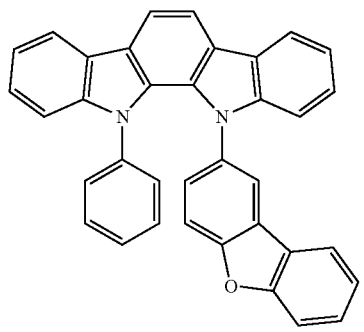
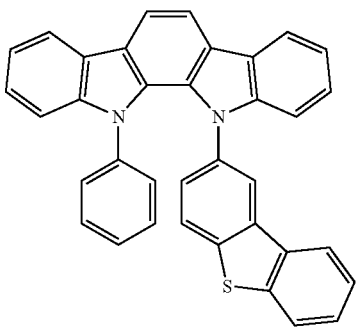
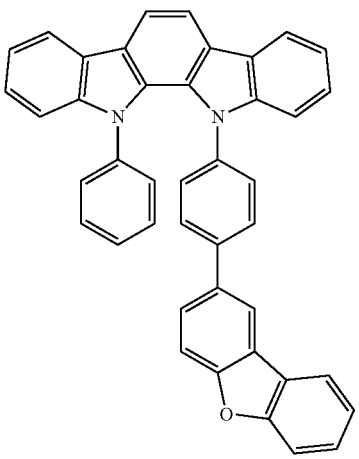

41
-continued
42
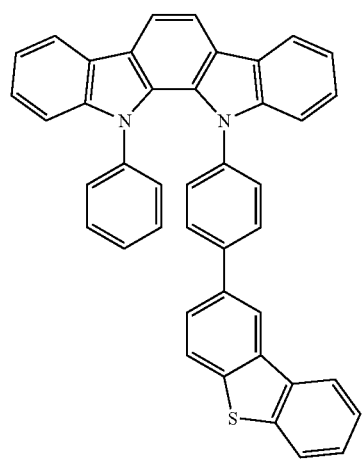
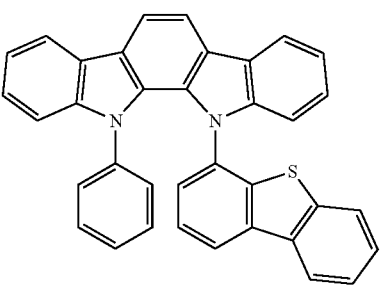
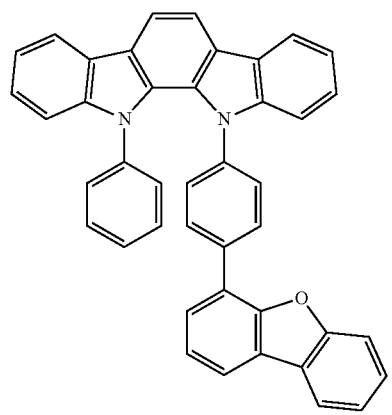
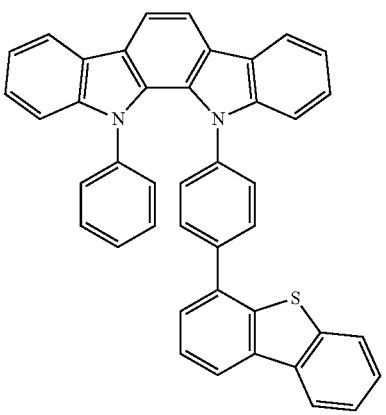
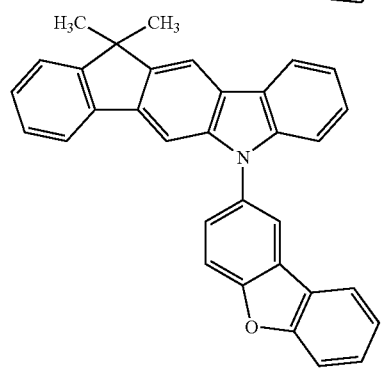
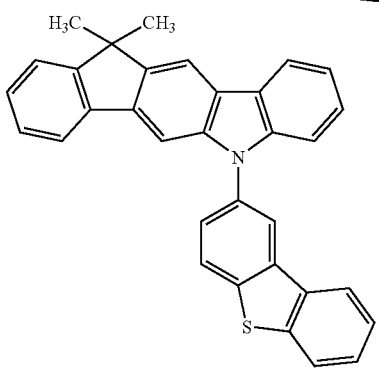
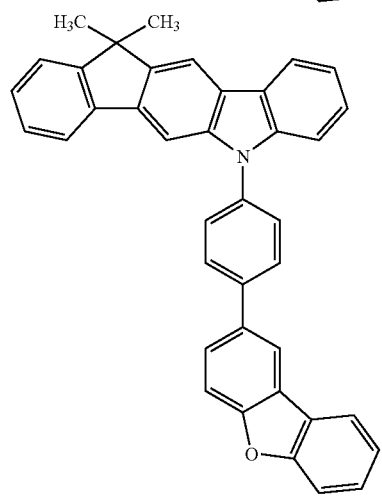
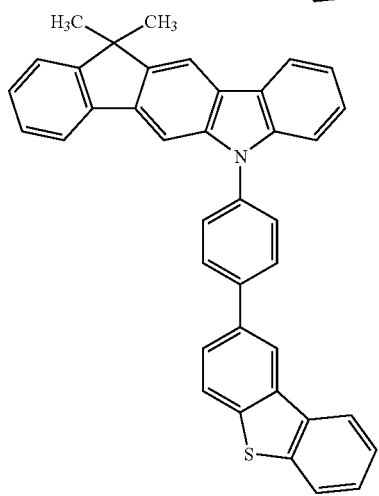

-continued
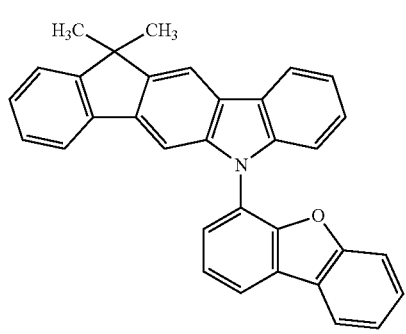
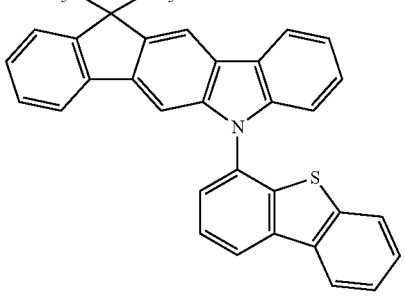
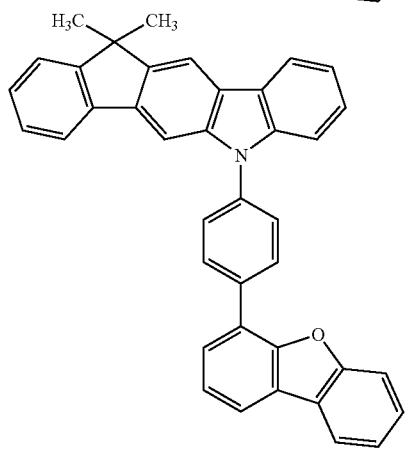
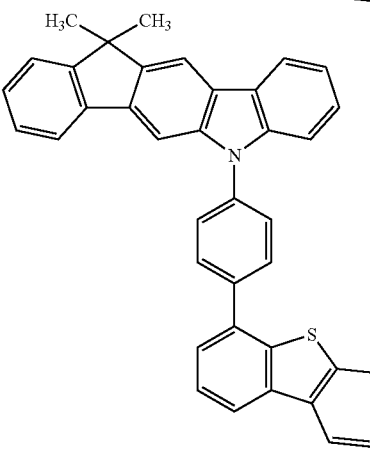
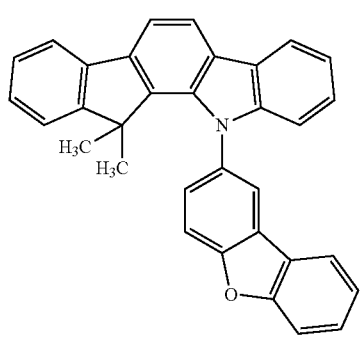
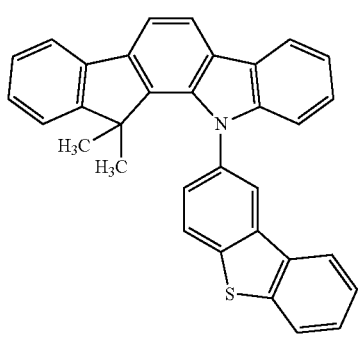
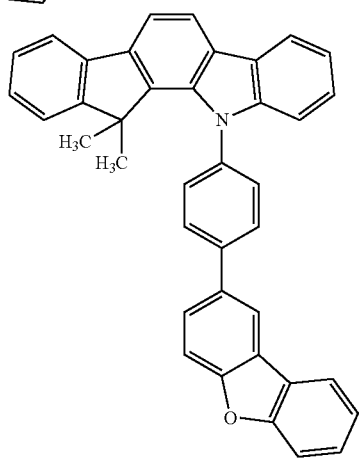
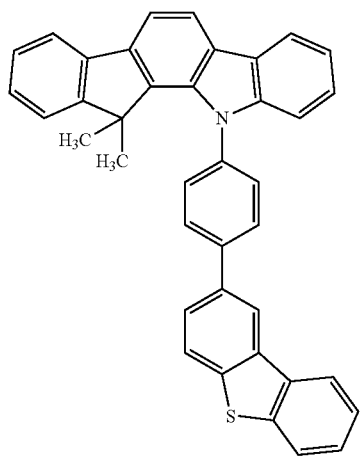
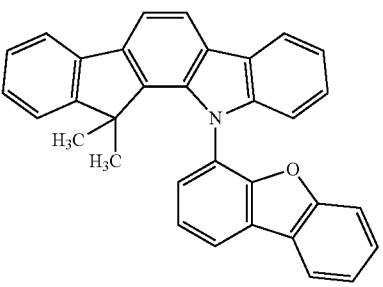
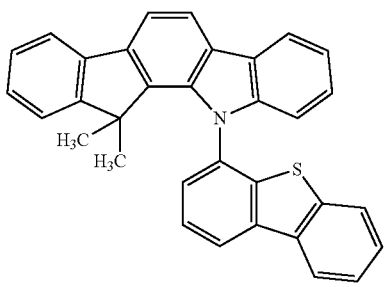

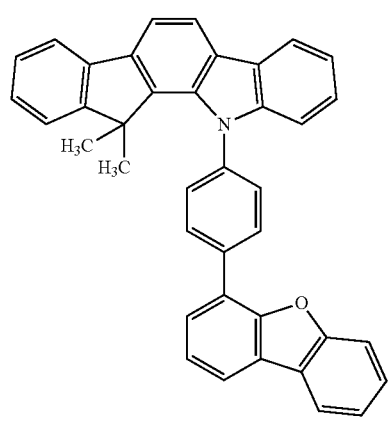
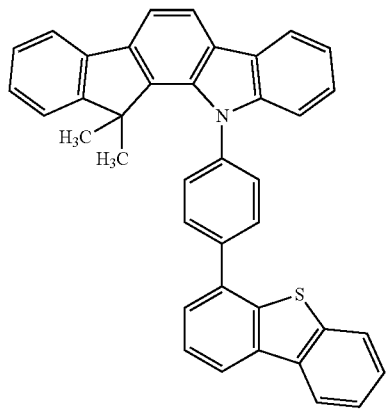
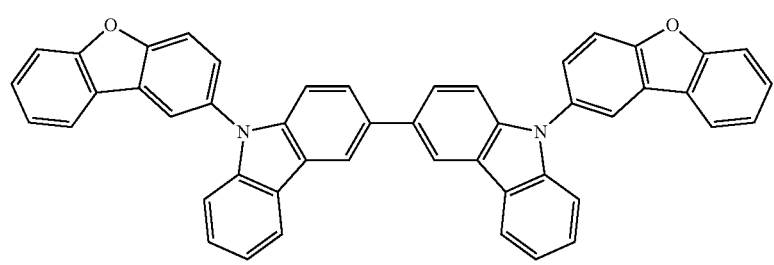
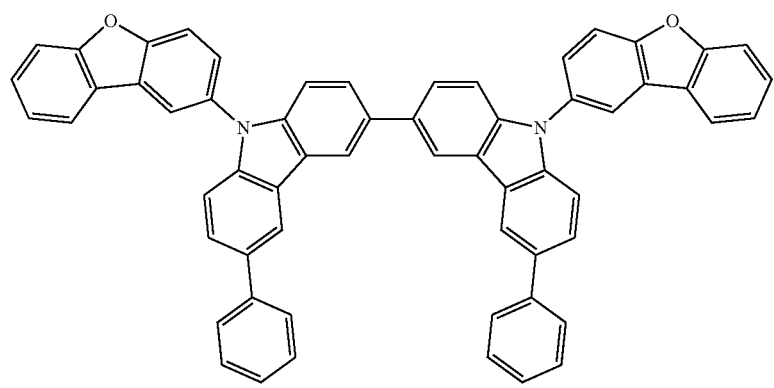
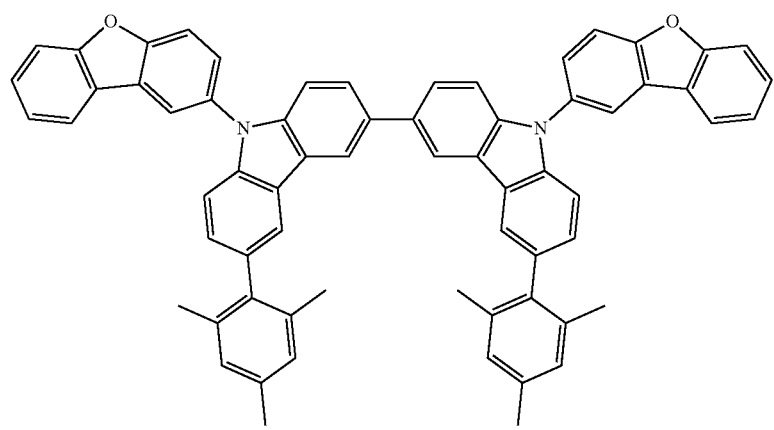

-continued
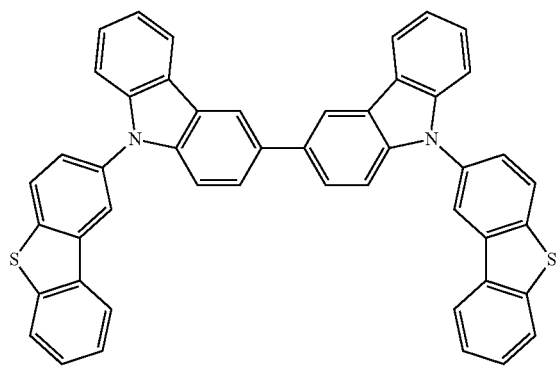
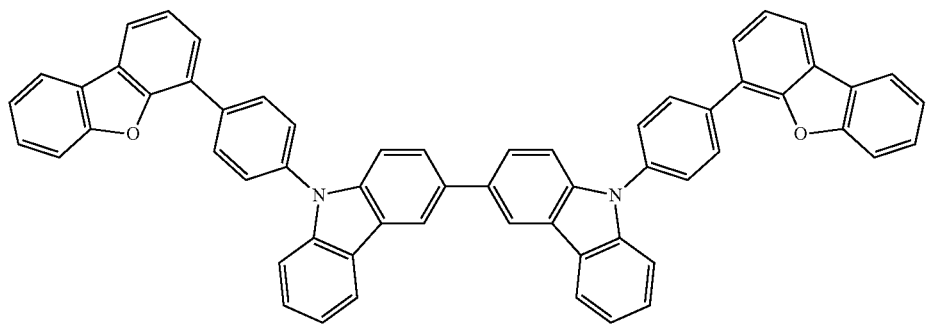
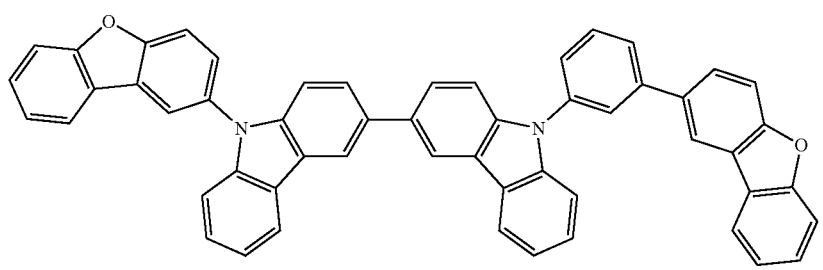
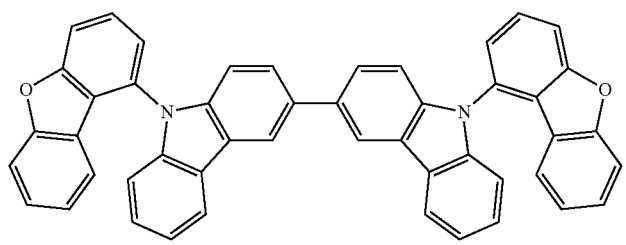
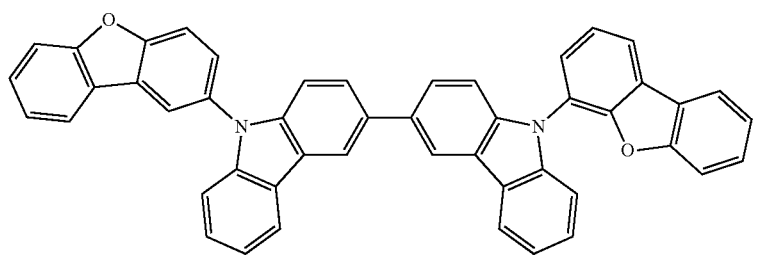

-continued
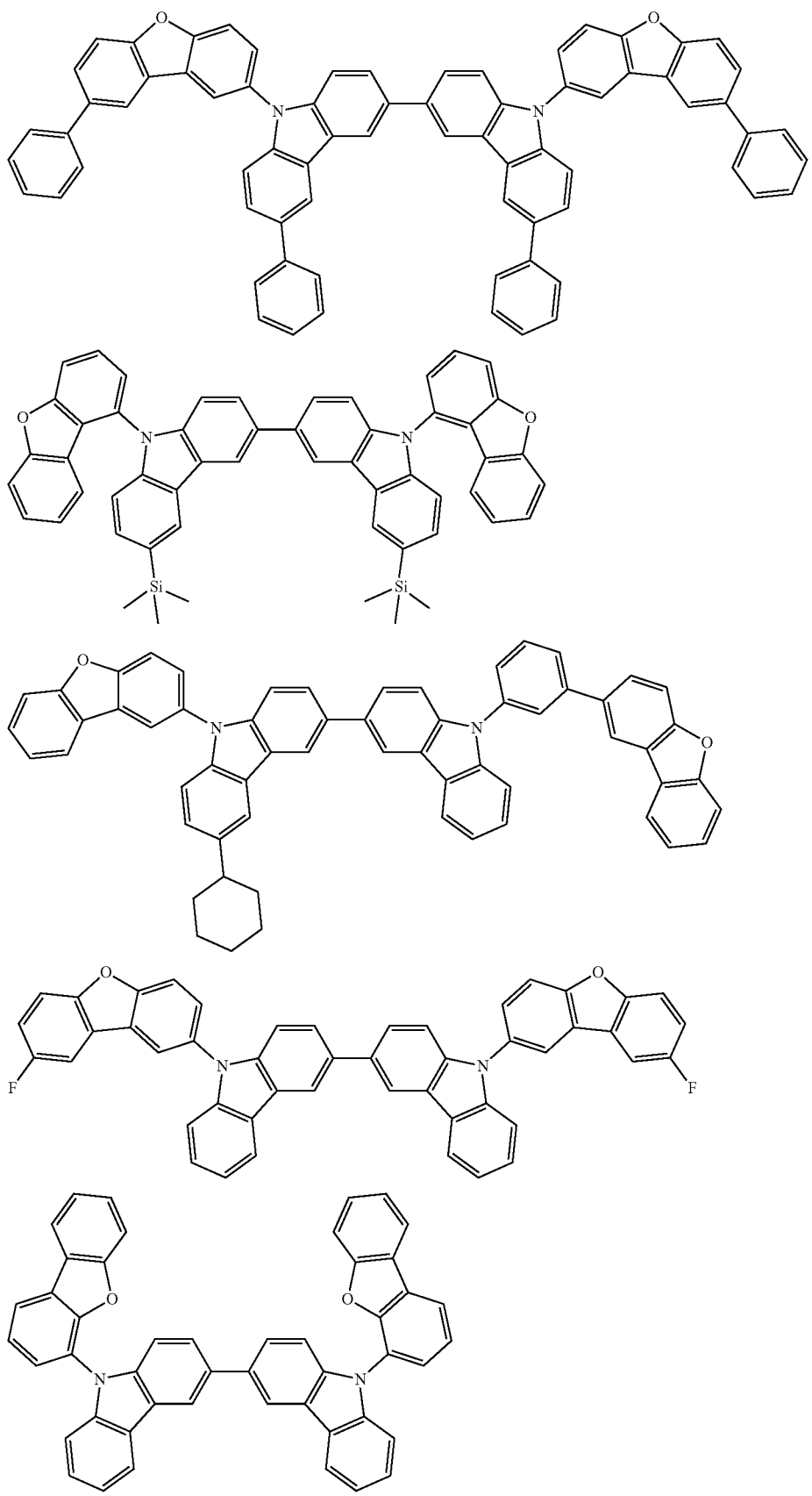

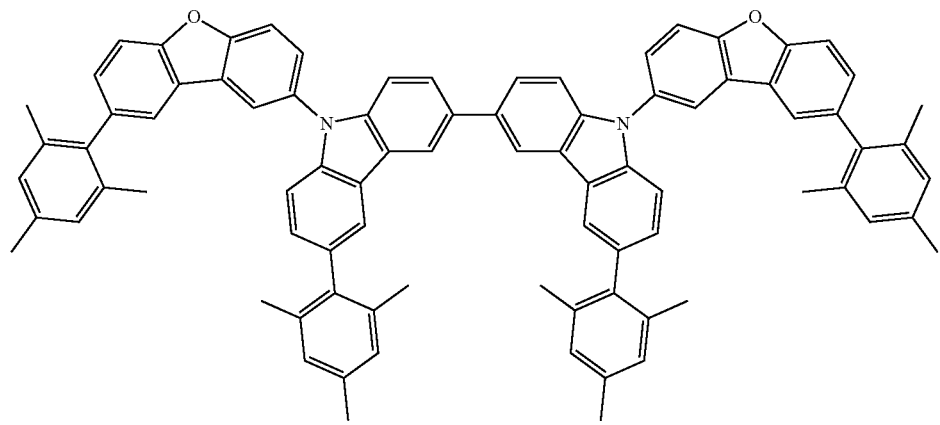
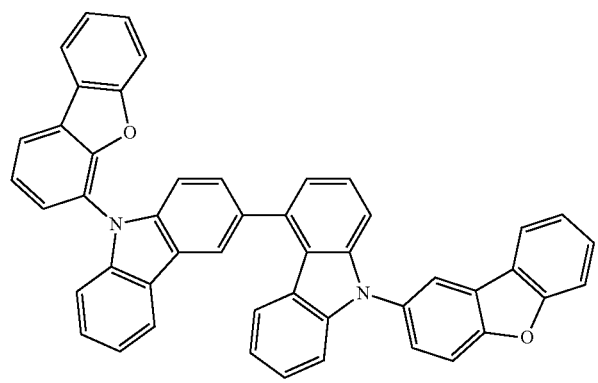
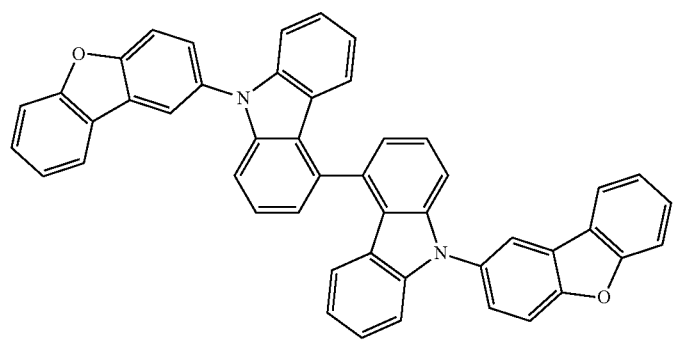

-continued
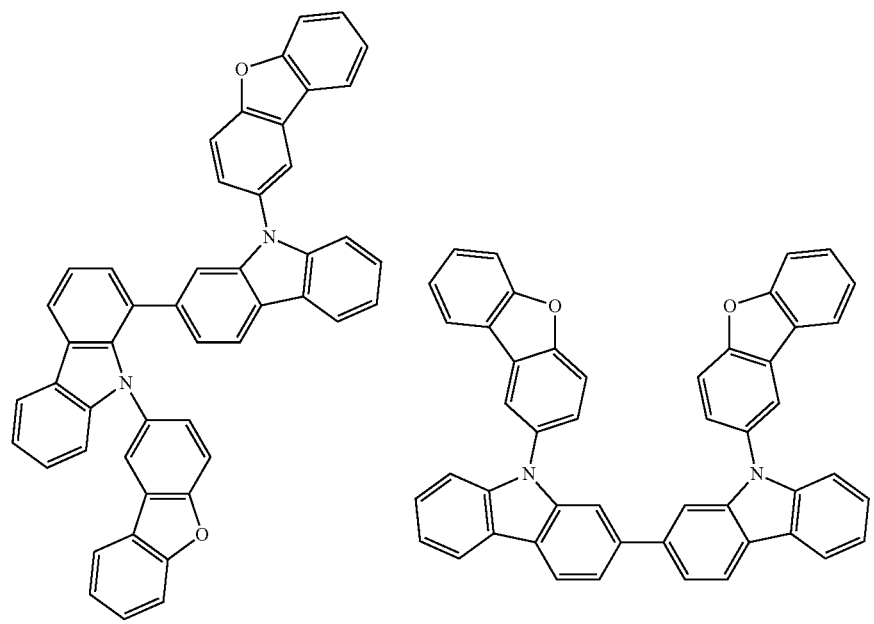
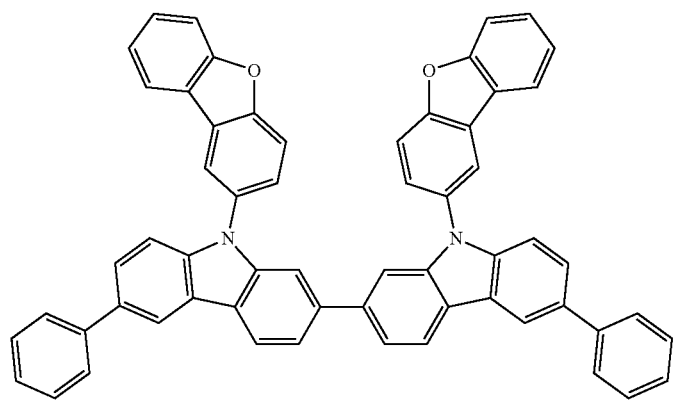
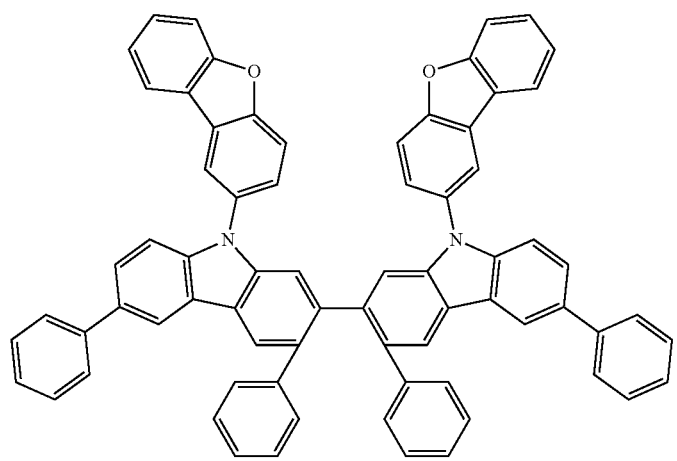

-continued
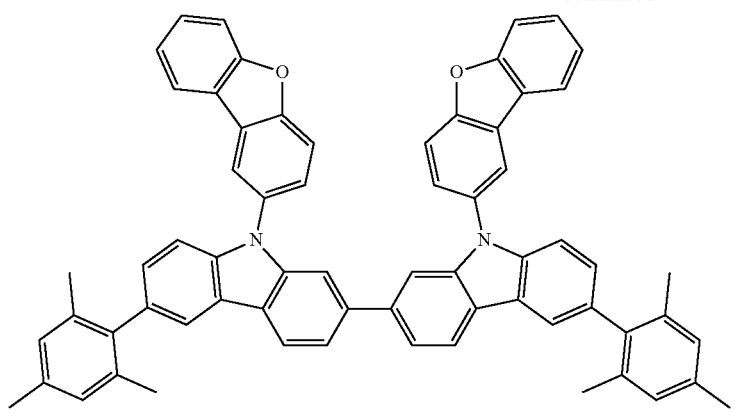
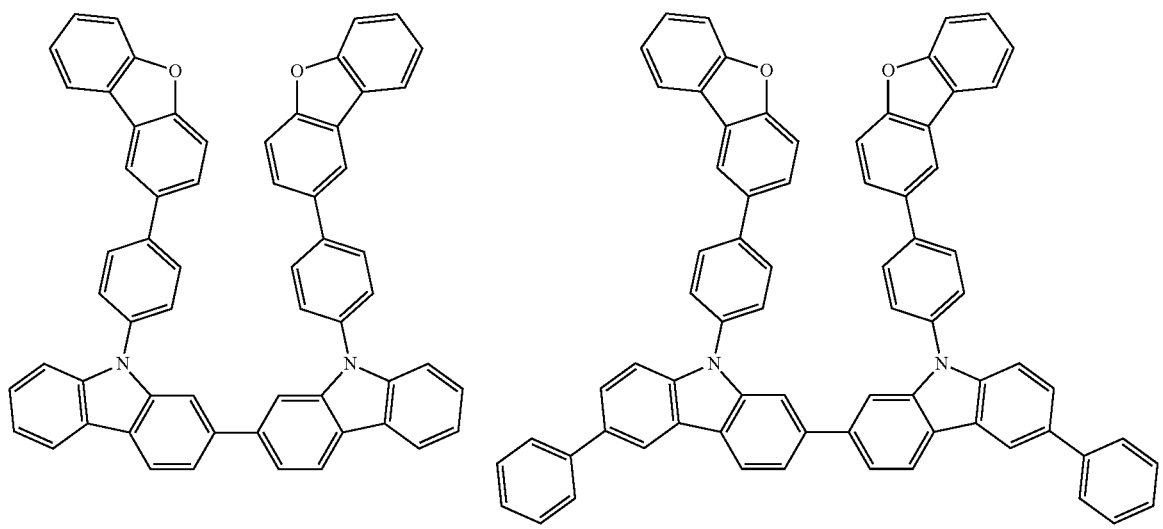
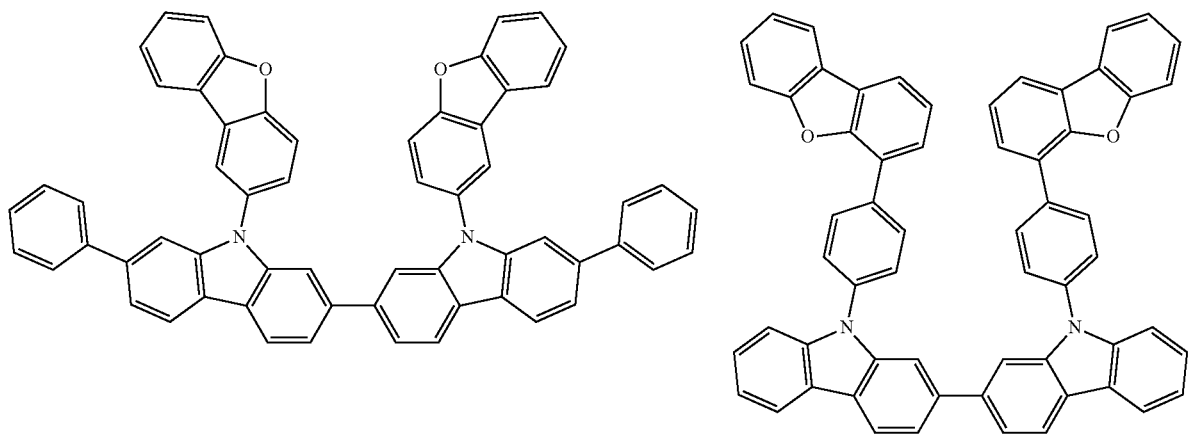

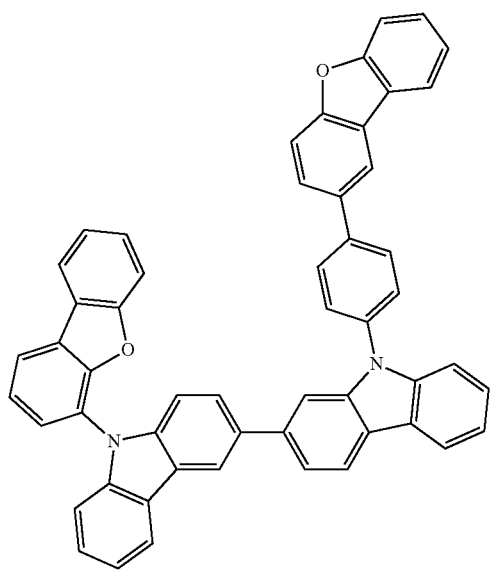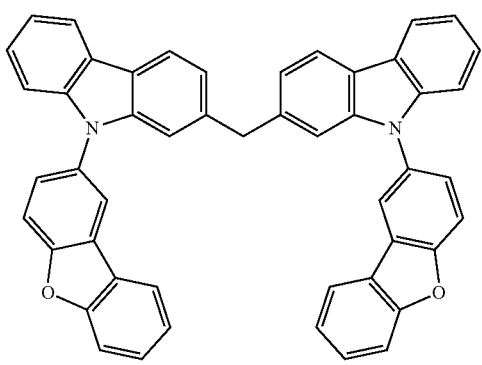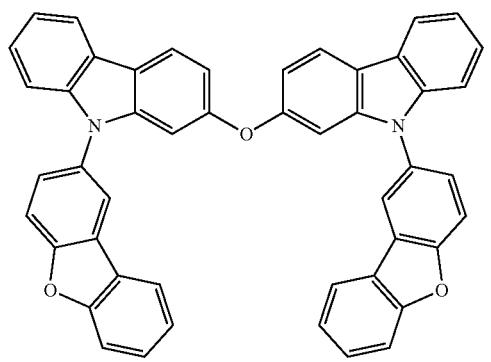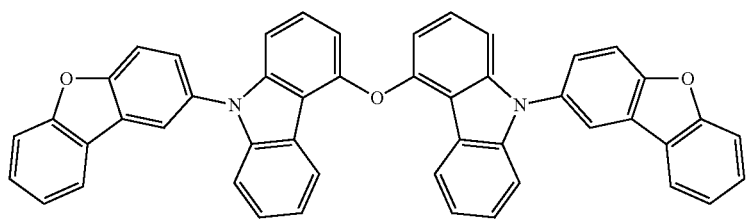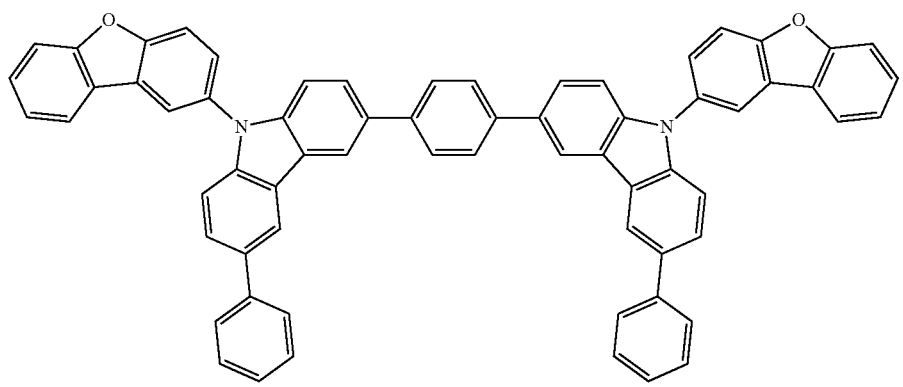

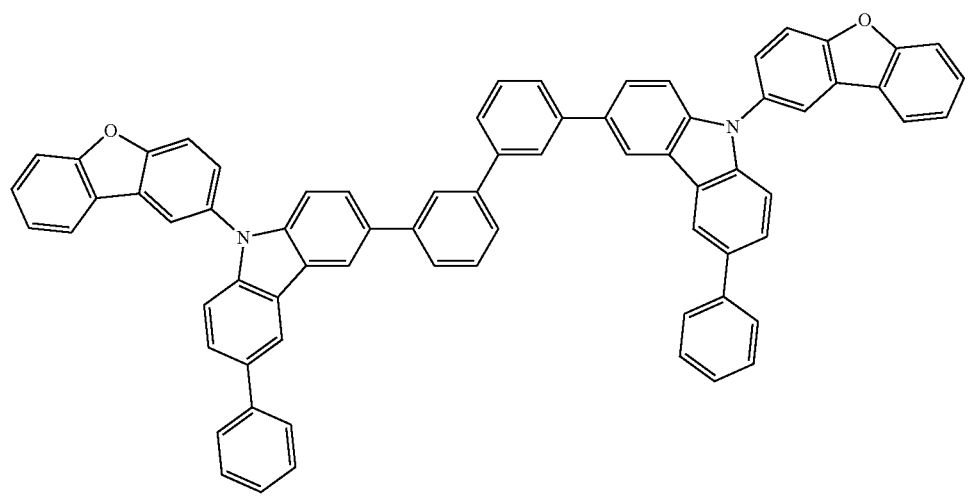
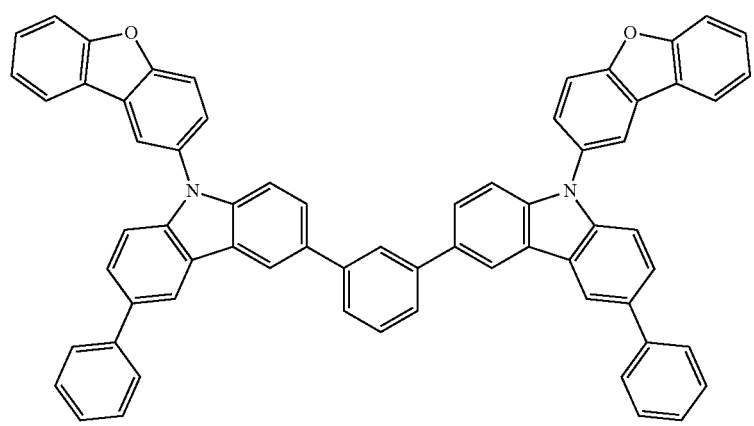
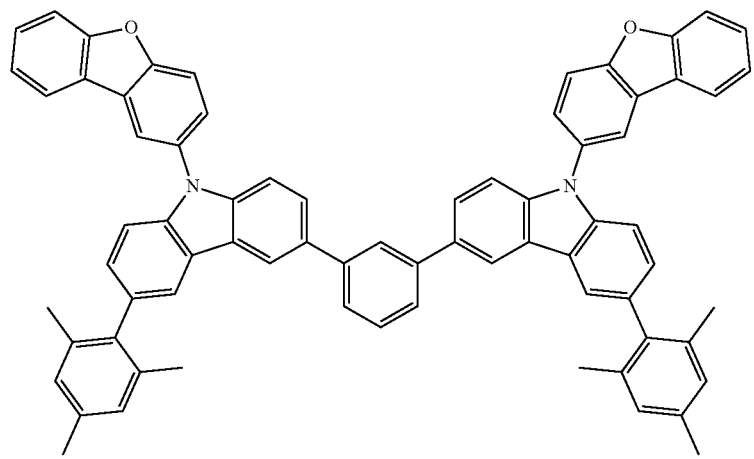

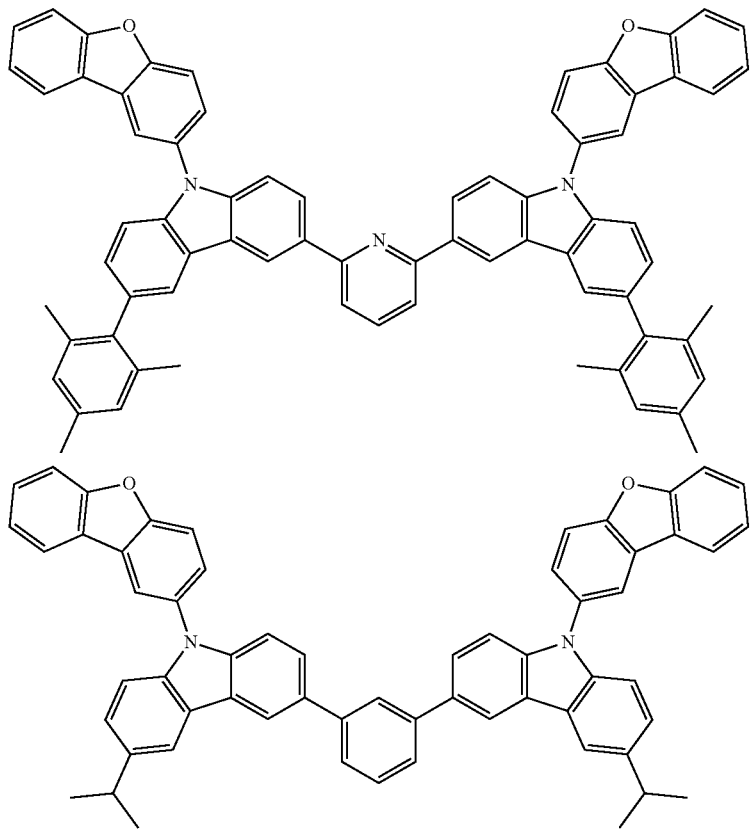
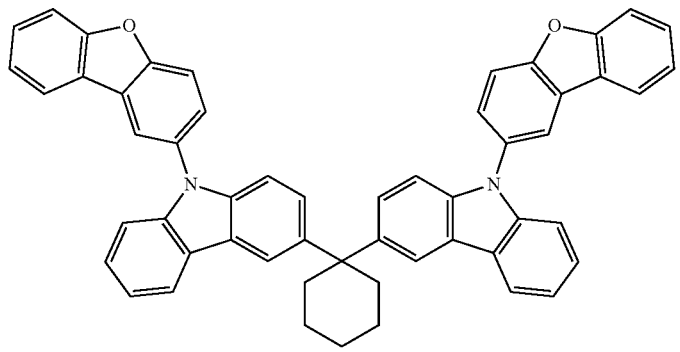
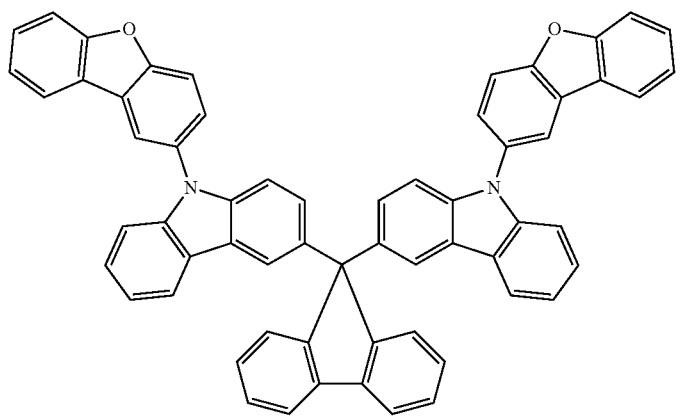

-continued
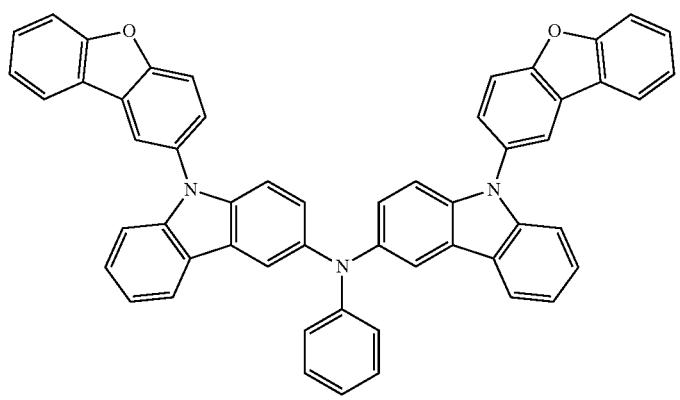
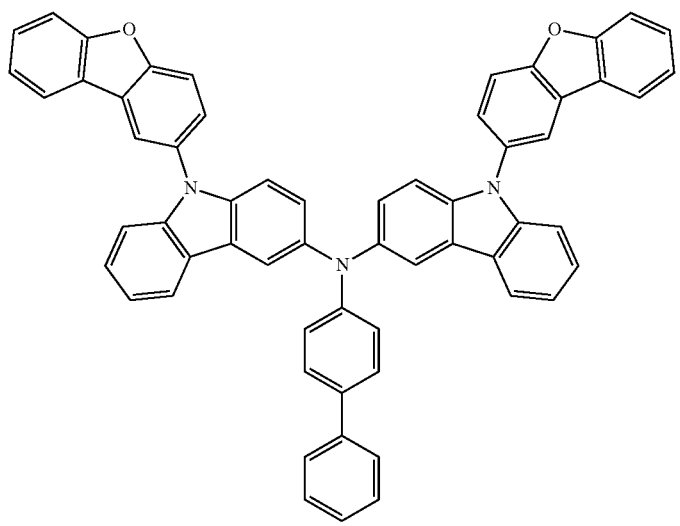
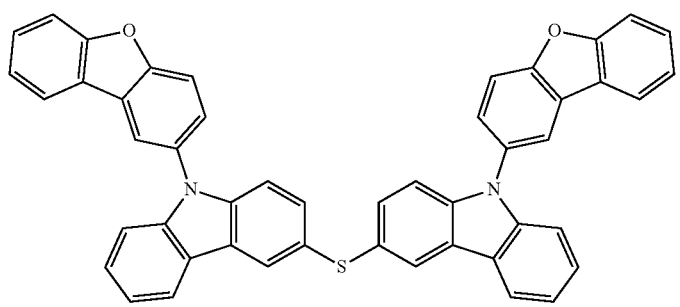
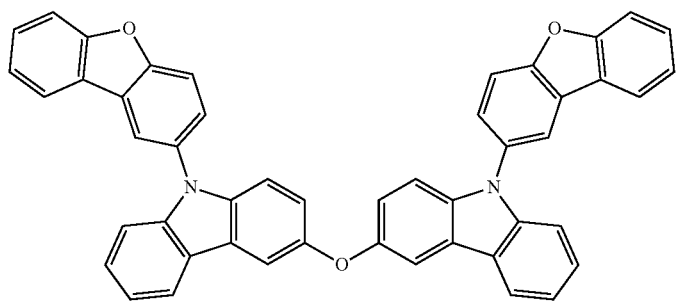

-continued
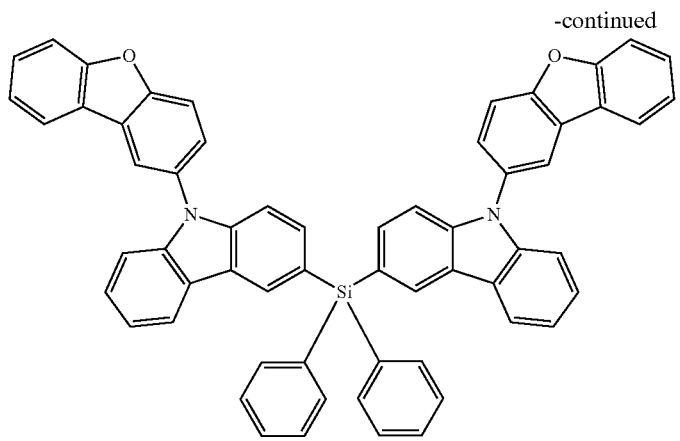
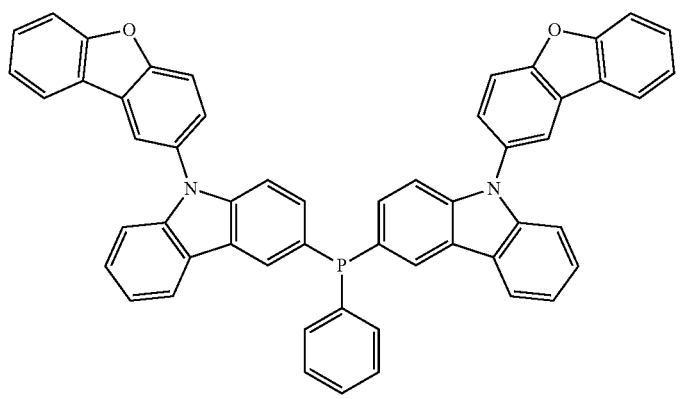
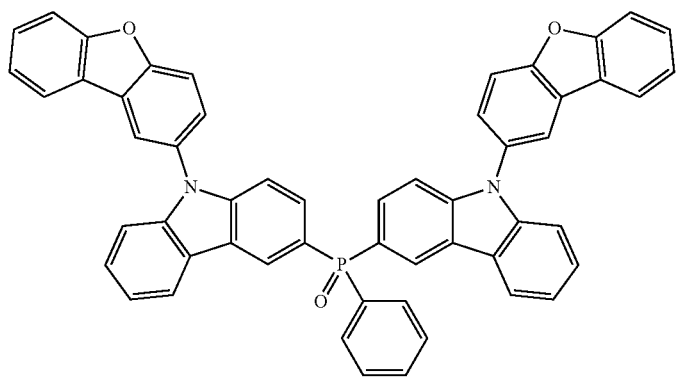
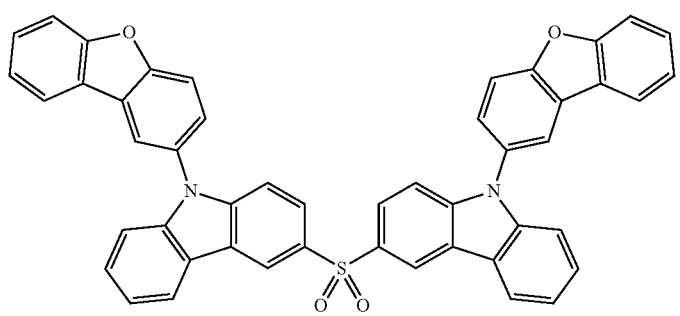

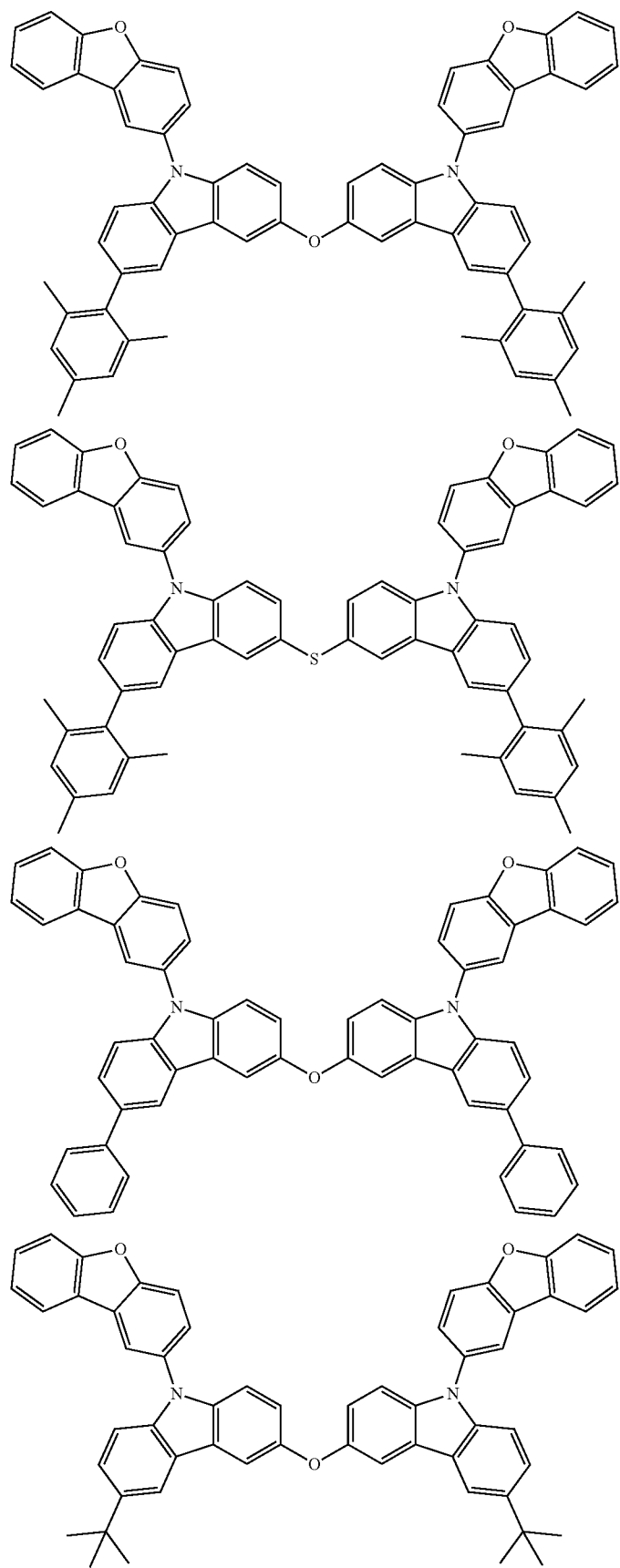

-continued
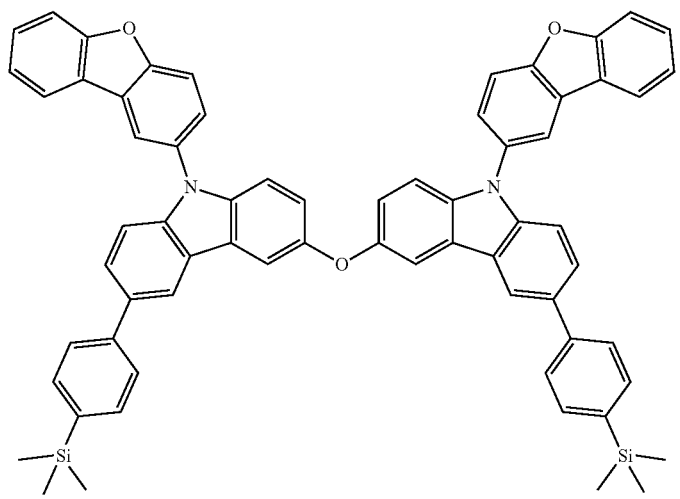
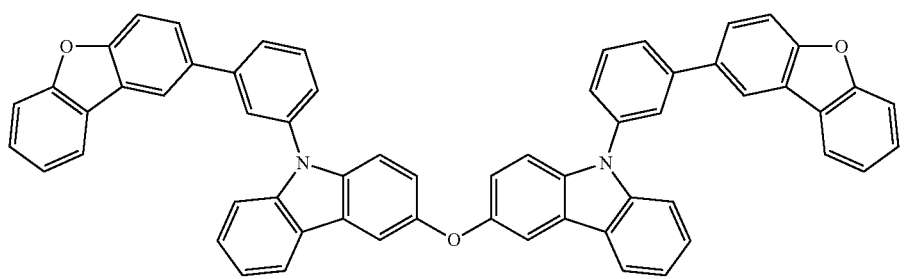
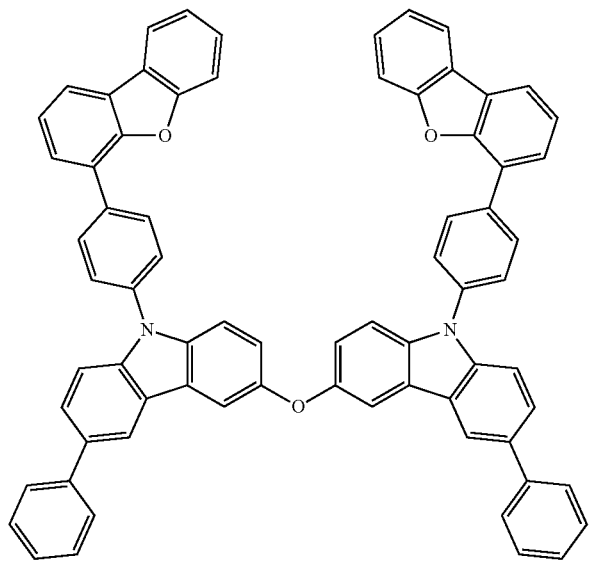

-continued
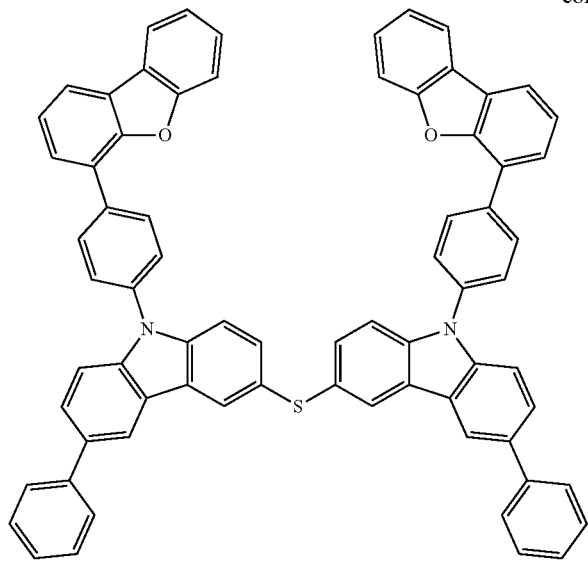
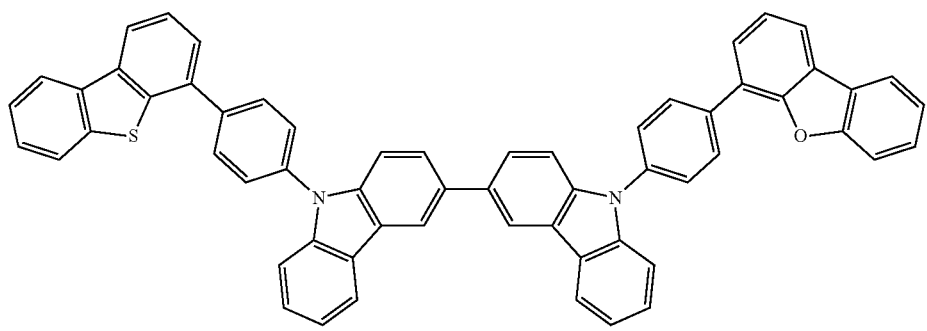
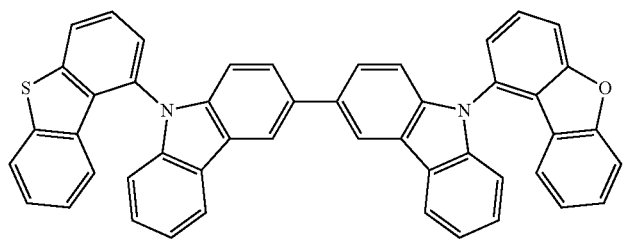
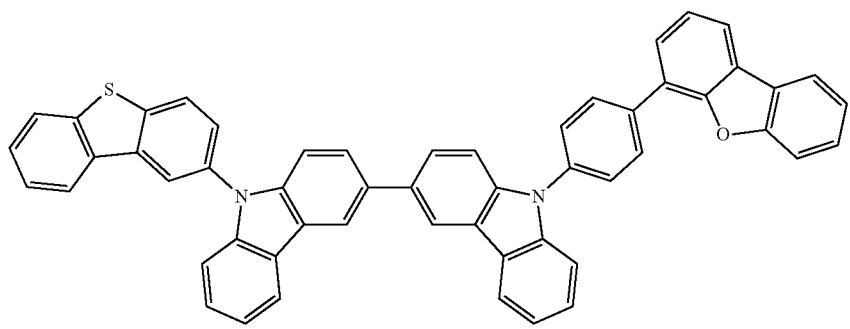

-continued
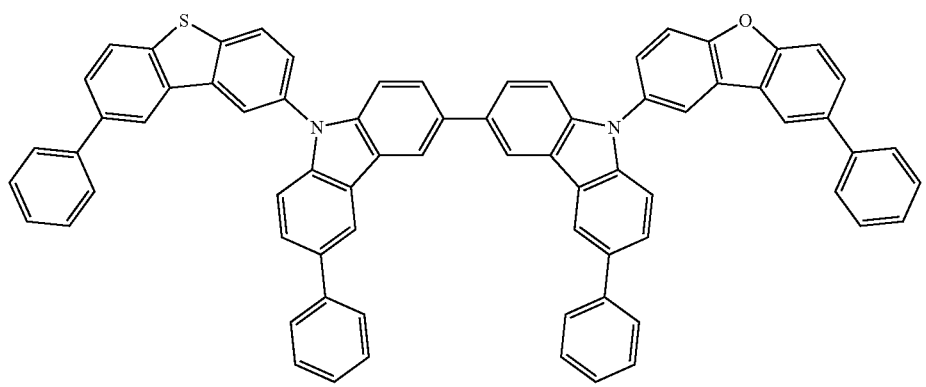
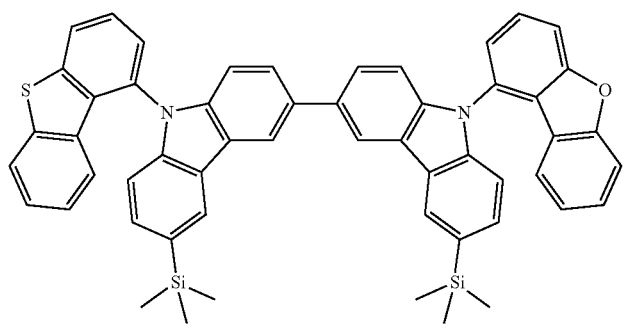
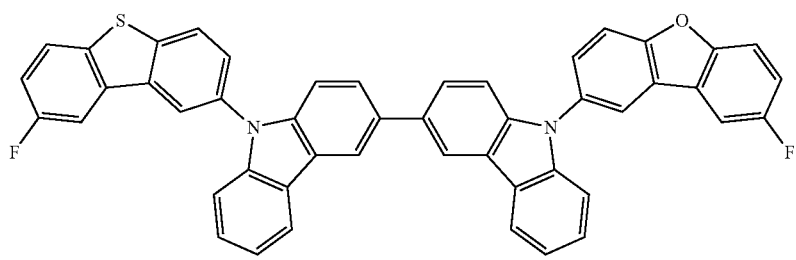
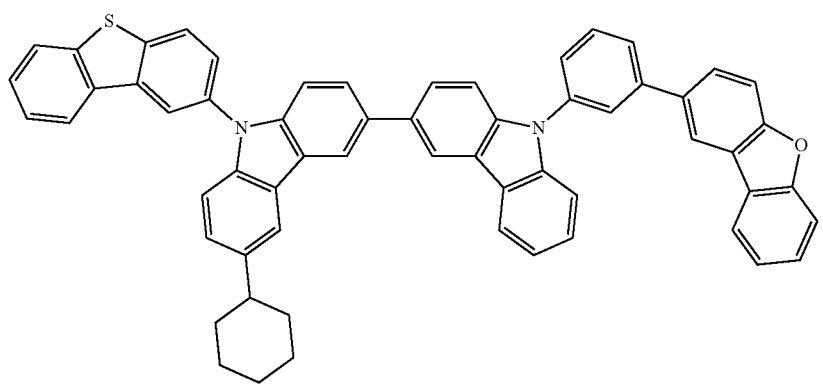

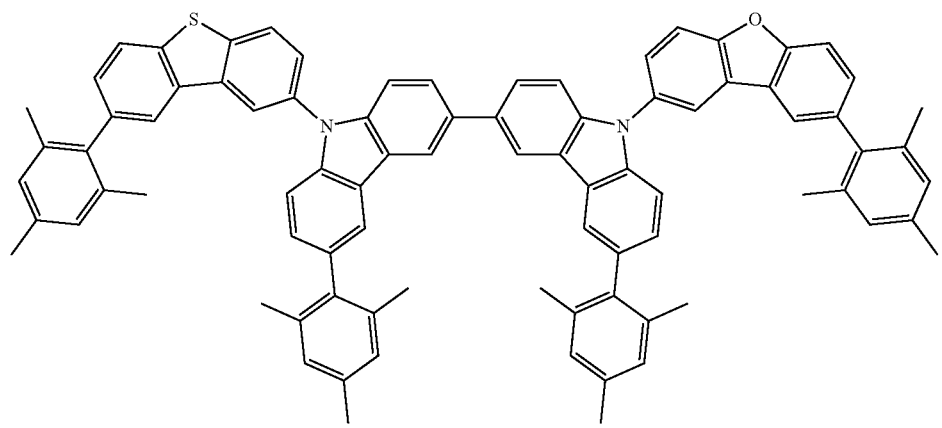
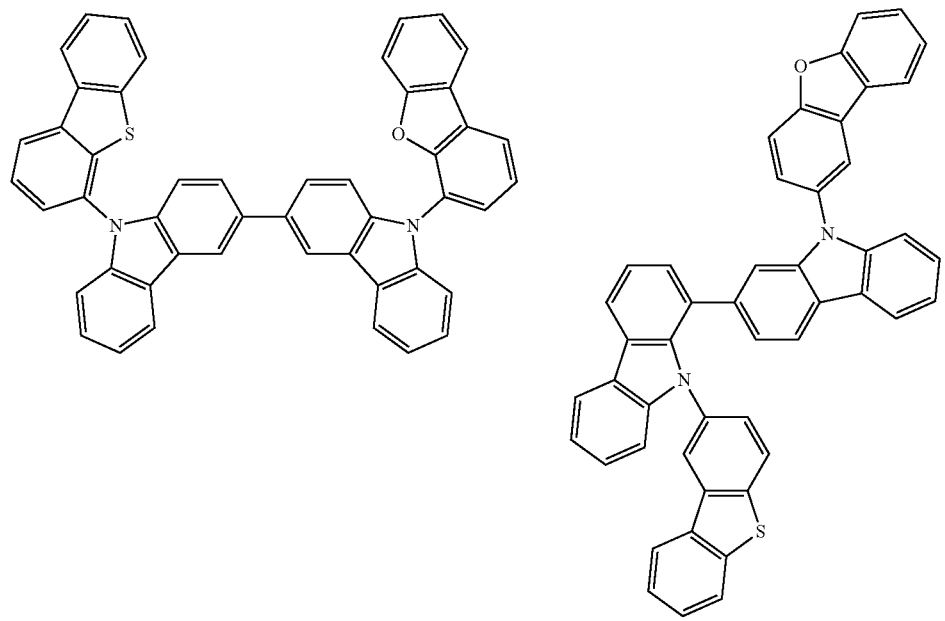
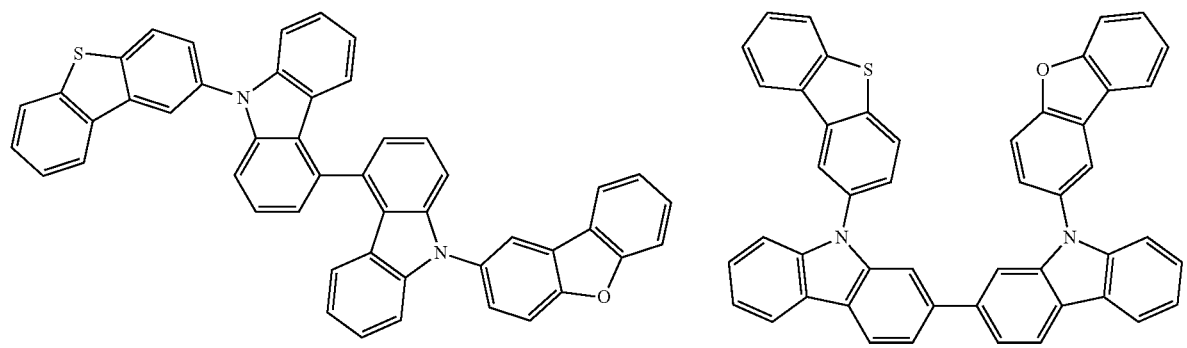

-continued
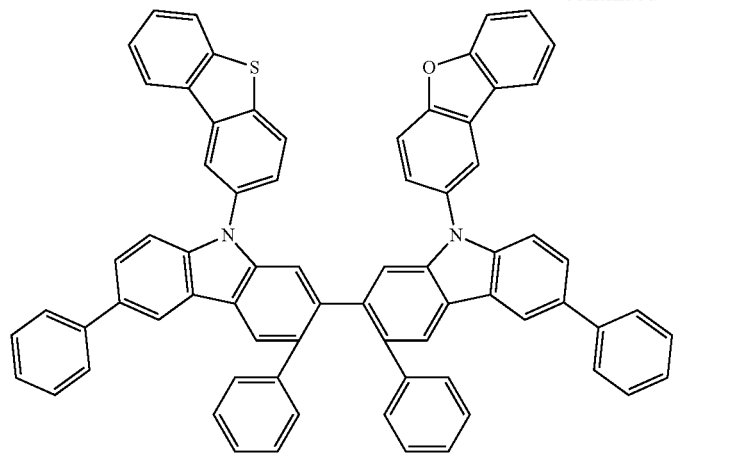
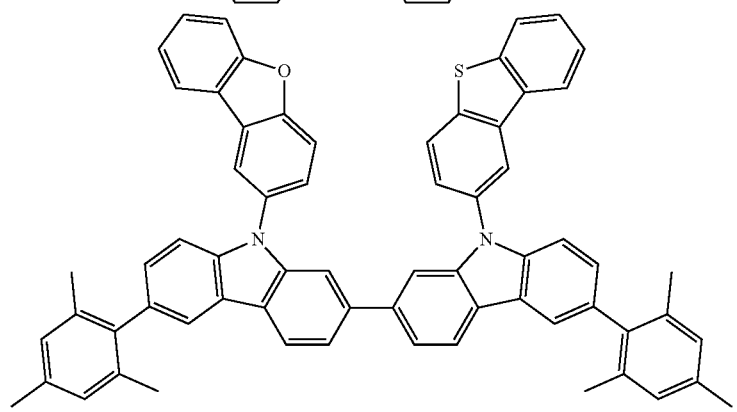
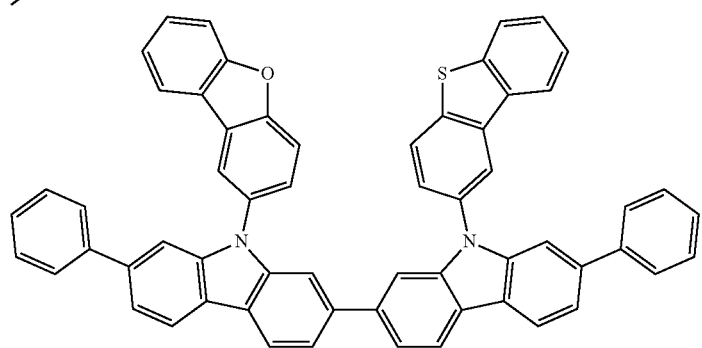
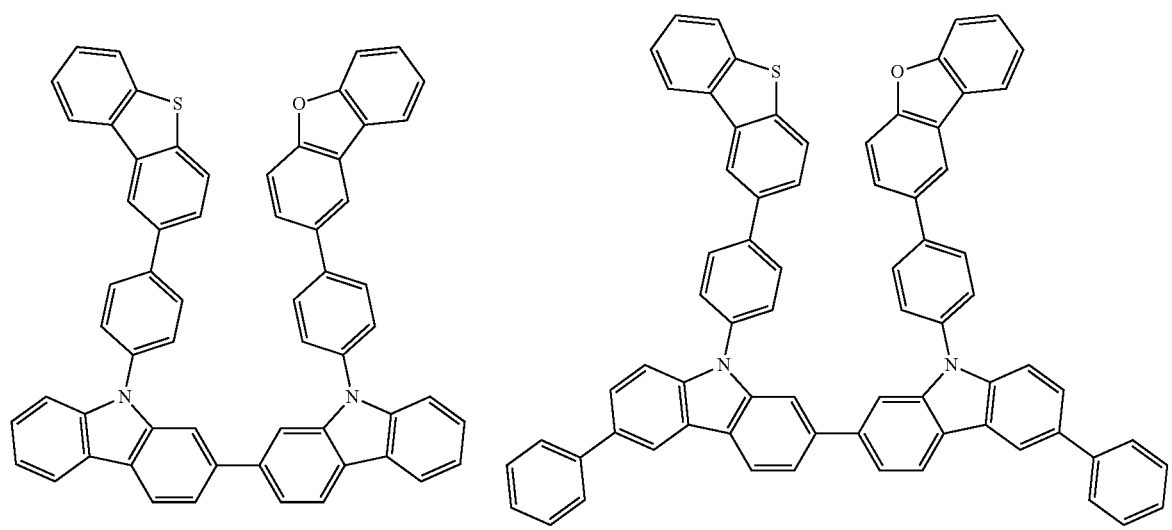

-continued
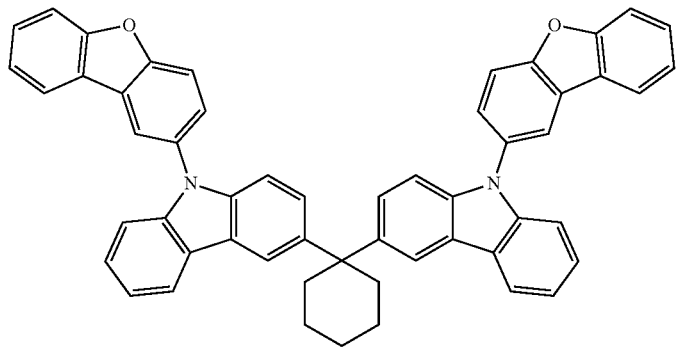
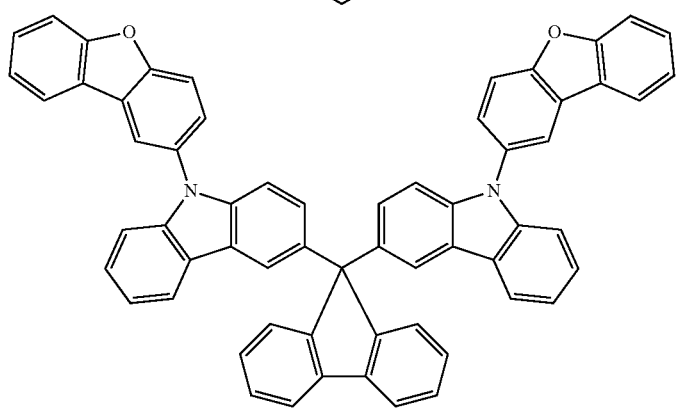
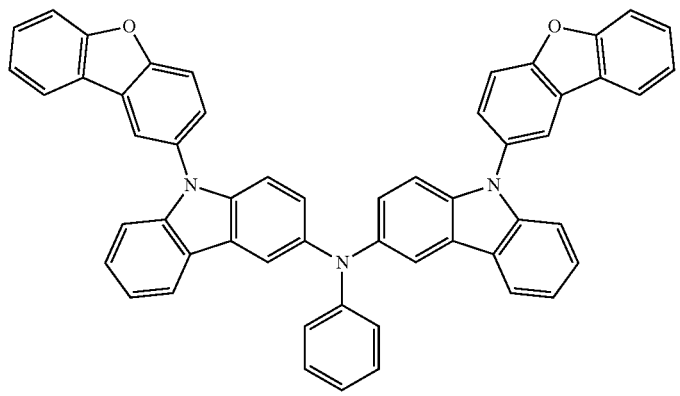
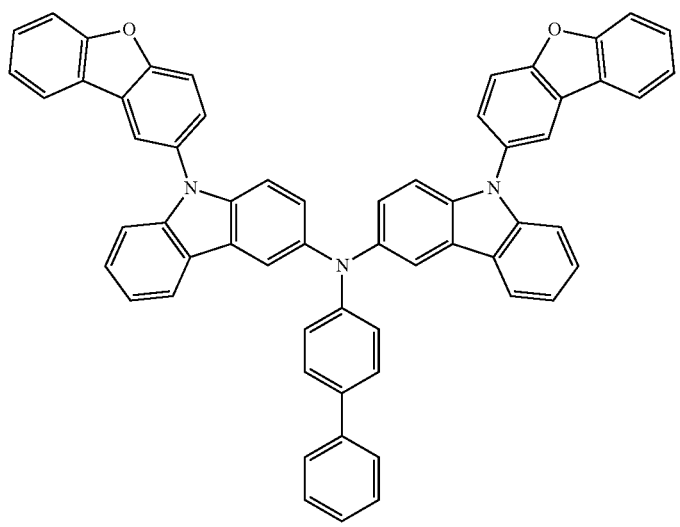

-continued
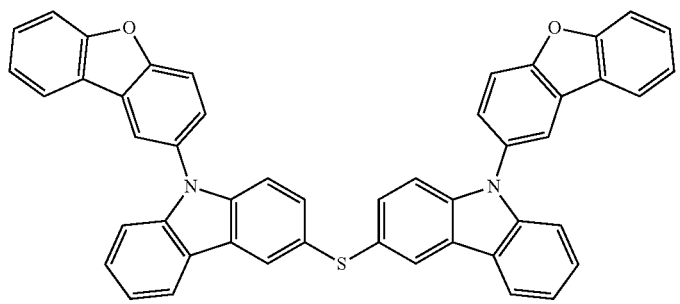
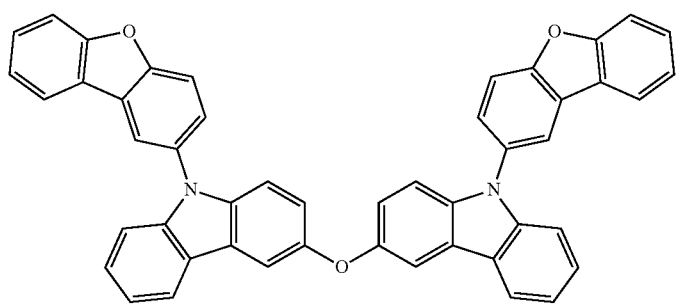
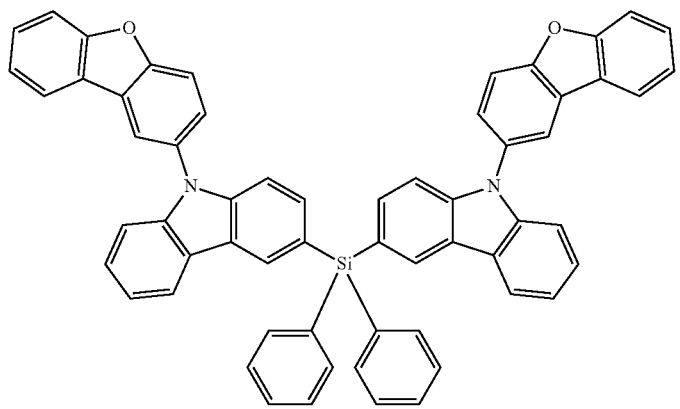
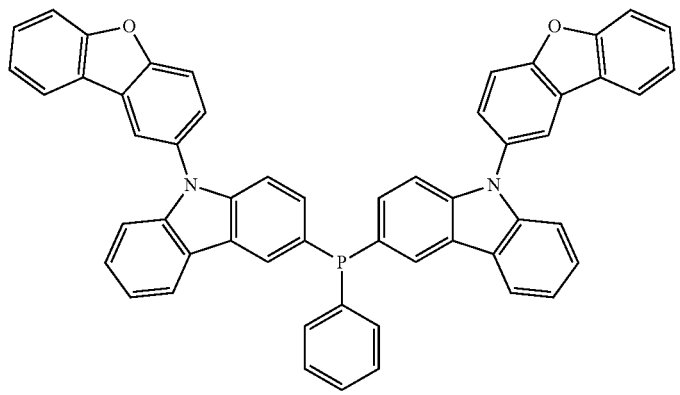

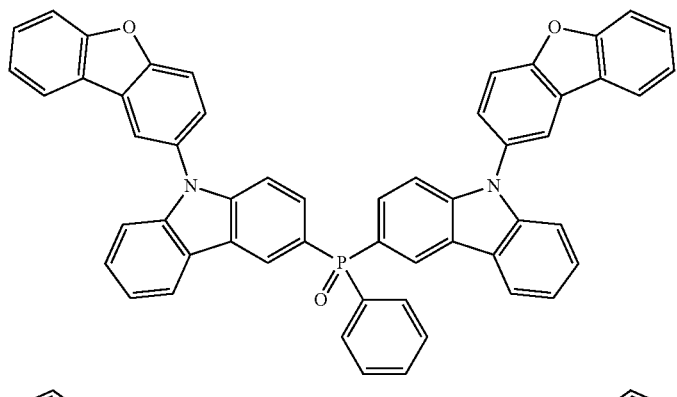
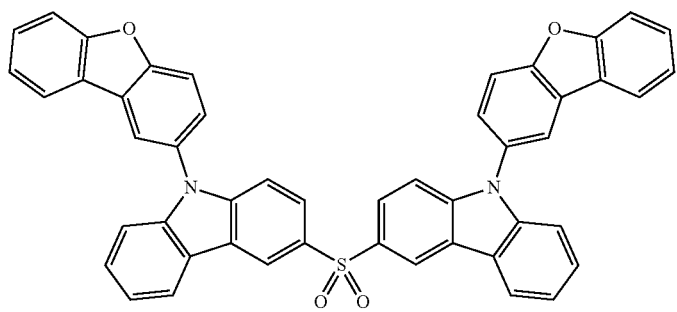
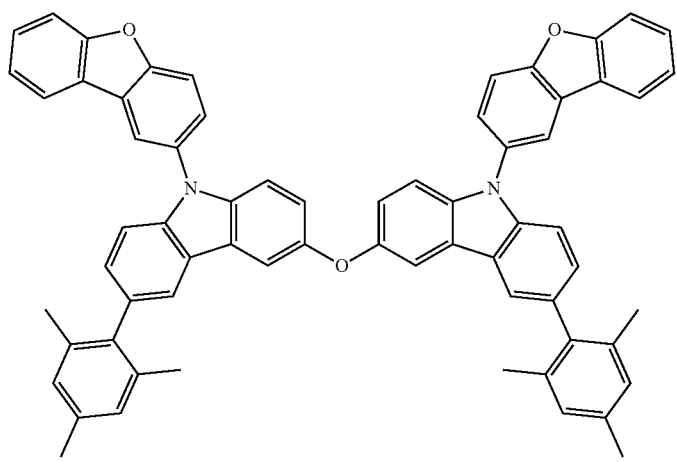
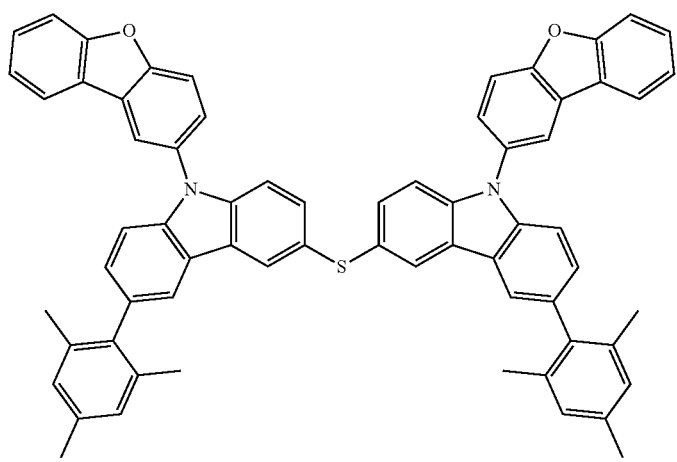

-continued
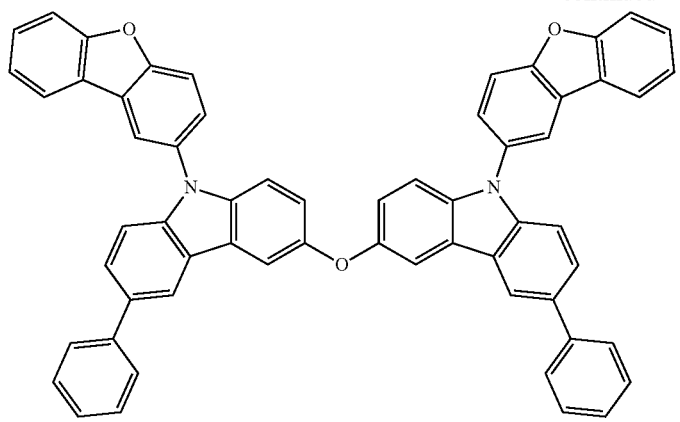
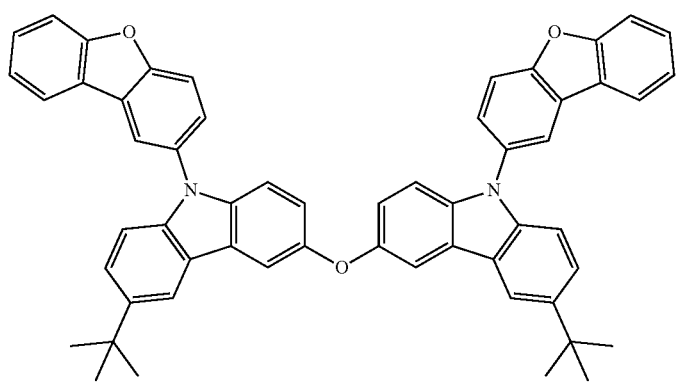
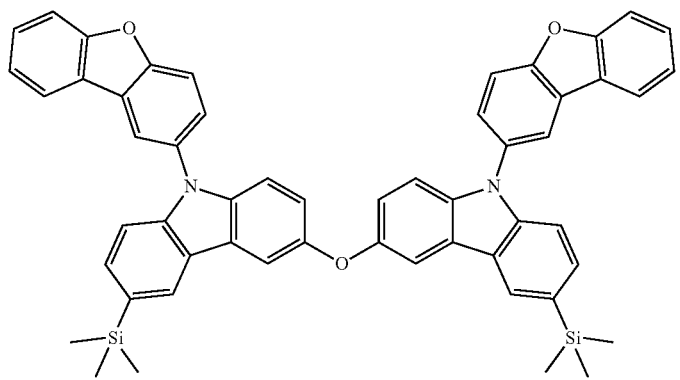
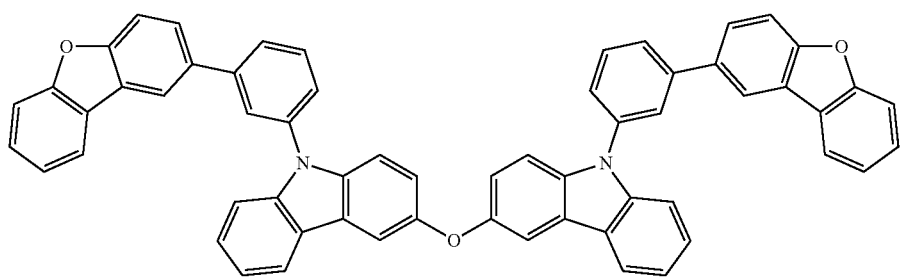

-continued
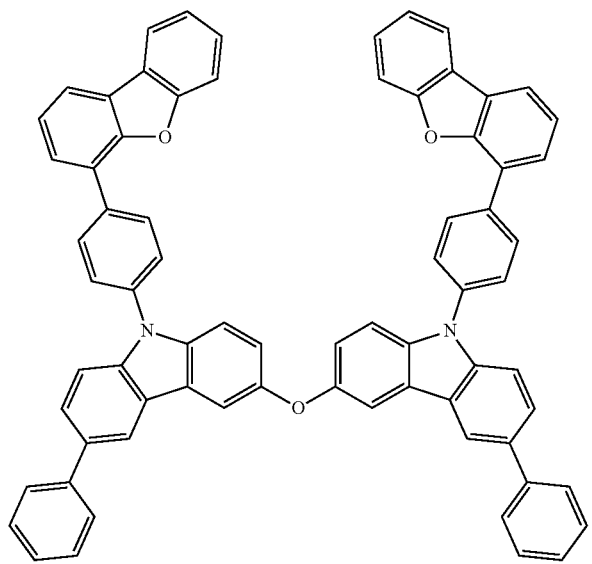
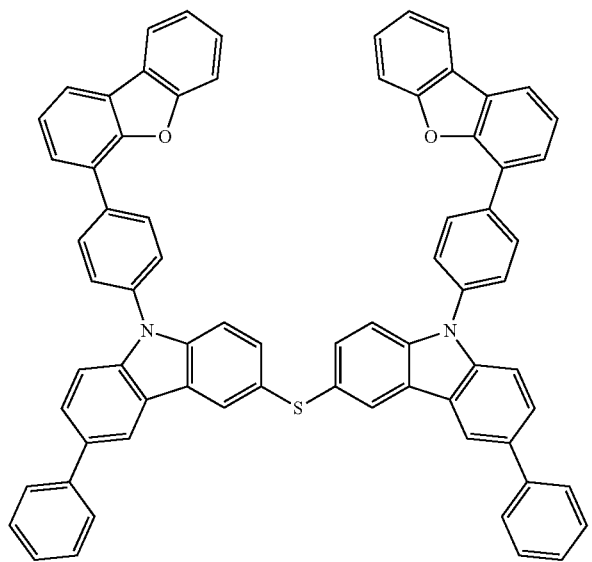
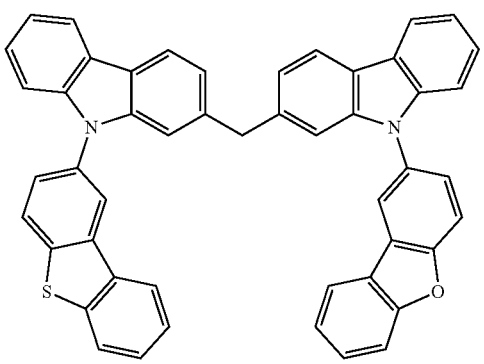
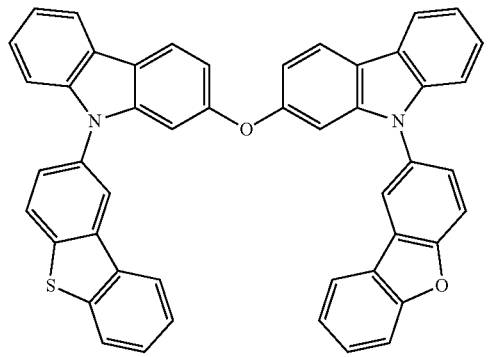
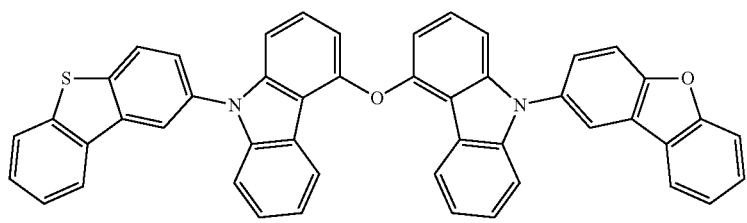

-continued
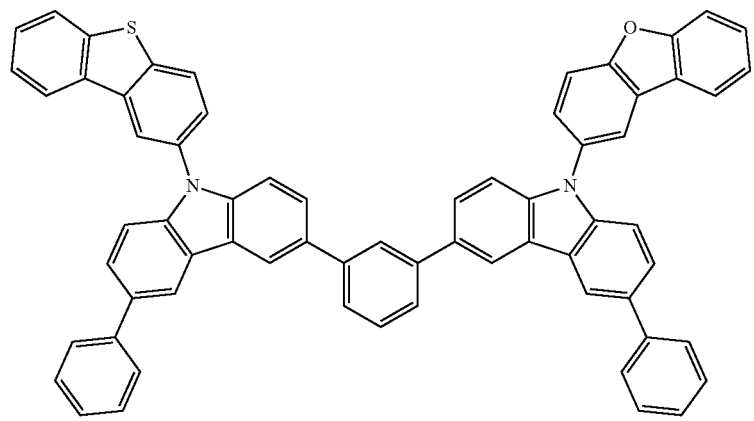
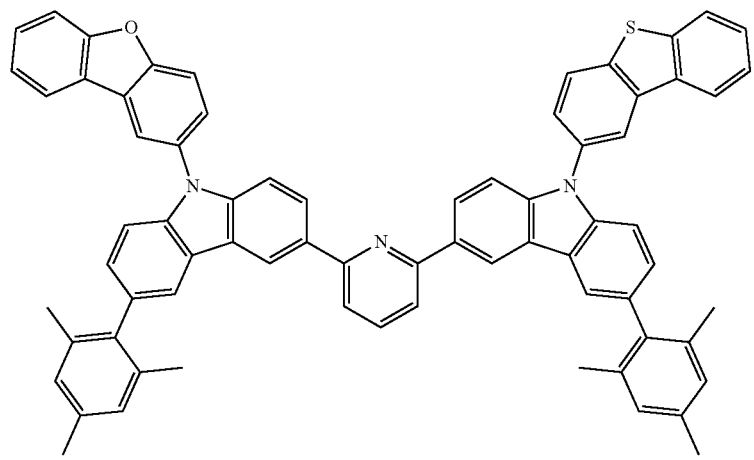
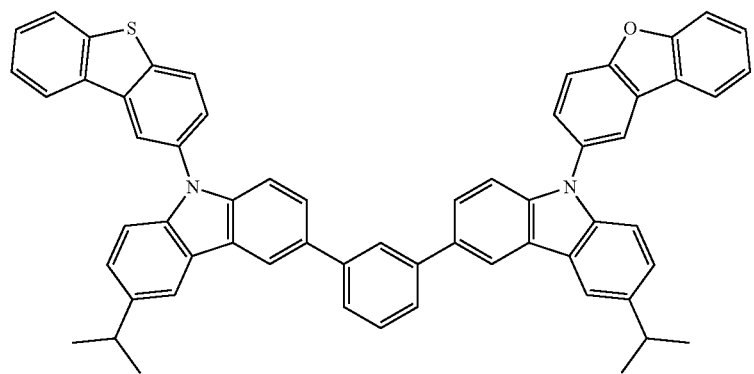
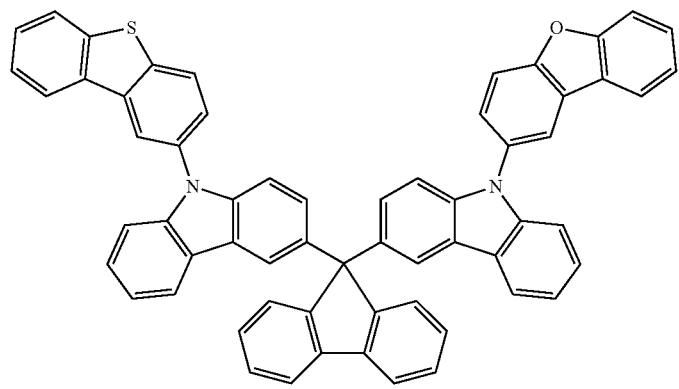

-continued
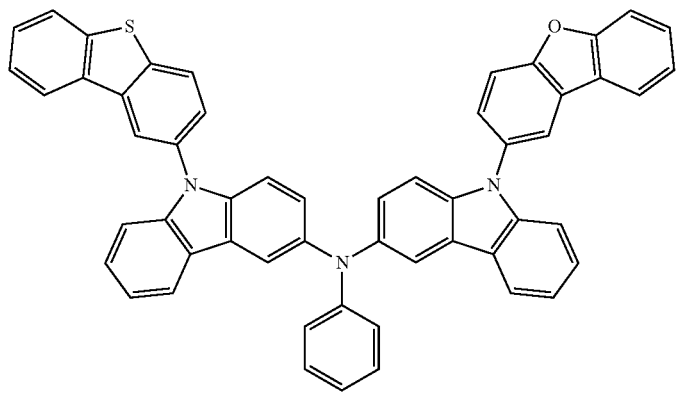
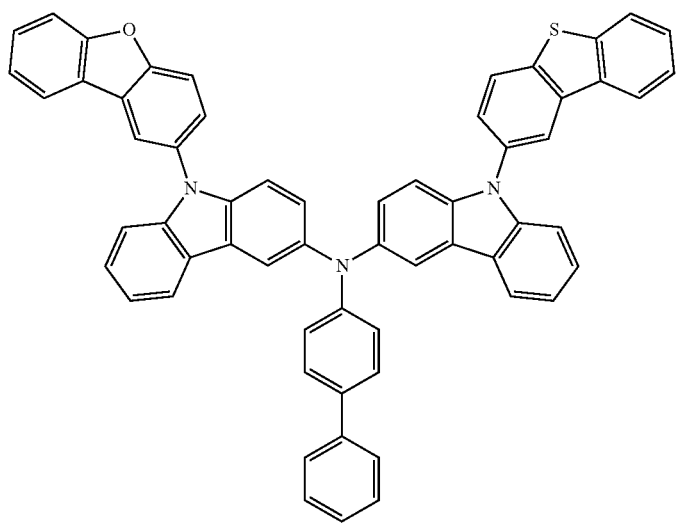
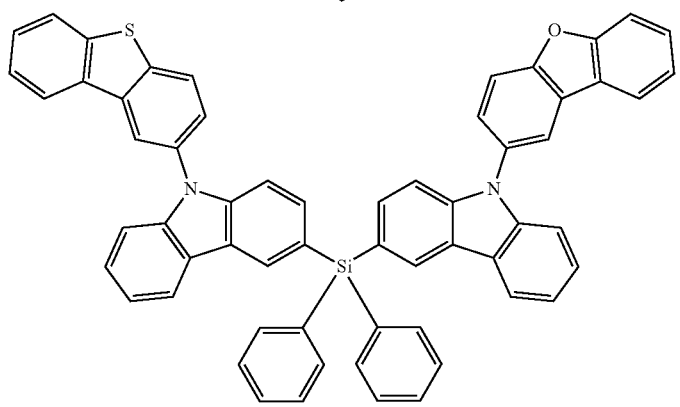
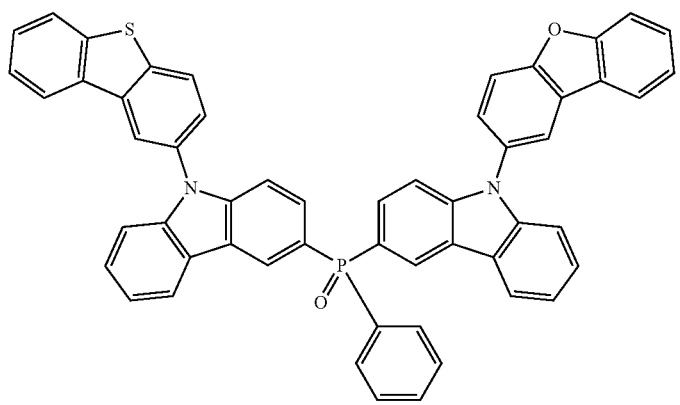

-continued
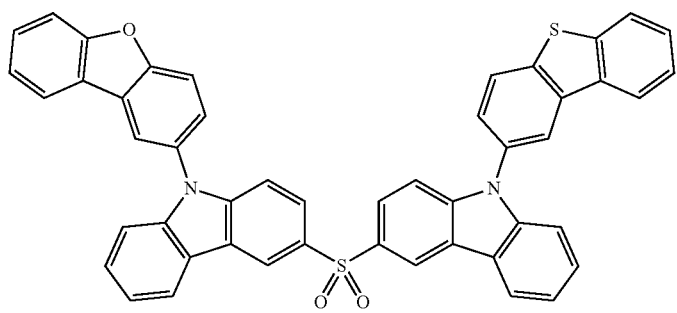
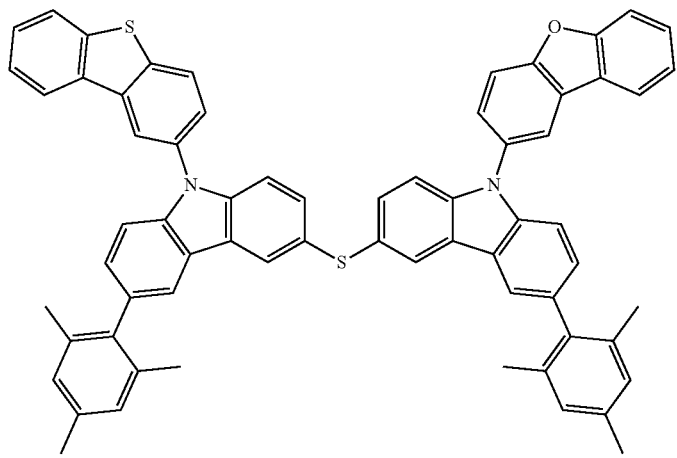
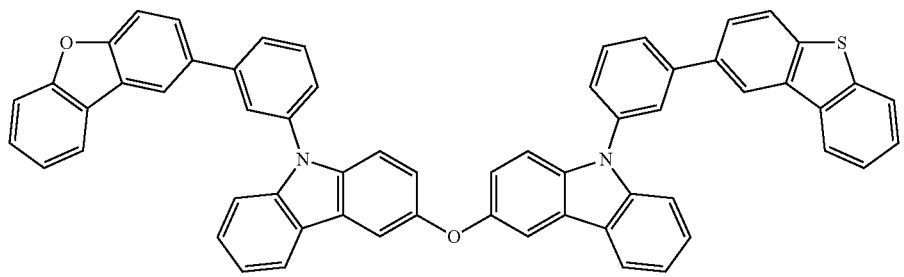
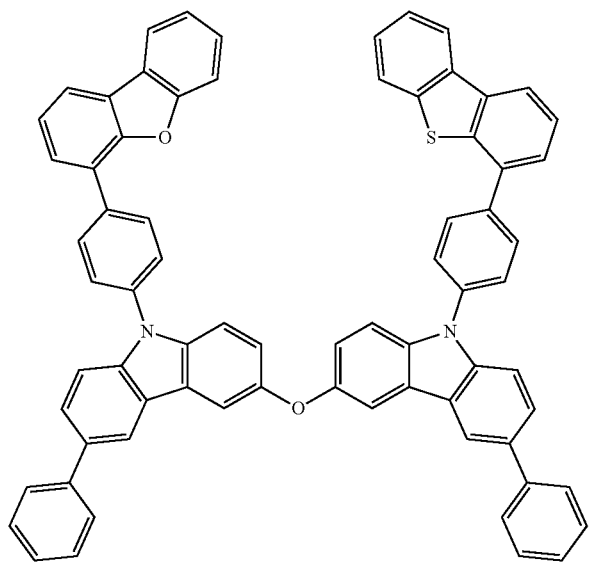

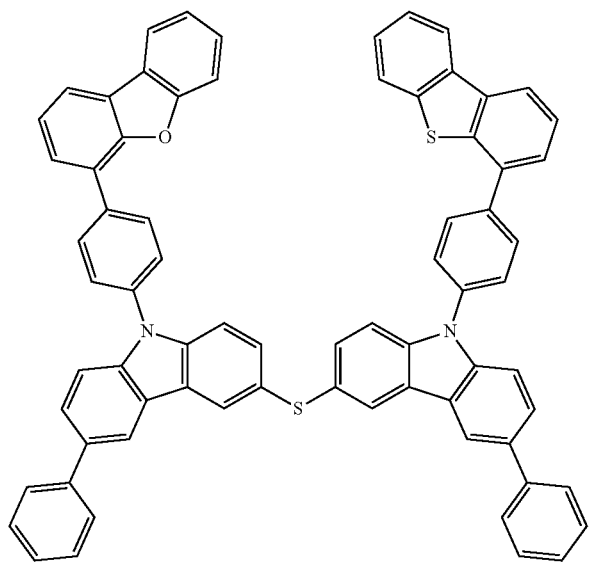
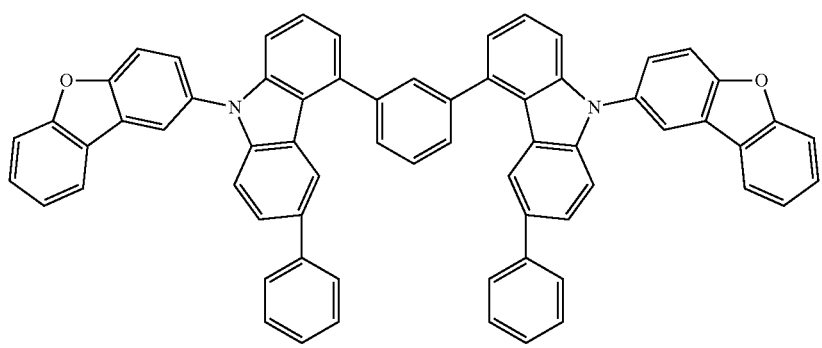
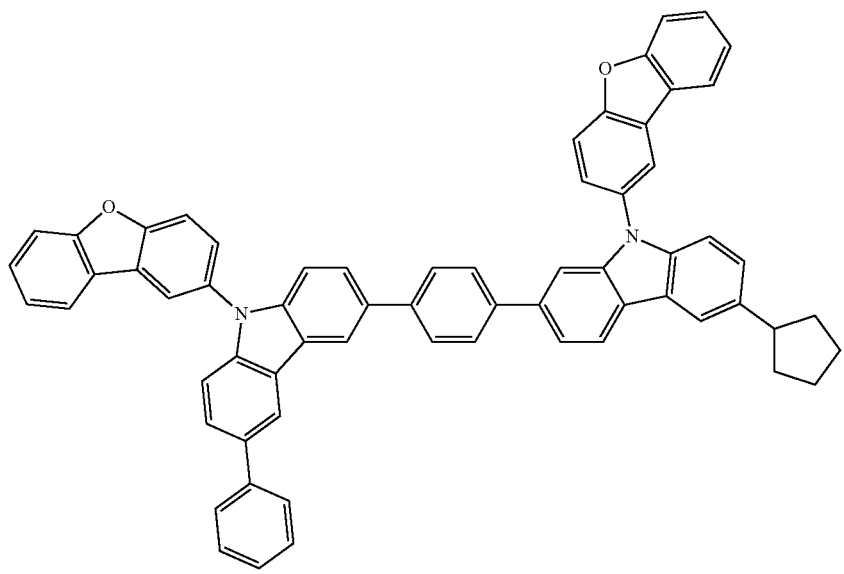

-continued
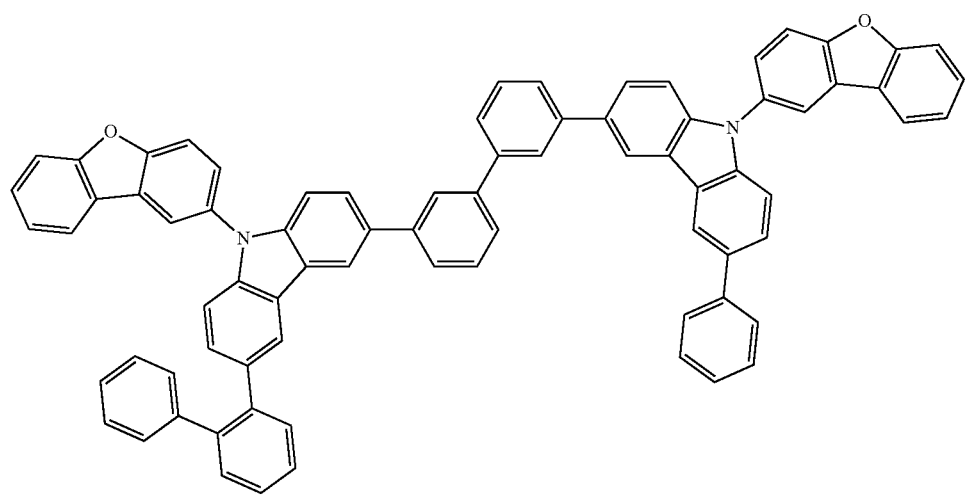
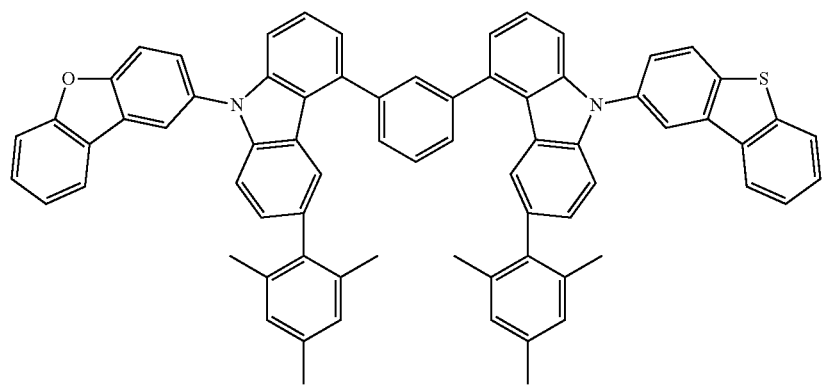
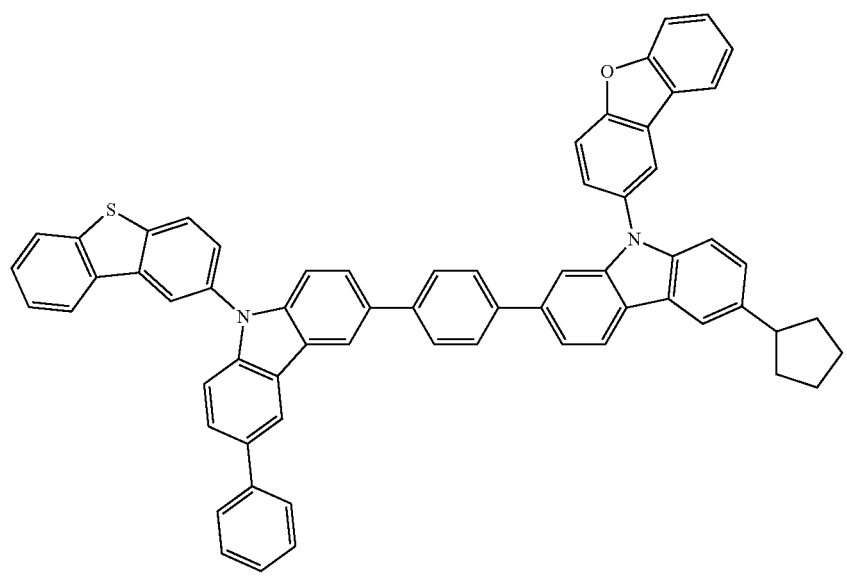

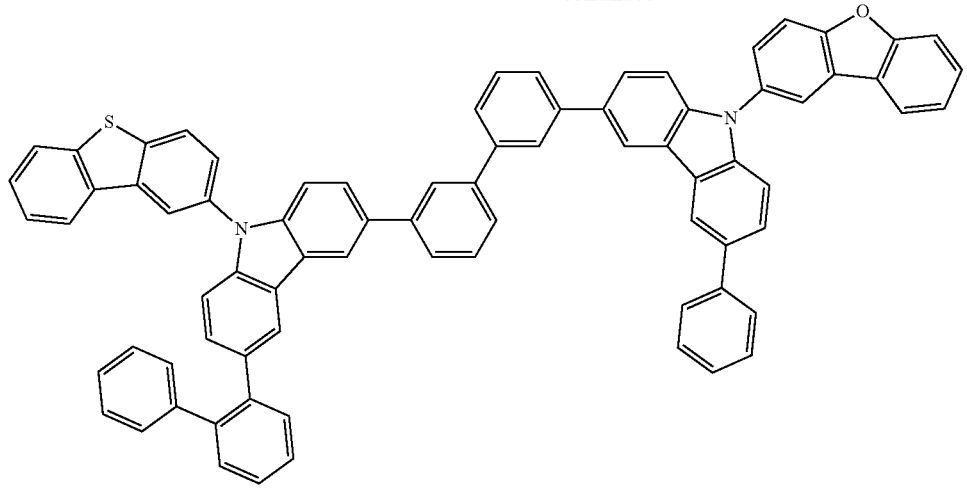 [SMILES: c1ccc(-c2ccc3c(c2)c2cc(-c4cccc(-c5cccc(-c6ccc7c(c6)c6cc(-c8ccccc8-c8ccccc8)ccc6n7-c6ccc7sc8ccccc8c7c6)c5)c4)ccc2n3-c2ccc3oc4ccccc4c3c2)cc1]

(2) First Electrode

As the first electrode, a metal such as Ag, Al or Au or a metal alloy such as APC (Ag—Pd—Cu) is preferable. These metal materials or metal alloys may be stacked. Further, on the upper surface and/or the lower surface of the metal, the metal alloy or the stacked layer of these, a transparent electrode layer such as an indium tin oxide (ITO) or an indium zinc oxide may be formed.

(3) Second Electrode

As the second electrode, a metallic material may be used. In the invention, the metallic material means a material in which the real part of the dielectric constant is a negative value. These materials include not only a metal but also an organic and inorganic transparent electrode material showing metallic luster. In the case where these materials are used in the second electrode, it can be expected easily that surface plasmon is excited.

As the metal, materials such as Ag, Mg, Al, Ca or the like or the alloys thereof are preferable. In order to outcouple in the front direction of the device while constructing a resonator, it is preferred that the transparency in the front direction be 20% or more (semi-transparent). When Ag, Mg, Al, Ca or its alloys are used as the second electrode, it is preferred that the film thickness be 30 nm or less in order to allow light transparency to be fully exhibited.

(4) Organic Layer

The organic layer of the invention has a multilayer structure comprising: anode/first organic layer/emitting layer/second organic layer/cathode. Specifically, a multilayer structure comprising anode/hole-transporting region/emitting layer/electron-transporting region/cathode can be given.

The hole-transporting region can be formed only of a hole-injecting layer and a hole-transporting layer or by stacking a plurality of these layers. The electron-transporting region can be formed only of an electron-injecting layer and an electron-transporting layer or by stacking a plurality of these layers.

Normally, the emitting layer is formed of a host material and a dopant material.

As the host material, a fused aromatic ring derivative is preferable. As the fused aromatic ring derivative, an anthracene derivative, a pyrene derivative or the like are further preferable in respect of luminous efficiency or emission life.

No specific restrictions are imposed on the dopant material as long as it has the function as a dopant. However, in respect of luminous efficiency or the like, an aromatic amine derivative is preferable. As the aromatic amine derivative, a fused aromatic ring derivative having an arylamino group which may be substituted is preferable. As such a compound, pyrene, anthracene and chrysene, which each have an arylamino group, can be given.

As the dopant material, a styrylamine compound is preferable. As the styrylamine compound, styrylamine, styryldiamine, styryltriamine and styryltetramine can be given, for example. Here, styrylamine means a compound in which an arylamine which may be substituted is substituted by at least one arylvinyl group. The arylvinyl group may be substituted. As the substituent, an aryl group, a silyl group, an alkyl group, a cycloalkyl group and an arylamino group can be given. These substituents may further have a substituent.

As the dopant material, a boron complex or a fluoranthene compound is preferable. As the dopant material, a metal complex is preferable. As the metal complex, an iridium complex and a platinum complex can be given, for example.

It is preferred that the peak wavelength of a PL spectrum of the dopant material as an emission material be 430 to 500 nm. A PL spectrum can be obtained by a method in which a dopant material is dispersed in a toluene solvent at a concentration of several μmol/l, and the resulting solution is irradiated with UV light, whereby an emission spectrum distribution from a dopant material can be measured. Alternatively, a sample obtained by vacuum-depositing a dopant material on a glass substrate in a thickness of about several tens nm to 100 nm is used, and the resultant is excited by UV light, whereby an emission spectrum distribution from a dopant material is measured.

When a hole-injecting layer or a hole-transporting layer is provided, the material therefor is not particularly restricted, and a known material used as the material for the hole-injecting layer or the hole-transporting layer of the organic EL device can be used. As the material for the hole-injecting layer or the material for the hole-transporting layer, a compound which has capability of transporting holes, has effects of injecting of holes from the anode layer, excellent effects of injecting holes to the emitting layer or the emitting material, prevents excitons generated in the emitting layer from moving to an electron-injecting layer or an electron-injecting material and has an excellent capability of forming a thin film is preferable. The material for the hole-injecting layer or the hole-transporting layer includes, though not limited thereto, a phthalocyanine derivative; a naphthalocyanine derivative; a porphyrin derivative; oxazole, oxadiazole, triazole, imidazole, imidazolone, imidazole thione, pyrazoline, pyrazolone, tetrahydroimidazole, oxazole, oxadiazole, hydrazone, acylhydrazone, polyarylalkane, stilbene, butadiene, derivatives thereof; amine derivatives such as benzidine-type triphenylamine, styrylamine-type triphenylamine and diamine-type triphenylamine; and a polymer material such as polyvinyl carbazole, polysilane and a conductive polymer.

As specific examples of the electron-transporting layer and the electron-injecting layer, a metal complex of 8-hydroxyquinolline or its derivative, an oxadiazole derivative, and a nitrogen-containing heterocyclic derivative are preferable. As specific examples of the metal complex of 8-hydroxyquinoline or its derivative mentioned above, a metal chelate oxynoid compound containing a chelate of oxine (generally, 8-quinolinol or 8-hydroxyquinoline), for example, tris(8-quinolinol)aluminum, can be used.

In the electron-injecting layer, an alkali metal compound or a material obtained by adding a donor represented by an alkali metal or the like to a material forming an electron-transporting layer can be used.

As the donor, at least one selected from a donor metal, a donor metal compound and a donor metal complex can be selected.

As the alkali metal compound, a halide or an oxide of an alkali metal can preferably be given. A fluoride of an alkali metal is further preferable. For example, LiF is preferably used.

The donor metal is a metal having a work function of 3.8 eV or less, preferably an alkali metal, an alkaline earth metal and a rare earth metal, more preferably Cs, Li, Na, Sr, K, Mg, Ca, Ba, Yb, Eu and Ce.

The donor metal is a compound containing the above mentioned donor metals. The donor metal compound is preferably a compound containing an alkali metal, an alkaline earth metal or a rare earth metal. More preferably, the donor metal compound d is a halide, an oxide, a carbonate and a borate of these metals. For example, it is a compound represented by $MO_x$ (M is a donar metal, and x is 0.5 to 1.5), $MF_x$ (x is 1 to 3), or $M(CO_3)_x$ (x is 0.5 to 1.5).

The donor metal complex is a complex of the above-mentioned donor metal, and is preferably an organic metal complex of an alkali metal, an alkaline earth metal or a rare earth metal.

Normally, in order to improve luminous efficiency, the length of a resonator is adjusted by the film thickness of the organic layer including the emitting layer.

The length of the resonator is defined by the second electrode 2, the organic layer comprising the emitting layer and the first electrode 1 in the case of the top-emitting organic EL device shown in FIG. 1. The length of the resonator is adjusted, in the case of a blue-emitting layer, such that the peak wavelength of which the emission intensity is the maximum appears at 430 nm or more and 480 nm or less in the device configuration having no capping layer.

Hereinbelow, the method for fabricating the device will be explained.

First, on the glass substrate which is served as a substrate for the fabrication of a device, a lower electrode is formed by a sputtering method or the like. Thereafter, by using a vacuum vapor deposition method or the like, an organic layer comprising an emitting layer is formed. Subsequently, LiF is deposited as the electron-injecting layer, and an upper electrode is formed by vacuum vapor deposition or the like, whereby a semi-transparent upper electrode is formed. Then, a capping layer is formed by vacuum vapor deposition or the like on the upper electrode, whereby an organic EL device is fabricated.

The embodiment mentioned above relates to an organic EL device that emits blue color. The invention is not restricted to a blue-emitting organic EL device. An organic EL device may be fabricated by combining devices emitting different colors.

Figure 2:
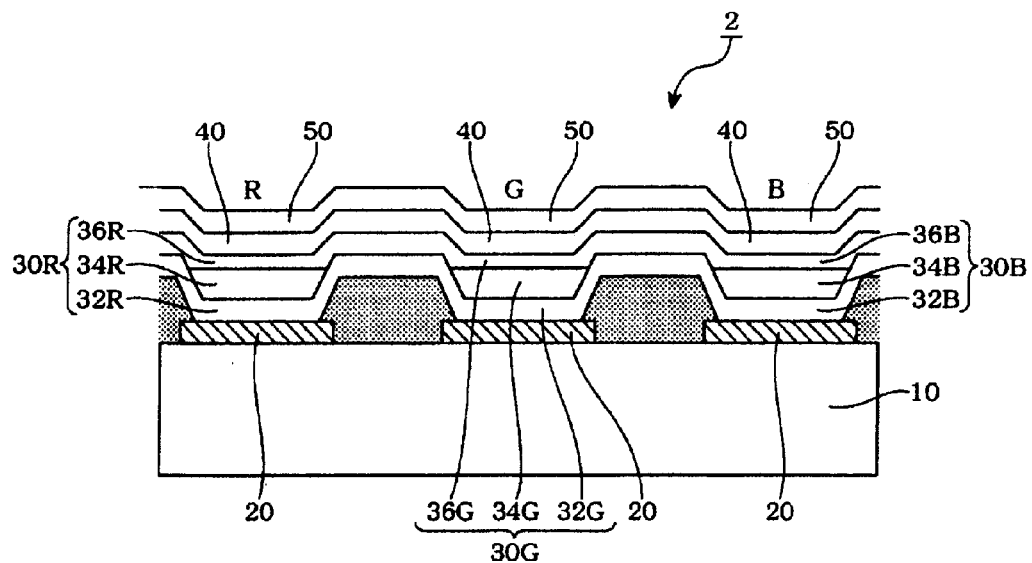
FIG. 2 is a view showing another embodiment of the organic EL device of the invention.

FIG. 2 shows a schematic view of another embodiment of the organic EL device of the invention. In FIG. 2, the same referential number is added to the same material as that shown in FIG. 1, and an explanation is omitted. In the top-emitting organic EL device 2 in this figure, on a common electrode 10, a blue pixel B, a green pixel G and a red pixel R are formed in parallel.

The blue pixel B has the same configuration as that of the organic EL device 1 shown in FIG. 1.

The green pixel G comprises, on the substrate 10, a first electrode 20, a an organic layer 30G comprising a first organic layer 32G, a green-emitting layer 34G and a second organic layer 36G, a second electrode 40 and a capping layer 50 in this sequence.

The red pixel R comprises, on the substrate 10, a first electrode 20, an organic layer 30R comprising a first organic layer 32R, a red-emitting layer 34R and a second organic layer 36R, a second electrode 40 and a capping layer 50 in this sequence.

The capping layer 50 is common for the blue pixel B, the green pixel G and the red pixel R, and light is outcoupled from this capping layer 50.

It is preferred that the material for the capping layer used in the organic EL device of this embodiment have no absorption in the visible light range of 430 nm to 780 nm in order to take out light efficiently from all pixels, i.e. the blue pixel B, the green pixel G and the red pixel R.

The configuration of the organic layers 30B, G and R is not remitted to that shown in the figure, and can be changed appropriately. The first electrode, the first organic layer, the second organic layer and the second electrode for the blue pixel B, the green pixel G and the red pixel R may be common or different. Normally, the first organic layer and the second organic layer have a configuration suited to the emission color.

It is preferred that the green emitting layer be formed of the following host material and the dopant material. As the host material, a fused aromatic ring derivative is preferable. As the fused aromatic ring derivative, an anthracene derivative, a pyrene derivative or the like are further preferable in respect of luminous efficiency or emission life.

As the host material, a hetero ring-containing compound can be given. As the hetero ring-containing compound, a carbazole derivative, a dibenzofuran derivative, a ladder-type furan compound and a pyrimidine derivative can be given.

No specific restrictions are imposed on the dopant material as long as it has a function as a dopant. However, in respect of luminous efficiency or the like, an aromatic amine derivative is preferable. As the aromatic amine derivative, a fused aromatic ring derivative having an arylamino group that may be substituted is preferable. Examples of the compound include pyrene, anthracene and chrysene, each having an arylamino group.

As the dopant material, a styrylamine compound is also preferable. As the styrylamine compound, styrylamine, styryldiamine, styryltriamine and styryltetramine can be given, for example. Here, styrylamine means a compound in which an arylamine, that may be substituted, is substituted by at least one arylamino group. The arylvinyl group may be substituted, and as the substituent, an aryl group, a silyl group, an alkyl group, a cycloalkyl group and an arylvinyl group can be given. These substituents may further have a substituent.

As the dopant material, a boron complex or a fluoranthene compound is preferable. As the dopant material, a metal complex is also preferable. As a metal complex, an iridium complex and a platinum complex can be given, for example.

It is preferred that the red emitting layer be formed of the following host material and the dopant material. As the host material, a fused aromatic ring derivative is preferable. As the fused aromatic ring derivative, a naphthacene derivative, a pentacene derivative or the like is further preferable in respect of luminous efficiency or emission life.

As the host material, a fused polycyclic aromatic compound can be given. As the fused polycyclic aromatic compound, a naphthalene compound, a phenanthrene compound and a fluoranthene compound can be given.

As the dopant material, an aromatic amine derivative is preferable. As the aromatic amine derivative, a fused aromatic ring derivative having an arylamino group which may be substituted is preferable. As such compounds, periflanthene having an arylamino group can be given.

As the dopant material, a metal complex is also preferable. As the metal complex, an iridium complex and a platinum complex can be given, for example.

The method for producing the device of this embodiment will be explained hereinbelow in detail.

On the substrate, an APC (Ag—Pd—Cu) layer as a silver alloy layer (reflective layer) and a transparent conductive layer such as an indium zinc oxide film (IZO) and a tin oxide film are formed in this sequence. Subsequently, by a common lithography technique, by etching in which a resist pattern is used as a mask, this conductive material layer is patterned to form a lower electrode (anode). Subsequently, on the lower electrode, by a spin-coating method, an insulating film formed of a photosensitive resin such as polyimide is formed. Thereafter, exposure, development and hardening are conducted to allow the lower electrode to be exposed, whereby a blue emission range, a green emission range and a red emission range are patterned.

There are three types of electrodes, i.e. an electrode for a red pixel, an electrode for a green pixel and an electrode for a blue pixel. They respectively correspond to the blue emission range, the green emission range and the red emission range, and they respectively correspond to the lower electrode. Thereafter, the hole-injecting layer is stacked on the entire surface of the substrate. Further, a hole-transporting layer is stacked thereon. Emitting layers are arranged such that they are arranged in correspondence with each point of the anode for the red pixel, the anode for the green pixel and the anode for the blue pixel. If the vacuum vapor deposition method is used, the blue emitting layer, the green emitting layer and the red emitting layer are finely patterned by means of a shadow mask.

Then, an electron-transporting layer is stacked on the entire surface. Subsequently, an electron-injecting layer is stacked on the entire surface. Then, Mg and Ag are formed by deposition, whereby an upper electrode (cathode) formed of a semitransparent Mg—Ag alloy. Subsequently, a capping layer is stacked entirely on the upper electrode, whereby an organic EL device is fabricated.

Due to the presence of the common capping layer, it becomes possible that the blue pixel has a low CIEy and has an excellent efficiency. Further, by adjusting the optical film thickness according to the emission of each color, the luminous efficiency of the green pixel and that of the red pixel can be simultaneously improved.

In addition, the common capping layer for the blue pixel, the green pixel and the red pixel can be formed by a single process.

EXAMPLES

The invention will be described in more detail with reference to the following examples, which should not be construed as limiting the scope of the invention.

The structural formulas of the compounds (1-1) to (1-3) used for the capping layer in the Examples are shown below. The structures of intermediates used for the synthesis of these compounds are given below.

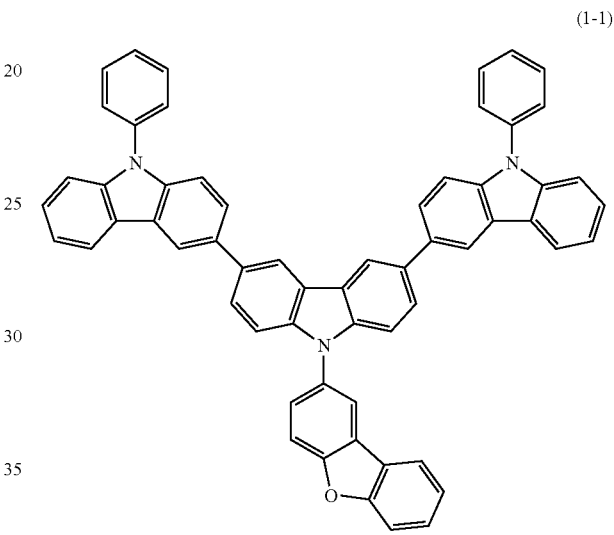

(1-1)

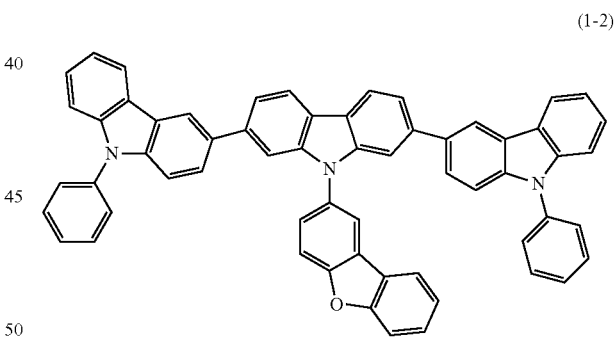

(1-2)

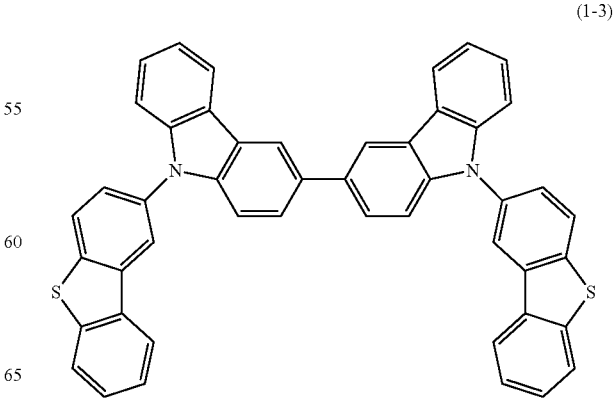

(1-3)

105
-continued

Intermediate 1

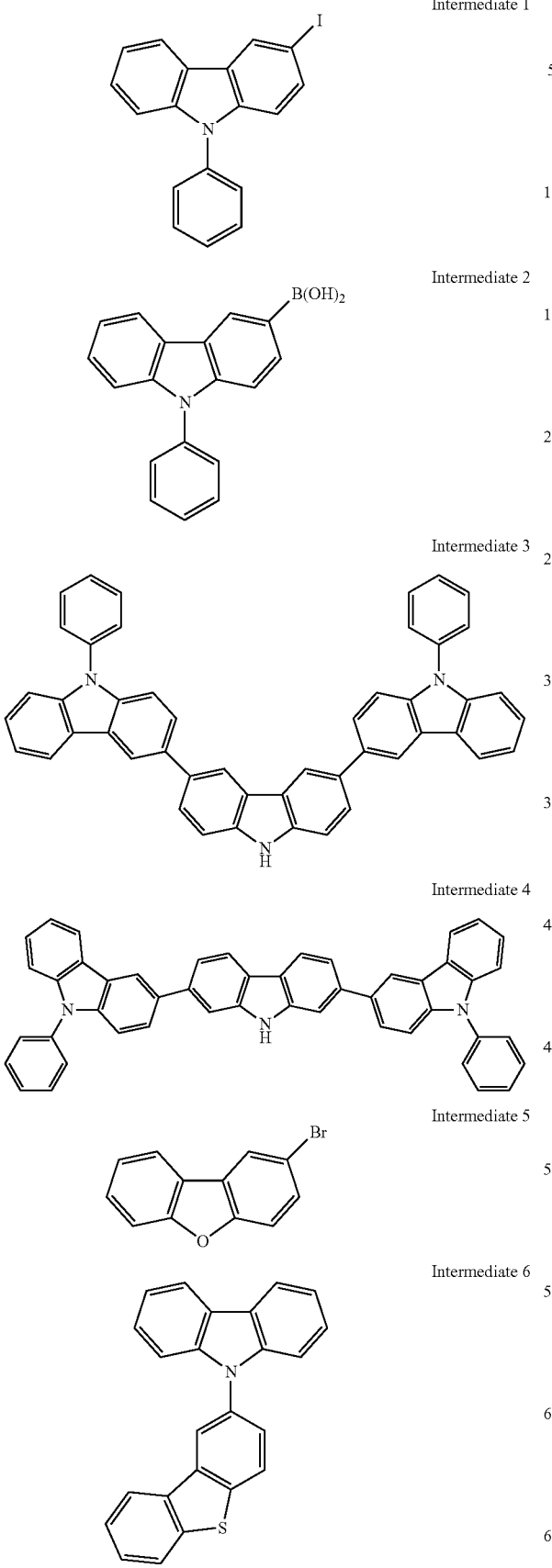

Intermediate 2

Intermediate 3

Intermediate 4

Intermediate 5

Intermediate 6

106
-continued

Intermediate 7

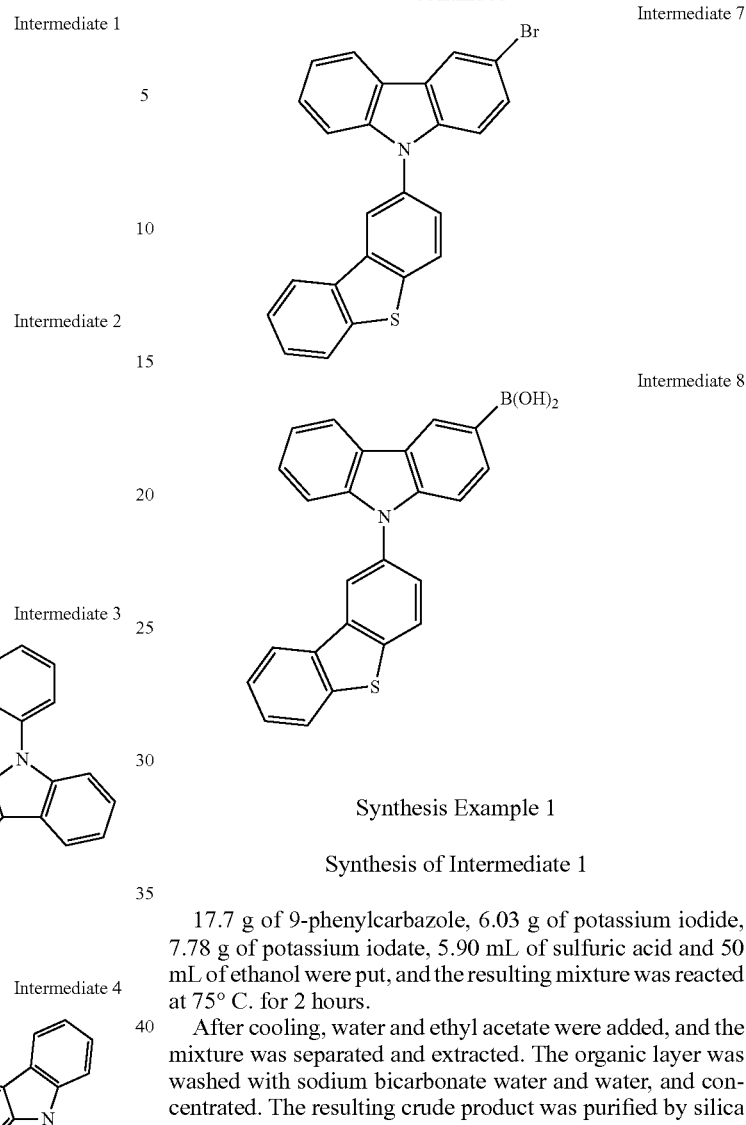

Intermediate 8

Synthesis Example 1

Synthesis of Intermediate 1

17.7 g of 9-phenylcarbazole, 6.03 g of potassium iodide, 7.78 g of potassium iodate, 5.90 mL of sulfuric acid and 50 mL of ethanol were put, and the resulting mixture was reacted at 75° C. for 2 hours.

After cooling, water and ethyl acetate were added, and the mixture was separated and extracted. The organic layer was washed with sodium bicarbonate water and water, and concentrated. The resulting crude product was purified by silica gel chromatography (toluene), and resulting solids were dried under reduced pressure, whereby 21.8 g of white solids were obtained. By the FD-MS analysis, the solids were identified as the intermediate 1.

Synthesis Example 2

Synthesis of Intermediate 2

Under the stream of argon, dehydrated toluene and dehydrated ether were added to 13.1 g of intermediate 1. The resultant was cooled to −45° C. Then, 25 mL of an n-butyl-lithium hexane solution (1.58M) was added dropwise, and the resulting mixture was heated to −5° C. for 1 hour with stirring. Again, the mixture was cooled to −45° C., and 25 mL of boronic acid triisopropyl ester was gradually added dropwise, and the mixture was allowed to react for 2 hours.

After heating to room temperature, a 10% dilute hydrochloric acid solution was added to the mixture, followed by stirring, whereby an organic layer was extracted. After washing with saturated saline, the organic layer was dried with anhydrous magnesium sulfate, filtrated, and then concentrated. The resulting solids were purified by silica gel chromatography (toluene). The resulting solids were washed with n-hexane, and then dried under reduced pressure, whereby 7.10 g of solids were obtained. By the FD-MS analysis, the solids were identified as the intermediate 2.

Synthesis Example 3

Synthesis of Intermediate 3

Under the atmosphere of argon, 100 mL of toluene, 100 mL of 1,2-dimethoxyethane and 50 ml of a 2M aqueous sodium carbonate solution were added to 32.5 g of 3,6-dibromocarbazole, 63.2 g of intermediate 2, 0.92 g of tetrakis(triphenylphosphine)palladium (0). The resulting mixture was heated with reflux for 10 hours.

After completion of the reaction, the mixture was immediately filtered, and then the aqueous phase was removed. After drying with sodium sulfate, the organic phase was concentrated. The residue was purified by silica gel chromatography, whereby 45.5 g of white crystals were obtained. By the FD-MS analysis, the crystals were identified as the intermediate 3.

Synthesis Example 4

Synthesis of Intermediate 4

A reaction was conducted in the same manner as in Synthesis Example 1, except that 2,7-dibromocarbazole was used instead of 3,6-dibromocarbazole. As a result, 40.2 g of white solids were obtained. By the FD-MS analysis, the solids were identified as the intermediate 4.

Synthesis Example 5

Synthesis of Intermediate 5

150 g (892 mmol) of dibenzofuran and 1 L of acetic acid were placed in a flask. After replacing with nitrogen, the mixture was dissolved by heating. The reaction solution was cooled with water. 188 g of bromine was gradually added dropwise, and then, the mixture was stirred for 20 hours while cooling in the air. The precipitated crystals were filtered out, washed with acetic acid and water in sequence, and then dried under reduced pressure. The resulting crystals were purified by evaporation under reduced pressure, and re-crystallization was repeated several times with methanol, whereby 66.8 g of white crystals were obtained. By the FD-MS analysis, the solids were identified as the intermediate 5.

Synthesis Example 6

Synthesis of Intermediate 6

Under the atmosphere of nitrogen, 40.1 g (240 mmol) of carbazole, 52.6 g (200 mmol) of 2-bromodibenthiophene, 3.81 g (20 mmol) of copper iodide, 84.91 g (400 mol) of potassium phosphate, 7.21 mL (60 mmol) of trans-1,2-diaminocyclohexane and 100 mL of 1,4-dioxane were put in a three-neck flask, and the resultant mixture was refluxed for 24 hours. After completion of the reaction, the mixture was cooled to room temperature, and then diluted with 400 mL of toluene. An inorganic salt or the like was filtered out by suction filtration, and a filtrate was concentrated by passing through a short column of silica gel. The filtrate thus concentrated was washed with a mixed solvent of ethyl acetate/ methanol to obtain 50.4 g of white solids. By the FD-MS analysis, the solids were identified as the intermediate 6.

Synthesis Example 7

Synthesis of Intermediate 7

28.0 g (80 mmol) of the intermediate 6 and 160 mL of N,N-dimethylformamide were put in an eggplant flask to allow them to be dissolved. The resultant was cooled to 0° C. with ice water. Then, 14.2 g (80 mmol) of N-bromosuccinimide which had been dissolved in 80 mL of N,N-dimethylformamide was added dropwise for 10 minutes. After stirring at 0° C. for 3 hours, the resultant was allowed to stand for one day at room temperature. After completion of the reaction, 200 mL of toluene was added, and the resultant was washed twice with water by means of a separating funnel. After drying with anhydrous magnesium sulfate, the resultant was filtered and concentrated. The resultant was re-crystallized from hexane, whereby 26.7 g of white crystals were obtained. By the FD-MS analysis, the crystals were identified as the intermediate 7.

Synthesis Example 8

Synthesis of Intermediate 8

Under the atmosphere of nitrogen, 17.1 g (40 mmol) of the intermediate 7 and 200 mL of dehydrated tetrahydrofuran were put in a three-neck flask to allow them to be dissolved, and cooled to −78° C. To the resulting mixture solution, 30.6 mL (1.57M, 48 mmol) of an n-butyllithium hexane solution was added dropwise over 10 minutes. After stirring at −78° C. for 20 minutes, 18.3 mL (80 mmol) of triisopropyl borate was added all at once, and the resultant was stirred for 3 hours at room temperature. After completion of the reaction, the solution was concentrated to about half. Then, 20 mL of an aqueous hydrochloric acid solution (1N) was added, and the resultant was stirred at room temperature for 2 hours. The resultant was extracted with dichloromethane by means of a separating funnel, dried with anhydrous magnesium sulfate, filtered and concentrated. After purifying by means of silica gel chromatography (eluent:dichloromethane:ethyl acetate=9:1), hexane was added thereto to allow samples to be precipitated. Then, dispersion washing and filtration were conducted, whereby 10.7 g of white crystals were obtained.

Synthesis Example 9

Production of Compound (1-1))

Under the stream of argon, 6.5 g of the intermediate 3, 2.5 g of the intermediate 5, 1.3 g of sodium t-butoxide, 46 mg of tris(dibenzylidene acetone)dipalladium, 29 mg of tri-tert-butylphosphonium tetrafluoroborate and 50 mL of dehydrated toluene were placed in a three-neck flask. The resultant was allowed to react at 80° C. for 8 hours.

After cooling, 500 mL of water was added, and the mixture was subjected to celite filtration, and a filtrate was extracted with toluene and dried with anhydrous magnesium sulfate. The resultant was concentrated under reduced pressure, the resulting crude product was subjected to column purification and was re-crystallized from toluene. The re-crystallized product was filtered out and dried, whereby 5.6 g of white powder was obtained. By the FD-MS analysis, the white powder was identified as the nitrogen-containing aromatic heterocyclic derivative (1-1).

Synthesis Example 10

Production of Compound (1-2))

A reaction was conducted in the same manner as in Synthesis Example 1, except that 6.5 g of the intermediate 4 was used instead of the intermediate 3, whereby 5.1 g of white powder was obtained. By the FD-MS analysis, the white powder was identified as the nitrogen-containing aromatic heterocyclic derivative (1-2).

Synthetic Example 11

Production of Compound (1-3))

Under the atmosphere of nitrogen, 9.47 g (22.1 mmol) of the intermediate 7, 10.4 g (26.5 mmol) of the intermediate 8, 22.1 mL of a 2M aqueous solution of sodium carbonate, 40 mL of 1,2-dimethoxyethane and 40 mL of toluene were put in a three-neck flask. To this mixture solution, 0.51 g (0.442 mmol) of tetrakis(triphenylphosphine)palladium was added, and the resultant mixture was refluxed for 8 hours.

After completion of the reaction, the resultant was colled to the room temperature. Then, methanol was added, and the precipitated sample was collected and subjected to vacuum drying. The sample was dissolved in 1L of toluene by heating. After cooling to the room temperature, the sample was concentrated by passing through the short column of silica gel. The thus concentrated sample was subjected to dispersion washing with ethyl acetate, whereby 12.0 g of white crystals were obtained. By the FD-MS analysis, the white powder was identified as the nitrogen-containing aromatic heterocyclic derivative (1-3).

Example 1

First, on a glass substrate which serves as a substrate for fabricating a device, an indium zinc oxide (IZO) film (film thickness: 10 nm), an APC (Ag—Pd—Cu) layer which is a silver alloy layer (reflection layer) (film thickness: 100 nm) and an indium zinc oxide (IZO) film (film thickness: 10 nm) were formed in this sequence by sputtering. Subsequently, by using a normal lithographic technology, this conductive material layer was patterned by etching using a resist pattern as a mask, whereby a lower electrode (anode) was formed. The substrate on which the lower electrode was formed was subjected to ultrasonic cleaning for 5 minutes in isopropyl alcohol, and then to UV ozone cleaning for 30 minutes. Thereafter, by using a vacuum deposition method, as a hole-injecting layer, HI was deposited on the lower electrode in a film thickness of 105 nm. Subsequently, as a hole-transporting layer, HT1 was deposited in a film thickness of 20 nm. Further, subsequent to the formation of the HT1 film, BH and BD were deposited at a weight ratio of 95:5 in a film thickness of 20 nm, whereby a blue-emitting layer was obtained. Then, on this film, as an electron-transporting layer, ET1 was formed in a film thickness of 5 nm. Subsequently, on this film, as an electron-transporting layer, ET2 was formed in a film thickness of 25 nm. Then, as an electron-injecting layer, LiF was deposited to form a LiF film of 1 nm. On this LiF film, Mg and Ag were deposited in a film thickness of 10 nm at a film thickness ratio of 9:1, whereby a semi-transparent upper electrode (cathode) formed of an Mg—Ag alloy was formed. Next, on the upper electrode, a capping layer formed of the compound represented by the above formula (1-1) was formed on the entire surface, whereby an organic EL device was fabricated. The thickness of the capping layer was 60 nm.

The materials used in the Examples are shown below.

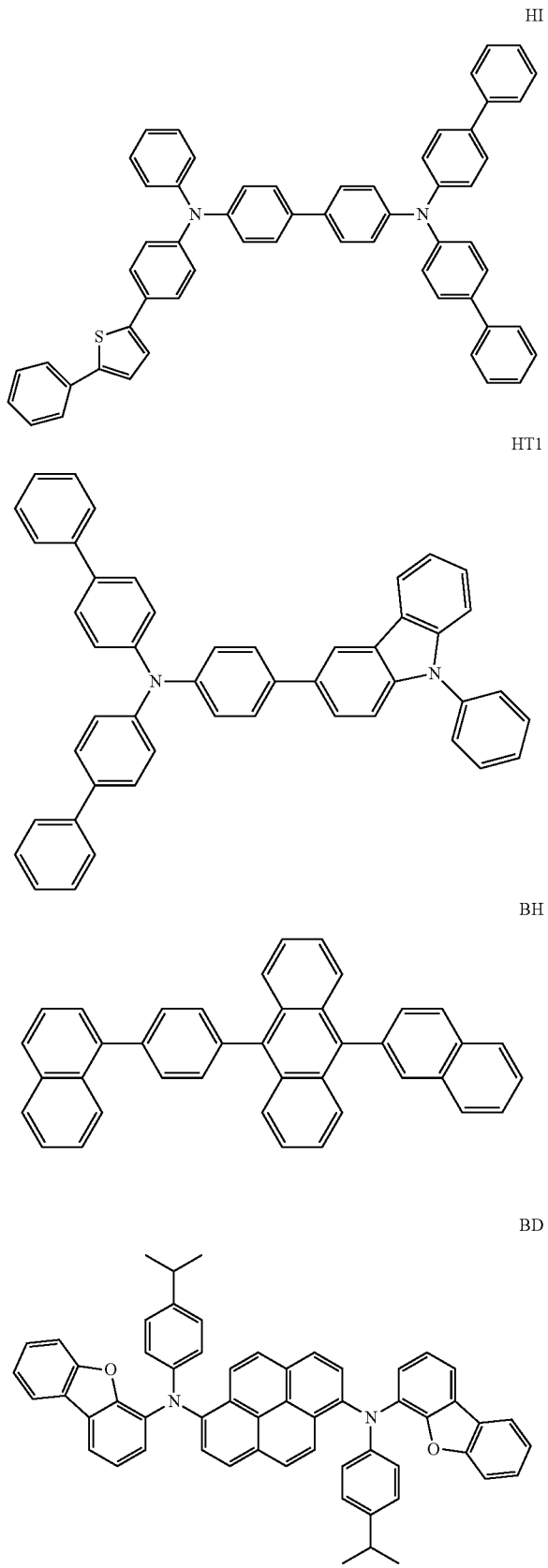

-continued

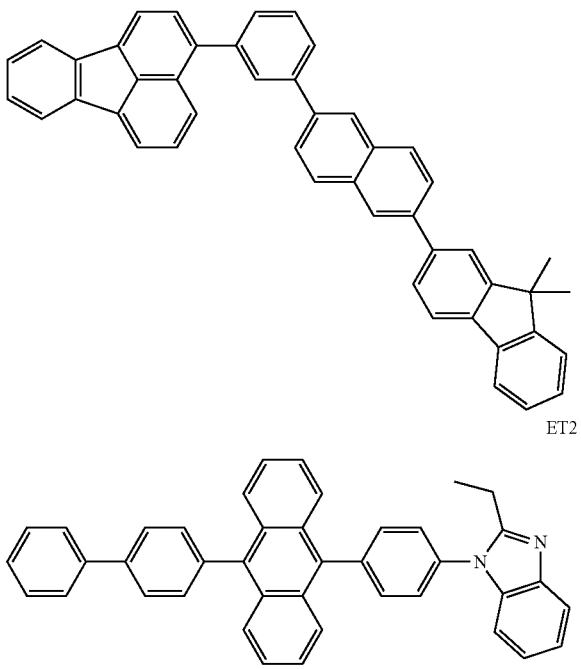

ET1

ET2

To the thus fabricated device, current was applied such that the current density became 10 mA/cm². The current-voltage-luminance characteristics of EL mission emitted in the normal direction relative to the device surface were measured by means of a spectroradiometer (CS-1000, manufactured by Konica Minolta Inc.), whereby emission spectrum and CIE chromaticity were obtained.

The emission peak wavelength, the optical peak intensity, the CIE 1931 (chromaticity coordinate) and the luminous efficiency (η) of the device obtained are shown in Table 1.

TABLE 1

| | Material for capping layer | Film thickness of capping layer (nm) | Peak wavelength (nm) | Peak intensity | CIEx | CIEy | η (%) |
|---|---|---|---|---|---|---|---|
| Example 1 | (1-1) | 60 | 462 | 0.44 | 0.132 | 0.067 | 14.3 |
| Example 2 | (1-2) | 60 | 462 | 0.42 | 0.132 | 0.068 | 14.0 |
| Example 3 | (1-3) | 60 | 461 | 0.34 | 0.134 | 0.065 | 12.5 |
| Com. Ex. 1 | — | 0 | 470 | 0.16 | 0.109 | 0.178 | 9.9 |
| Com. Ex. 2 | Alq3 | 60 | 463 | 0.32 | 0.130 | 0.078 | 12.2 |

Comparative Example 1

An organic EL device was fabricated and evaluated in the same manner as in Example 1, except that the capping layer was not formed. The results are shown in Table 1.

Comparative Example 2

An organic EL device was fabricated and evaluated in the same manner as in Example 1, except that tris(8-quinolinol) aluminum (Alq3) was used in the capping layer. The results are shown in Table 1.

From the results of Example 1 and Comparative Example 2, it can be confirmed that not only the CIEy value can be lowered but also luminous efficiency can be improved by the device of the invention.

Example 2

An organic EL device was fabricated and evaluated in the same manner as in Example 1, except that a compound represented by the formula (1-2) was used in the capping layer. The results are shown in Table 1.

Example 3

An organic EL device was fabricated and evaluated in the same manner as in Example 1, except that a compound represented by the formula (1-3) was used in the capping layer. The results are shown in Table 1.

From the results shown in Table 1, it can be understood that, when the capping layer materials of Examples 1 to 3 were used, the CIEy value was smaller than 0.07, indicating high blue color purity and high luminous efficiency. Therefore, it can be confirmed that by using the capping layer materials of Examples 1 to 3, it is possible to obtain highly efficient blue emission.

On the other hand, in Comparative Example 2 (Alq3), the CIEy value was larger than that in the Examples, while luminous efficiency was equivalent to that in the Examples. Therefore, the emitting device of Comparative Example 2 could not attain highly efficient blue emission.

In general, in an optical designing of a RGB emitting device, the design of a blue emitting device is most difficult as compared with a red emitting device or a green emitting device. In the Examples of the present application, since good blue emitting devices were obtained, they can be used not only as a blue emitting device but also as the common capping layer of RGB.

INDUSTRIAL APPLICABILITY

The organic EL device of the invention can be used as a planar emitting body such as a flat panel display of a wall-mounted TV, a copier, a printer, a backlight of a liquid crystal display, a light source of an instrument, a notice board, a beacon light or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A top-emitting organic electroluminescence device comprising sequentially a first electrode, one or more organic layers comprising an emitting layer, a second electrode and a capping layer, wherein the capping layer comprises a compound represented by the following formula (1);

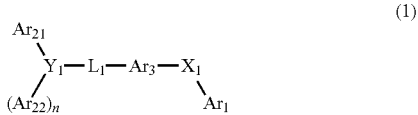

(1)

wherein $X_1$ is an S atom or an O atom and $Y_1$ is an atom selected from S, N and O;

when $Y_1$ is S or O, n is 0, and when $Y_1$ is N, n is 1;

$Ar_1$, $Ar_3$, $Ar_{21}$ and $Ar_{22}$ are independently a substituted or unsubstituted aromatic ring group having 6 to 30 ring carbon atoms or a substituted or unsubstituted aromatic heterocyclic group having 5 to 20 ring atoms;

$L_1$ is a single bond or a substituted or unsubstituted aromatic ring group having 6 to 30 ring carbon atoms;

$Ar_3$ and $Ar_1$ may be bonded with each other by a single bond or a double bond to form a substituted or unsubstituted ring;

when n is 0 and $L_1$ is a substituted or unsubstituted aromatic ring group having 6 to 30 ring carbon atoms, $L_1$ and $Ar_{21}$ may be bonded with each other by a single bond or a double bond to form a substituted or unsubstituted ring; and when n is 1 and $L_1$ is a substituted or unsubstituted aromatic ring group having 6 to 30 ring carbon atoms, $L_1$ and $Ar_{21}$, $Ar_{21}$ and $Ar_{22}$ and $L_1$ and $Ar_{22}$ may be bonded with each other by a single hood or a double hood to form a substituted or unsubstituted ring.

2. The organic electroluminescence device according to claim 1, wherein $Ar_1$ and $Ar_3$ are bonded by a single bond or a double bond.

3. The organic electroluminescence device according to claim 1, wherein the compound represented by the above formula (1) is a compound represented by the following formula (2);

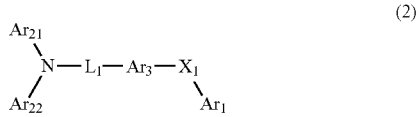

(2)

wherein $L_1$, $Ar_3$, $X_1$ and $Ar_1$ are as defined in claim 1;

$Ar_{21}$ and $Ar_{22}$ are independently a substituted or unsubstituted aromatic ring group having 6 to 30 ring carbon atoms or a substituted or unsubstituted aromatic heterocyclic group having 5 to 20 ring atoms; and at least one pair of $Ar_{21}$ and $Ar_{22}$ and $Ar_1$ and $Ar_3$ is bonded with each other by a single bond.

4. The organic electroluminescence device according to claim 1, wherein the compound represented by the formula (1) is a compound represented by the following formula (3A);

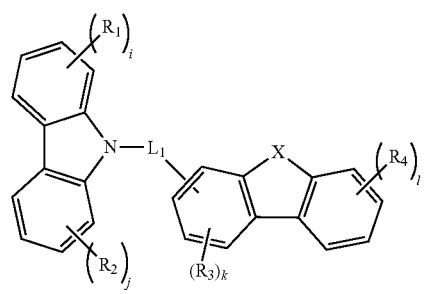

(3A)

wherein X is an S atom or an O atom;

$R_1$ to $R_4$ are independently a substituted or unsubstituted aromatic ring group having 6 to 30 ring carbon atoms or a substituted or unsubstituted aromatic heterocyclic group having 5 to 20 ring atoms;

i, j and l are independently an integer of 0 to 4 and k is an integer of 0 to 3, and when i, j, k or l are independently 2 or more, each group may be the same or different; and $L_1$ is a single bond or a substituted or unsubstituted aromatic ring group having 6 to 30 ring carbon atoms.

5. The organic electroluminescence device according to claim 4, wherein at least one of $R_1$ and/or at least one of $R_2$ is a substituted or unsubstituted carbazole group or a ring comprising a carbazole ring as a partial structure.

6. The organic electroluminescence device according to claim 1, wherein the compound represented by the above formula (1) is a compound represented by the following compound (4):

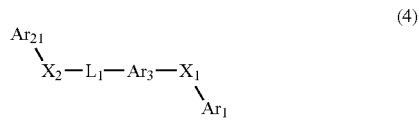

(4)

wherein $L_1$, $Ar_3$, $X_1$ and $Ar_1$ are as defined in claim 1;

$X_2$ is an S atom or an O atom;

$Ar_{21}$ is a substituted or unsubstituted aromatic ring group having 6 to 30 ring carbon atoms or a substituted or unsubstituted aromatic heterocyclic group having 5 to 20 ring atoms; and at least, one pair of $Ar_{21}$ and $L_1$ and $Ar_1$ and $Ar_3$ are bonded with each other by a single bond.

7. A top-emitting organic electroluminescence device comprising sequentially a first electrode, one or more organic layers comprising an emitting layer, a second electrode and a capping layer;

the capping layer comprising a compound represented by the following formula (11),

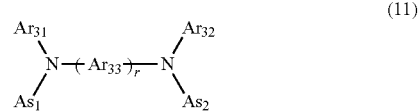

(11)

wherein $Ar_{31}$ and $Ar_{32}$ are independently a substituted or unsubstituted aromatic ring group having 6 to 30 carbon atoms or a substituted or unsubstituted aromatic heterocyclic group having 5 to 20 ring atoms; $Ar_{33}$ is a bonding group; $As_1$ is a group represented by the following formula (11a); and $As_2$ is a group represented by the following formula (11b);

r is an integer of 1 to 3; at least one of $Ar^{33}$ is a substituted or unsubstituted aromatic group having 6 to 30 carbon atoms or a substituted or unsubstituted aromatic heterocyclic group having 5 to 20 ring atoms, and when r is 2 or more, $Ar_{33}$ may be the same or different; and at least one combination of $Ar_{31}$ and $Ar_{33}$, $Ar_{32}$ and $Ar_{33}$, $As_1$ and $Ar_{33}$, and $As_2$ and $Ar_{33}$ is bonded with each other by a single bond or a double bond to form a substituted or unsubstituted ring;

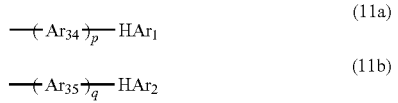

wherein Ar$_{34}$ and Ar$_{35}$ are independently a substituted or unsubstituted aromatic ring group having 6 to 30 carbon atoms: HAr$_1$ and HAr$_2$ are independently a substituted or unsubstituted aromatic heterocyclic group having 6 to 30 carbon atoms or a substituted or unsubstituted aromatic ring group having 5 to 20 ring atoms; p and q are independently an integer of 0 to 3, and when p is 2 or more, Ar$_{34}$ may he the same or different, and when q is 2 or more, Ar$_{35}$ may be the same or different;

provided that when Ar$_{31}$ and Ar$_{33}$ are bonded and r is 2 or more, Ar$_{31}$ is bonded to the nearest Ar$_{33}$ of plural Ar$_{33}$;

when Ar$_{32}$ and Ar$_{33}$ are bonded and r is 2 or more, Ar$_{32}$ is bonded to the nearest Ar$_{33}$ of plural Ar$_{33}$;

when As$_1$ and Ar$_{33}$ are bonded, p is 0 and r is 2 or more, HAr$_1$ is bonded to Ar$_{33}$ of plural Ar$_{33}$ which is the nearest to HAr$_1$, and when As$_1$ and Ar$_{33}$ are bonded, p is not 0 and r is 2 or more, Ar$_{33}$ and Ar$_{34}$ which are the nearest with each other are bonded; and when As$_2$ and Ar$_{33}$ are bonded, q is 0 and r is 2 or more, HAr$_2$ is bonded to Ar$_{33}$ of plural Ar$_{33}$ which is the nearest to HAr$_2$ and when As$_2$ and Ar$_{33}$ are bonded, q is not 0 and r is 2 or more, Ar$_{33}$ and Ar$_{35}$ which are the nearest with each other are bonded.

8. The organic electroluminescence device according to claim 7, wherein at least one of Ar$_{31}$ and Ar$_{32}$ in the formula (11) is a group represented by the following formula (12);

wherein Ar$_{41}$ is a substituted or unsubstituted aromatic ring group having 6 to 30 ring carbon atoms.

9. The organic electroluminescence device according to claim 7, wherein at least one of As$_1$ and As$_2$ in the formula (11) is a group represented by the following formula (13);

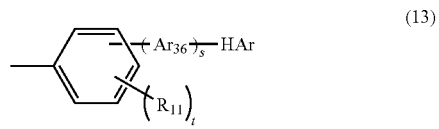

wherein Ar$_{36}$ is an aromatic ring group having 6 to 30 carbon atoms, HAr is a substituted or unsubstituted aromatic heterocyclic group having 5 to 20 ring atoms; R$_{11}$ is a substituent; t is an interger of 0 to 4, and when t is 2 or more, R$_{11}$ may be the same or different; s is an interger of 0 to 2, and when s is 2, Ar$_{36}$ may be the same or different.

10. The organic electroluminescence device according to claim 7, wherein at least one of As$_1$ and As$_2$ in the formula (11) is a group represented by the following formula (14);

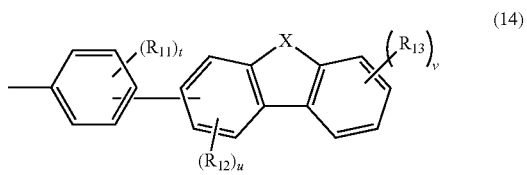

wherein X is an S atom or an O atom; R$_{11}$ to R$_{13}$ are independently a substituent; t and v are independently an integer of 0 to 4; u is an integer of 0 to 3, and when t, u or v is an integer of 2 or more, each group may be the same or different.

\* \* \* \* \*